(12) United States Patent
Biskeborn et al.

(10) Patent No.: US 10,748,560 B2
(45) Date of Patent: *Aug. 18, 2020

(54) APPARATUS HAVING LOW-CONTACT-PRESSURE HEAD-TAPE INTERFACE

(71) Applicant: International Business Machines Corporation, Armonk, NY (US)

(72) Inventors: Robert G. Biskeborn, Hollister, CA (US); Calvin S. Lo, Saratoga, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/838,229

(22) Filed: Dec. 11, 2017

(65) Prior Publication Data

US 2019/0178955 A1    Jun. 13, 2019

(51) Int. Cl.
| | | |
|---|---|---|
| *G11B 5/255* | (2006.01) |
| *G11B 5/187* | (2006.01) |
| *G11B 5/29* | (2006.01) |
| *G11B 5/265* | (2006.01) |
| *G11B 5/39* | (2006.01) |
| *G11B 5/40* | (2006.01) |
| *G11B 5/48* | (2006.01) |

(Continued)

(52) U.S. Cl.
CPC .......... *G11B 5/255* (2013.01); *G11B 5/00821* (2013.01); *G11B 5/1278* (2013.01); *G11B 5/147* (2013.01); *G11B 5/187* (2013.01); *G11B 5/265* (2013.01); *G11B 5/29* (2013.01); *G11B 5/3146* (2013.01); *G11B 5/3909* (2013.01); *G11B 5/3912* (2013.01); *G11B 5/3945* (2013.01); *G11B 5/40* (2013.01); *G11B 5/4893* (2013.01)

(58) Field of Classification Search
None
See application file for complete search history.

(56) References Cited

U.S. PATENT DOCUMENTS

| | | |
|---|---|---|
| 5,729,410 A | 3/1998 | Fontana, Jr. et al. |
| 5,898,547 A | 4/1999 | Fontana, Jr. et al. |

(Continued)

OTHER PUBLICATIONS

Biskeborn et al., U.S. Appl. No. 15/445,870, filed Feb. 28, 2017.

(Continued)

*Primary Examiner* — Craig A. Renner
(74) *Attorney, Agent, or Firm* — Zilka-Kotab, P.C.

(57) ABSTRACT

An apparatus according to one embodiment includes a module having a tape bearing surface. The tape bearing surface extends between first and second edges of the module. A first tape tenting region extends from the first edge along the tape bearing surface toward the second edge. Each tunnel valve read transducer is positioned in the first tape tenting region. A plurality of tunnel valve read transducers are arranged in an array extending along the tape bearing surface of the module in the first tape tenting region. Each of the tunnel valve read transducers includes a sensor structure having a tunnel barrier layer. At least some of the sensor structures are recessed from a plane extending along the tape bearing surface. An at least partially polycrystalline coating is located on a media facing side of the recessed sensor structures.

17 Claims, 37 Drawing Sheets

(51) Int. Cl.
*G11B 5/008* (2006.01)
*G11B 5/127* (2006.01)
*G11B 5/147* (2006.01)
*G11B 5/31* (2006.01)

(56) References Cited

U.S. PATENT DOCUMENTS

| | | | |
|---|---|---|---|
| 5,901,018 A | 5/1999 | Fontana, Jr. et al. | |
| 5,966,012 A | 10/1999 | Parkin | |
| 6,023,395 A | 2/2000 | Dill et al. | |
| 6,132,892 A * | 10/2000 | Yoshikawa et al. | G11B 5/3109 428/812 |
| 6,134,089 A | 10/2000 | Barr et al. | |
| 6,327,123 B1 | 12/2001 | Kawato et al. | |
| 6,330,137 B1 | 12/2001 | Knapp et al. | |
| 6,456,460 B1 | 9/2002 | Connolly et al. | |
| 6,577,469 B2 | 6/2003 | Kennedy et al. | |
| 6,721,138 B1 | 4/2004 | Chen et al. | |
| 6,724,572 B1 * | 4/2004 | Stoev et al. | G11B 5/3146 360/125.49 |
| 6,760,177 B2 | 7/2004 | Biskeborn | |
| 6,903,908 B2 | 6/2005 | Hayashi et al. | |
| 7,248,433 B1 | 7/2007 | Stoev et al. | |
| 7,310,204 B1 * | 12/2007 | Stoev et al. | G11B 5/3146 360/122 |
| 7,480,117 B2 | 1/2009 | Biskeborn et al. | |
| 8,373,944 B2 | 2/2013 | Biskeborn | |
| 8,687,324 B2 | 4/2014 | Biskeborn et al. | |
| 8,958,175 B1 | 2/2015 | Lakshmikumaran et al. | |
| 9,324,343 B2 | 4/2016 | Bradshaw et al. | |
| 9,336,806 B2 | 5/2016 | Dellmann et al. | |
| 9,406,319 B1 | 8/2016 | Biskeborn et al. | |
| 9,607,635 B1 | 3/2017 | Biskeborn et al. | |
| 9,837,104 B1 | 12/2017 | Biskeborn | |
| 9,928,855 B1 | 3/2018 | Biskeborn | |
| 10,650,846 B2 | 5/2020 | Biskeborn et al. | |
| 2009/0231757 A1 | 9/2009 | Biskeborn et al. | |
| 2010/0053810 A1 | 3/2010 | Biskeborn et al. | |
| 2010/0053817 A1 * | 3/2010 | Biskeborn et al. | G11B 5/3106 360/313 |
| 2012/0300338 A1 | 11/2012 | Biskeborn | |
| 2014/0063645 A1 * | 3/2014 | Biskeborn et al. | G11B 5/3106 360/231 |
| 2014/0063646 A1 * | 3/2014 | Biskeborn et al. | G11B 5/29 360/125.04 |
| 2014/0240867 A1 * | 8/2014 | Holmberg et al. | G11B 5/00826 360/90 |
| 2015/0364154 A1 | 12/2015 | Holmberg et al. | |
| 2016/0125897 A1 * | 5/2016 | Biskeborn et al. | G11B 5/3909 360/121 |
| 2016/0125900 A1 * | 5/2016 | Biskeborn et al. | G11B 5/3948 360/316 |
| 2016/0203836 A1 * | 7/2016 | Biskeborn et al. | G11B 5/3106 360/315 |
| 2016/0232936 A1 * | 8/2016 | Poornnan et al. | G11B 5/2652 |
| 2016/0372142 A1 | 12/2016 | Biskeborn et al. | |
| 2017/0330588 A1 * | 11/2017 | Biskeborn et al. | G11B 5/3106 |
| 2018/0158472 A1 * | 6/2018 | Biskeborn et al. | G11B 15/62 |
| 2018/0158478 A1 * | 6/2018 | Biskeborn et al. | G11B 15/62 |
| 2019/0180773 A1 | 6/2019 | Biskeborn et al. | |
| 2019/0180776 A1 | 6/2019 | Biskeborn et al. | |
| 2019/0180779 A1 | 6/2019 | Biskeborn et al. | |

OTHER PUBLICATIONS

Biskeborn et al., U.S. Appl. No. 15/445,877, filed Feb. 28, 2017.
Biskeborn et al., U.S. Appl. No. 15/444,160, filed Feb. 27, 2017.
Biskeborn, R. G., U.S. Appl. No. 15/339,829, filed Oct. 31, 2016.
Biskeborn et al., U.S. Appl. No. 15/444,169, filed Feb. 27, 2017.
Biskeborn et al., U.S. Appl. No. 15/369,651, filed Dec. 5, 2016.
Biskeborn et al., U.S. Appl. No. 15/371,075, filed Dec. 6, 2016.
Biskeborn et al., U.S. Appl. No. 15/466,540, filed Mar. 22, 2017.
Biskeborn et al., U.S. Appl. No. 15/838,191, filed Dec. 11, 2017.
Biskeborn et al., U.S. Appl. No. 15/839,474, filed Dec. 12, 2017.
Biskeborn et al., U.S. Appl. No. 15/839,613, filed Dec. 12, 2017.
Non-Final Office Action from U.S. Appl. No. 15/838,191, dated Jan. 7, 2019.
Non-Final Office Action from U.S. Appl. No. 15/839,474, dated Jan. 9, 2019.
Non-Final Office Action from U.S. Appl. No. 15/839,613, dated Jan. 10, 2019.
Final Office Action from U.S. Appl. No. 15/838,191, dated May 22, 2019.
Final Office Action from U.S. Appl. No. 15/839,474, dated May 23, 2019.
Final Office Action from U.S. Appl. No. 15/839,613, dated May 23, 2019.
Advisory Action from U.S. Appl. No. 15/838,191, dated Jul. 31, 2019.
Advisory Action from U.S. Appl. No. 15/839,474, dated Jul. 31, 2019.
Advisory Action from U.S. Appl. No. 15/839,613, dated Jul. 31, 2019.
Final Office Action from U.S. Appl. No. 15/838,191, dated Oct. 11, 2019.
Non-Final Office Action from U.S. Appl. No. 15/838,191, dated Sep. 5, 2019.
Non-Final Office Action from U.S. Appl. No. 15/839,613, dated Sep. 5, 2019.
Non-Final Office Action from U.S. Appl. No. 15/839,474, dated Sep. 6, 2019.
Notice of Allowance from U.S. Appl. No. 15/838,191, dated Jan. 2, 2020.
Final Office Action from U.S. Appl. No. 15/839,474, dated Feb. 5, 2020.
Final Office Action from U.S. Appl. No. 15/839,613, dated Feb. 5, 2020.
Supplemental Notice of Allowance from U.S. Appl. No. 15/838,191, dated Mar. 23, 2020.
Notice of Allowance from U.S. Appl. No. 15/839,613, dated Mar. 26, 2020.
Advisory Action from U.S. Appl. No. 15/839,474, dated Mar. 26, 2020.
Supplemental Notice of Allowance from U.S. Appl. No. 15/839,613, dated Apr. 8, 2020.
Supplemental Notice of Allowance from U.S. Appl. No. 15/838,191, dated Apr. 7, 2020.
Notice of Allowance from U.S. Appl. No. 15/839,474, dated Apr. 16, 2020.
Supplemental Notice of Allowance from U.S. Appl. No. 15/839,613, dated May 20, 2020.
Supplemental Notice of Allowance from U.S. Appl. No. 15/839,474, dated May 27, 2020.

* cited by examiner

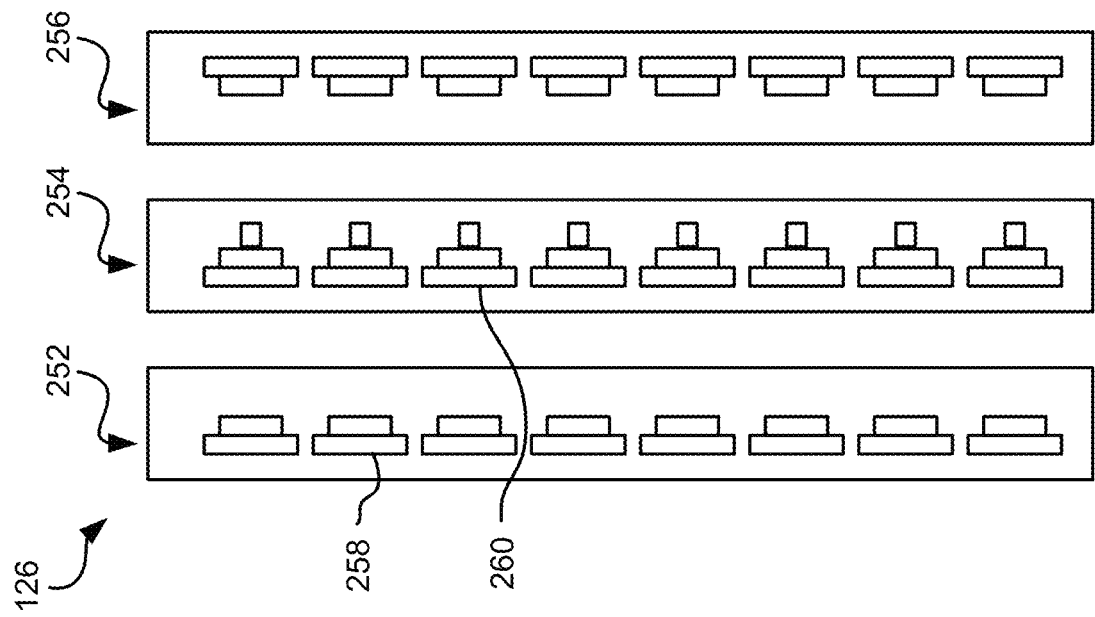
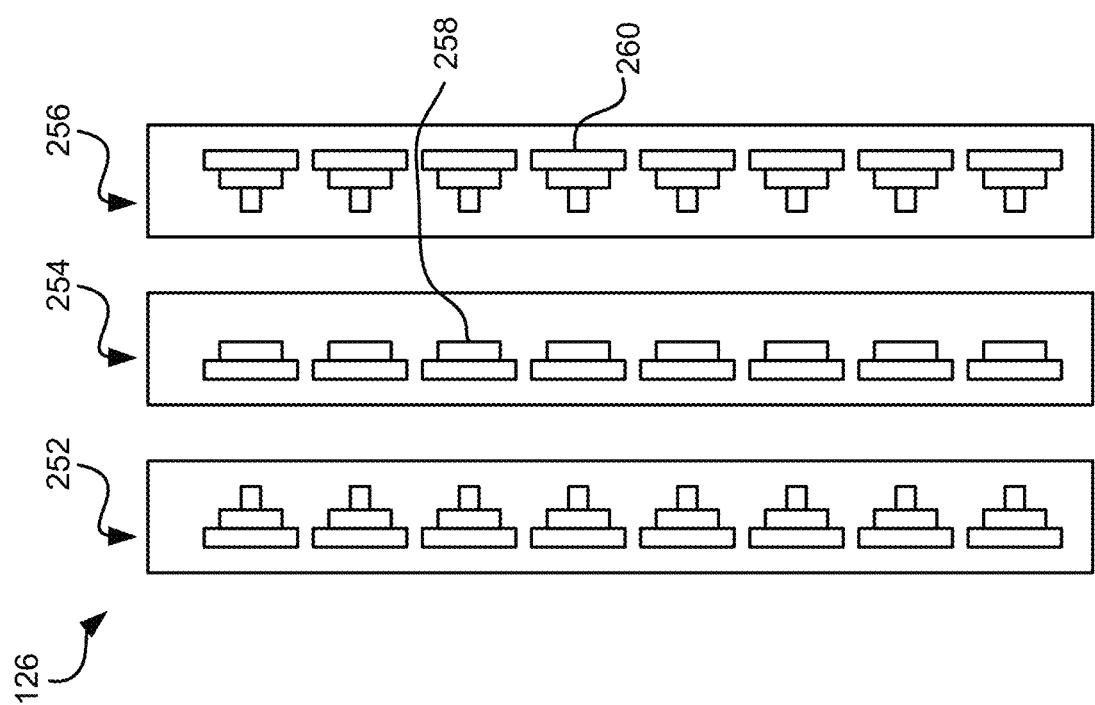

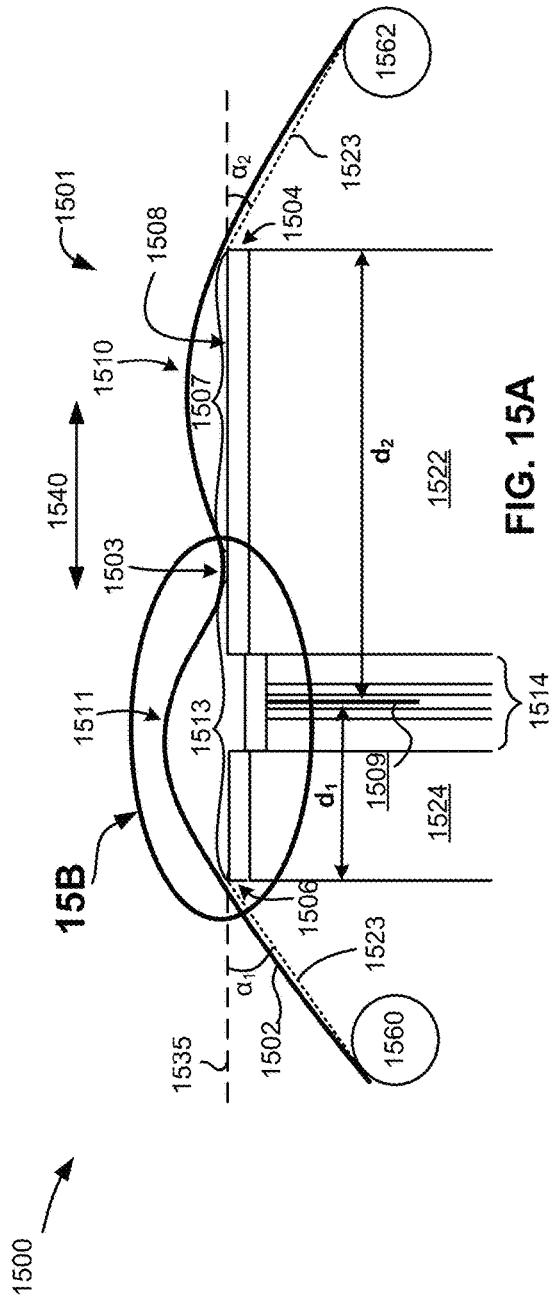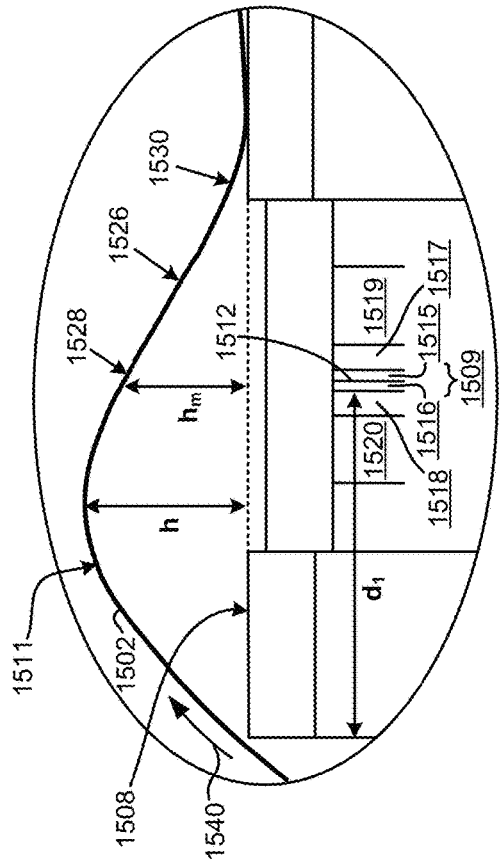
FIG. 15A
FIG. 15B

2000

Run a magnetic recording tape over an edge proximate to a sensor of a module — 2002

Detect magnetic fields from the tape — 2004

Select a wrap angle to provide about a predefined height of tenting of the tape above the sensor — 2006

FIG. 20

APPARATUS HAVING LOW-CONTACT-PRESSURE HEAD-TAPE INTERFACE

The present invention relates to data storage systems, and more particularly, this invention relates to data storage systems, and more particularly, this invention relates to magnetic tape heads having recessed tunnel magnetoresistive (TMR) sensor structures.

In magnetic storage systems, magnetic transducers read data from and write data onto magnetic recording media. Data is written on the magnetic recording media by moving a magnetic recording transducer to a position over the media where the data is to be stored. The magnetic recording transducer then generates a magnetic field, which encodes the data into the magnetic media. Data is read from the media by similarly positioning the magnetic read transducer and then sensing the magnetic field of the magnetic media. Read and write operations may be independently synchronized with the movement of the media to ensure that the data can be read from and written to the desired location on the media.

An important and continuing goal in the data storage industry is that of increasing the density of data stored on a medium. For tape storage systems, that goal has led to increasing the track and linear bit density on recording tape, and decreasing the thickness of the magnetic tape medium. However, the development of small footprint, higher performance tape drive systems has created various problems in the design of a tape head assembly for use in such systems.

In a tape drive system, the drive moves the magnetic tape over the surface of the tape head at high speed. Usually the tape head is designed to minimize the spacing between the head and the tape. The spacing between the magnetic head and the magnetic tape is crucial and so goals in these systems are to have the recording gaps of the transducers, which are the source of the magnetic recording flux in near contact with the tape to effect writing sharp transitions, and to have the read elements in near contact with the tape to provide effective coupling of the magnetic field from the tape to the read elements.

Minimization of the spacing between the head and the tape, however, induces frequent contact between the tape and the media facing side of the head, causing tape operations to be deemed a type of contact recording. This contact, in view of the high tape speeds and tape abrasivity, quickly affects the integrity of the materials used to form the media facing surface of the head, e.g., causing wear thereto, smearing which is known to cause shorts, bending ductility, etc. Furthermore, shorting may occur when an asperity of the tape media drags any of the conductive metallic films near the sensor across the tunnel junction.

Implementing TMR sensor configurations to read from and/or write to magnetic tape has also reduced the shield-to-shield spacing which allows for more detailed reading and/or writing to magnetic tape by allowing the linear density of transitions on tape to increase. However, this increase has not come without drawbacks. For instance, at smaller dimensions, conventional free layers have proven to be magnetically unstable, thereby introducing magnetic switching noise.

SUMMARY

An apparatus according to one embodiment includes a module having a tape bearing surface. The tape bearing surface extends between first and second edges of the module. A first tape tenting region extends from the first edge along the tape bearing surface toward the second edge. Each tunnel valve read transducer is positioned in the first tape tenting region. A plurality of tunnel valve read transducers are arranged in an array extending along the tape bearing surface of the module in the first tape tenting region. Each of the tunnel valve read transducers includes a sensor structure having a tunnel barrier layer. At least some of the sensor structures are recessed from a plane extending along the tape bearing surface. An at least partially polycrystalline coating is located on a media facing side of the recessed sensor structures.

Any of these embodiments may be implemented in a magnetic data storage system such as a tape drive system, which may include a magnetic head, a drive mechanism for passing a magnetic medium (e.g., magnetic recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 3 is a partial tape bearing surface view of a magnetic head having a write-read-write configuration.

FIG. 4 is a partial tape bearing surface view of a magnetic head having a read-write-read configuration.

FIG. 15A is a side view of a magnetic tape head according to one embodiment.

FIG. 15B is a detailed view of circle 15B of FIG. 15A according to one embodiment.

FIG. 20 is a flow chart of a method according to one embodiment.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of magnetic storage systems, as well as operation and/or component parts thereof.

In one general embodiment, an apparatus includes a module having a tape bearing surface. The tape bearing surface extends between first and second edges of the module. A first tape tenting region extends from the first edge along the tape bearing surface toward the second edge. Each tunnel valve read transducer is positioned in the first tape tenting region. A plurality of tunnel valve read transducers are arranged in an array extending along the tape bearing surface of the module in the first tape tenting region. Each of the tunnel valve read transducers includes a sensor structure having a tunnel barrier layer. At least some of the sensor structures are recessed from a plane extending along the tape bearing surface. An at least partially polycrystalline coating is located on a media facing side of the recessed sensor structures.

Figure 1A:
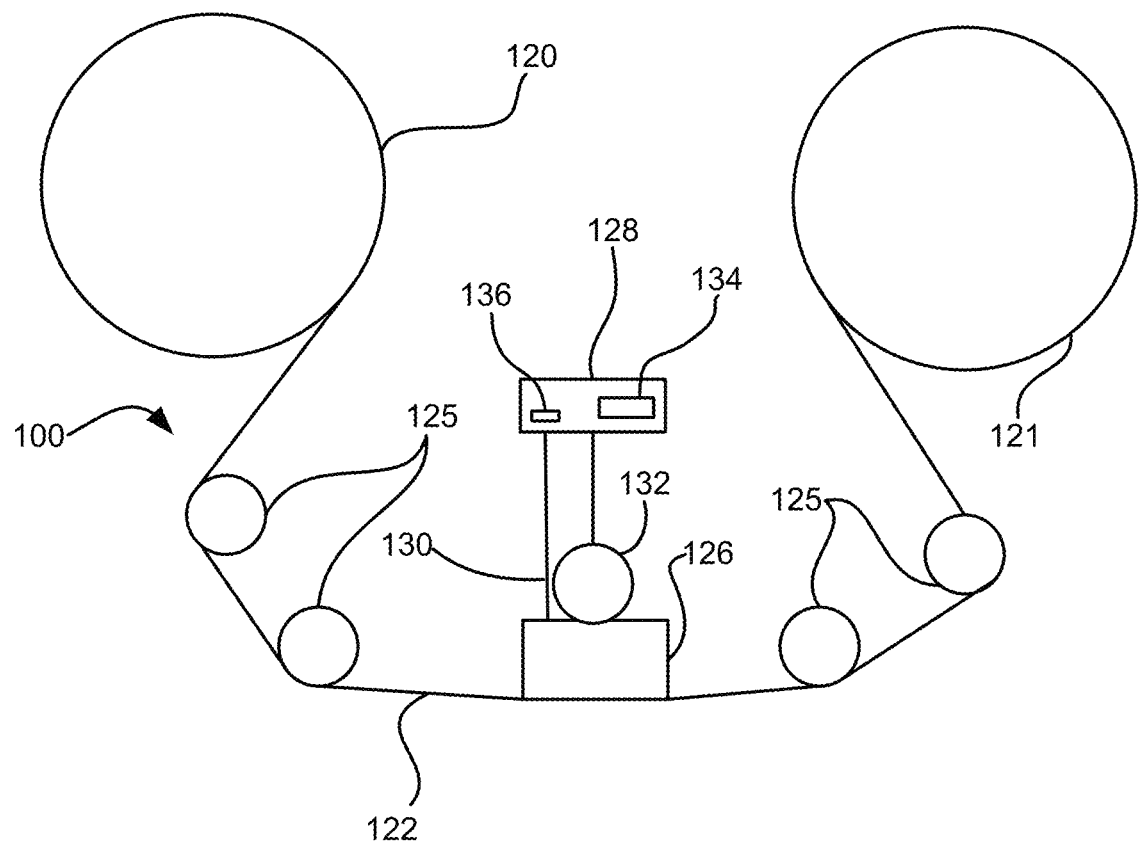
FIG. 1A is a schematic diagram of a simplified tape drive system according to one embodiment.

FIG. 1A illustrates a simplified tape drive 100 of a tape-based data storage system, which may be employed in the context of the present invention. While one specific implementation of a tape drive is shown in FIG. 1A, it should be noted that the embodiments described herein may be implemented in the context of any type of tape drive system.

As shown, a tape supply cartridge 120 and a take-up reel 121 are provided to support a tape 122. One or more of the reels may form part of a removable cartridge and are not necessarily part of the system 100. The tape drive, such as that illustrated in FIG. 1A, may further include drive motor(s) to drive the tape supply cartridge 120 and the take-up reel 121 to move the tape 122 over a tape head 126 of any type. Such head may include an array of readers (read transducers), writers (write transducers), or both.

Guides 125 guide the tape 122 across the tape head 126. Such tape head 126 is in turn coupled to a controller 128 via a cable 130. The controller 128, may be or include a processor and/or any logic for controlling any subsystem of the drive 100. For example, the controller 128 typically controls head functions such as servo following, data writing, data reading, etc. The controller 128 may include at least one servo channel and at least one data channel, each of which include data flow processing logic configured to process and/or store information to be written to and/or read from the tape 122. The controller 128 may operate under logic known in the art, as well as any logic disclosed herein, and thus may be considered as a processor for any of the descriptions of tape drives included herein, in various embodiments. The controller 128 may be coupled to a memory 136 of any known type, which may store instructions executable by the controller 128. Moreover, the controller 128 may be configured and/or programmable to perform or control some or all of the methodology presented herein. Thus, the controller 128 may be considered to be configured to perform various operations by way of logic programmed into one or more chips, modules, and/or blocks; software, firmware, and/or other instructions being available to one or more processors; etc., and combinations thereof.

The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive 100 and a host (internal or external) to send and receive the data and for controlling the operation of the tape drive 100 and communicating the status of the tape drive 100 to the host, all as will be understood by those of skill in the art.

Figure 1B:
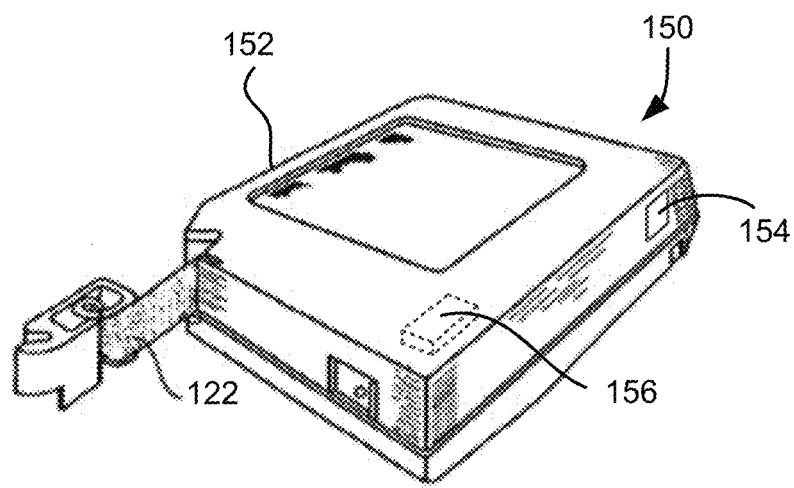
FIG. 1B is a schematic diagram of a tape cartridge according to one embodiment.

FIG. 1B illustrates an exemplary tape cartridge 150 according to one embodiment. Such tape cartridge 150 may be used with a system such as that shown in FIG. 1A. As shown, the tape cartridge 150 includes a housing 152, a tape 122 in the housing 152, and a nonvolatile memory 156 coupled to the housing 152. In some approaches, the nonvolatile memory 156 may be embedded inside the housing 152, as shown in FIG. 1B. In more approaches, the nonvolatile memory 156 may be attached to the inside or outside of the housing 152 without modification of the housing 152. For example, the nonvolatile memory may be embedded in a self-adhesive label 154. In one preferred embodiment, the nonvolatile memory 156 may be a Flash memory device, read-only memory (ROM) device, etc., embedded into or coupled to the inside or outside of the tape cartridge 150. The nonvolatile memory is accessible by the tape drive and the tape operating software (the driver software), and/or another device.

Figure 2A:
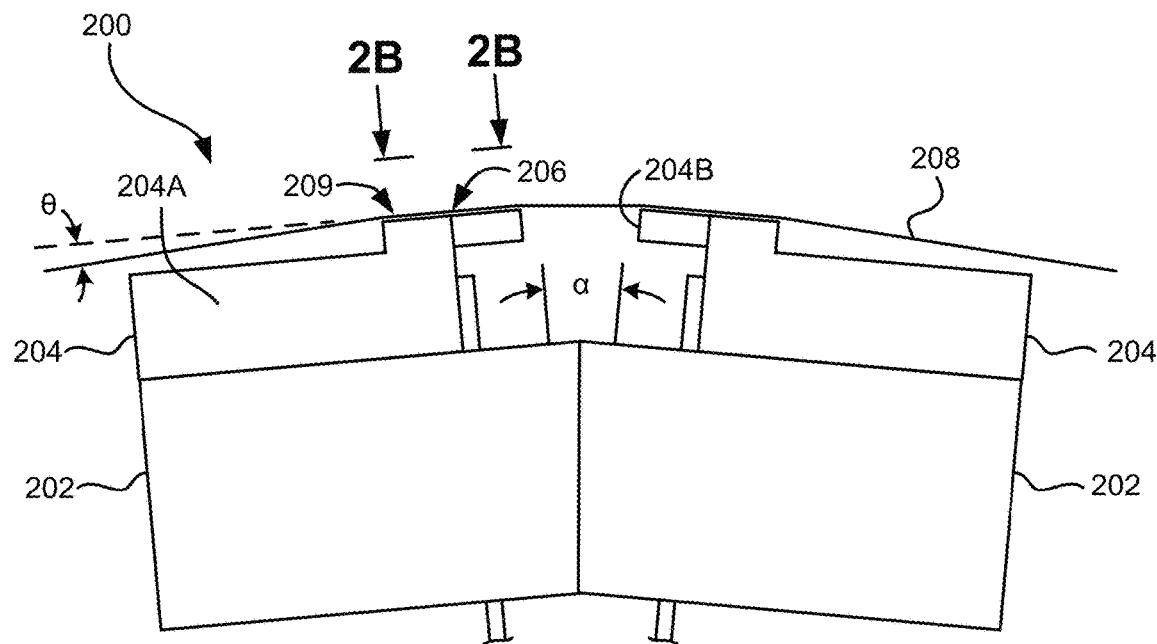
FIG. 2A illustrates a side view of a flat-lapped, bi-directional, two-module magnetic tape head according to one embodiment.

By way of example, FIG. 2A illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between about 0.1 degree and about 3 degrees.

The substrates 204A are typically constructed of a wear resistant material, such as a ceramic. The closures 204B may be made of the same or similar ceramic as the substrates 204A.

The readers and writers may be arranged in a piggyback or merged configuration. An illustrative piggybacked configuration comprises a (magnetically inductive) writer transducer on top of (or below) a (magnetically shielded) reader transducer (e.g., a magnetoresistive reader, etc.), wherein the poles of the writer and the shields of the reader are generally separated. An illustrative merged configuration comprises one reader shield in the same physical layer as one writer pole (hence, "merged"). The readers and writers may also be arranged in an interleaved configuration. Alternatively, each array of channels may be readers or writers only. Any of these arrays may contain one or more servo track readers for reading servo data on the medium.

Figure 2B:
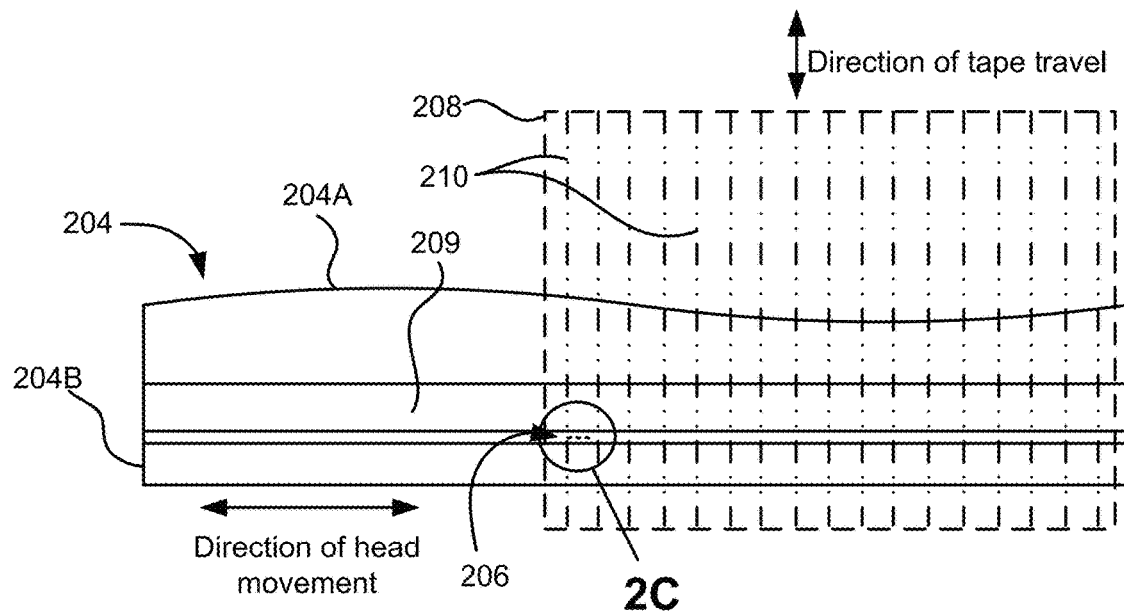
FIG. 2B is a tape bearing surface view taken from Line 2B of FIG. 2A.

FIG. 2B illustrates the tape bearing surface 209 of one of the modules 204 taken from Line 2B of FIG. 2A. A representative tape 208 is shown in dashed lines. The module 204 is preferably long enough to be able to support the tape as the head steps between data bands.

In this example, the tape 208 includes 4 to 32 data bands, e.g., with 16 data bands and 17 servo tracks 210, as shown in FIG. 2B on a one-half inch wide tape 208. The data bands are defined between servo tracks 210. Each data band may include a number of data tracks, for example 1024 data tracks (not shown). During read/write operations, the readers and/or writers 206 are positioned to specific track positions within one of the data bands. Outer readers, sometimes called servo readers, read the servo tracks 210. The servo signals are in turn used to keep the readers and/or writers 206 aligned with a particular set of tracks during the read/write operations.

Figure 2C:
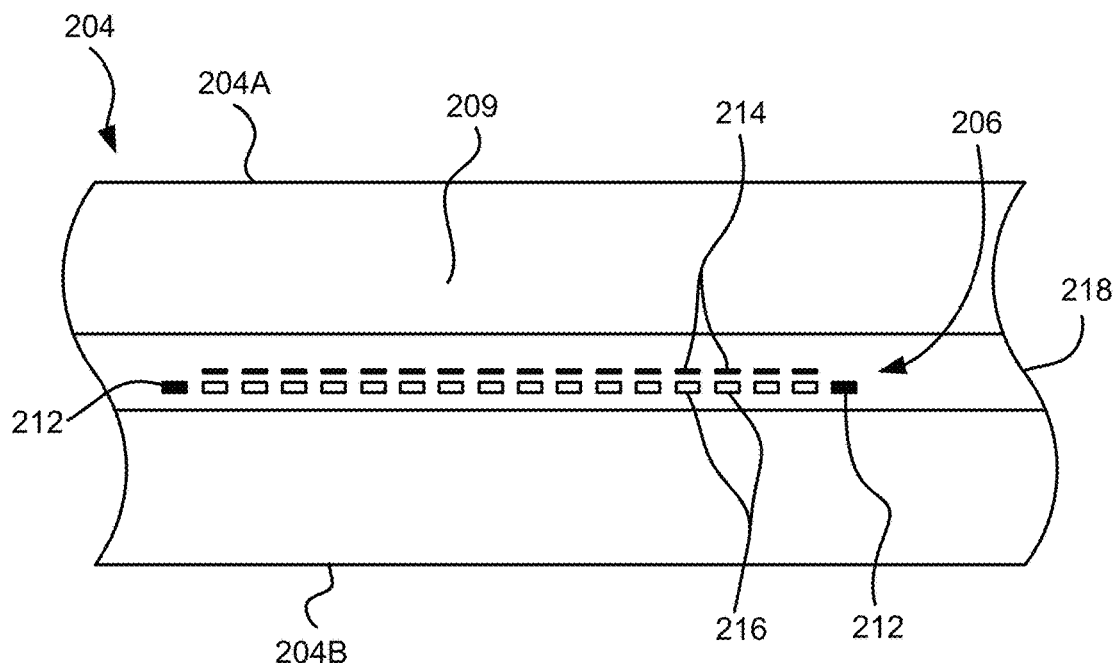
FIG. 2C is a detailed view taken from Circle 2C of FIG. 2B.

FIG. 2C depicts a plurality of readers and/or writers 206 formed in a gap 218 on the module 204 in Circle 2C of FIG. 2B. As shown, the array of readers and writers 206 includes, for example, 16 writers 214, 16 readers 216 and two servo readers 212, though the number of elements may vary. Illustrative embodiments include 8, 16, 32, 40, and 64 active readers and/or writers 206 per array, and alternatively interleaved designs having odd numbers of reader or writers such as 17, 25, 33, etc. An illustrative embodiment includes 32 readers per array and/or 32 writers per array, where the actual number of transducer elements could be greater, e.g., 33, 34, etc. This allows the tape to travel more slowly, thereby reducing speed-induced tracking and mechanical difficulties and/or execute fewer "wraps" to fill or read the tape. While the readers and writers may be arranged in a piggyback configuration as shown in FIG. 2C, the readers 216 and writers 214 may also be arranged in an interleaved configuration. Alternatively, each array of readers and/or writers 206 may be readers or writers only, and the arrays may contain one or more servo readers 212. As noted by considering FIGS. 2A and 2B-2C together, each module 204 may include a complementary set of readers and/or writers 206 for such things as bi-directional reading and writing, read-while-write capability, backward compatibility, etc.

Figure 2D:
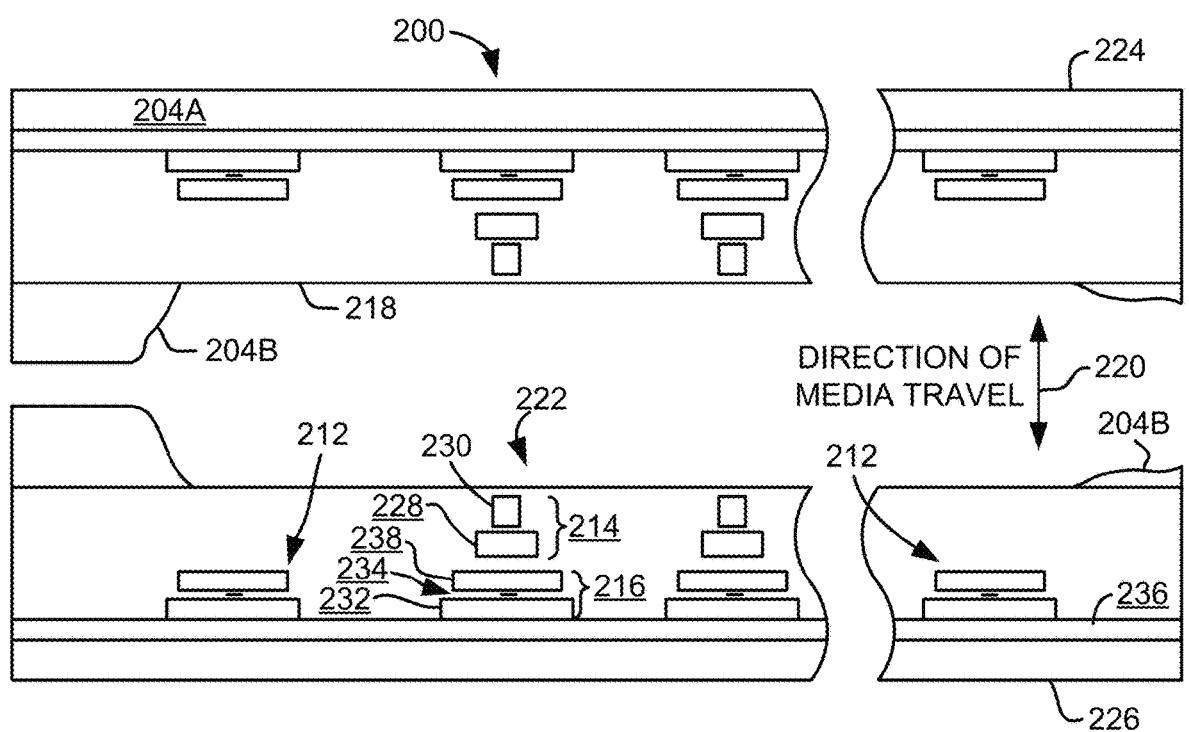
FIG. 2D is a detailed view of a partial tape bearing surface of a pair of modules.

FIG. 2D shows a partial tape bearing surface view of complementary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write transducer 214 and the readers, exemplified by the read transducer 216, are aligned parallel to an intended direction of travel of a tape medium thereacross to form an R/W pair, exemplified by the R/W pair 222. Note that the intended direction of tape travel is sometimes referred to herein as the direction of tape travel, and such terms may be used interchangeably. Such direction of tape travel may be inferred from the design of the system, e.g., by examining the guides; observing the actual direction of tape travel relative to the reference point; etc. Moreover, in a system operable for bi-direction reading and/or writing, the direction of tape travel in both directions is typically parallel and thus both directions may be considered equivalent to each other.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked magnetoresistive (MR) head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (—), cobalt zirconium tantalum (CZT) or Al—Fe—Si (Sendust), a sensor 234 for sensing a data track on a magnetic medium, a second shield 238 typically of a nickel-iron alloy (e.g., ~80/20 at % NiFe, also known as permalloy), first and second writer pole tips 228, 230, and a coil (not shown). The sensor may be of any known type, including those based on MR, GMR, AMR, tunneling magnetoresistance (TMR), etc.

The first and second writer poles 228, 230 may be fabricated from high magnetic moment materials such as ~45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

The configuration of the tape head 126 according to one embodiment includes multiple modules, preferably three or more. In a write-read-write (W-R-W) head, outer modules for writing flank one or more inner modules for reading. Referring to FIG. 3, depicting a W-R-W configuration, the outer modules 252, 256 each include one or more arrays of writers 260. The inner module 254 of FIG. 3 includes one or more arrays of readers 258 in a similar configuration. Variations of a multi-module head include a R-W-R head (FIG. 4), a R-R-W head, a W-W-R head, etc. In yet other variations, one or more of the modules may have read/write pairs of transducers. Moreover, more than three modules may be present. In further approaches, two outer modules may flank two or more inner modules, e.g., in a W-R-R-W, a R-W-W-R arrangement, etc. For simplicity, a W-R-W head is used primarily herein to exemplify embodiments of the present invention. One skilled in the art apprised with the teachings herein will appreciate how permutations of the present invention would apply to configurations other than a W-R-W configuration.

Figure 5:
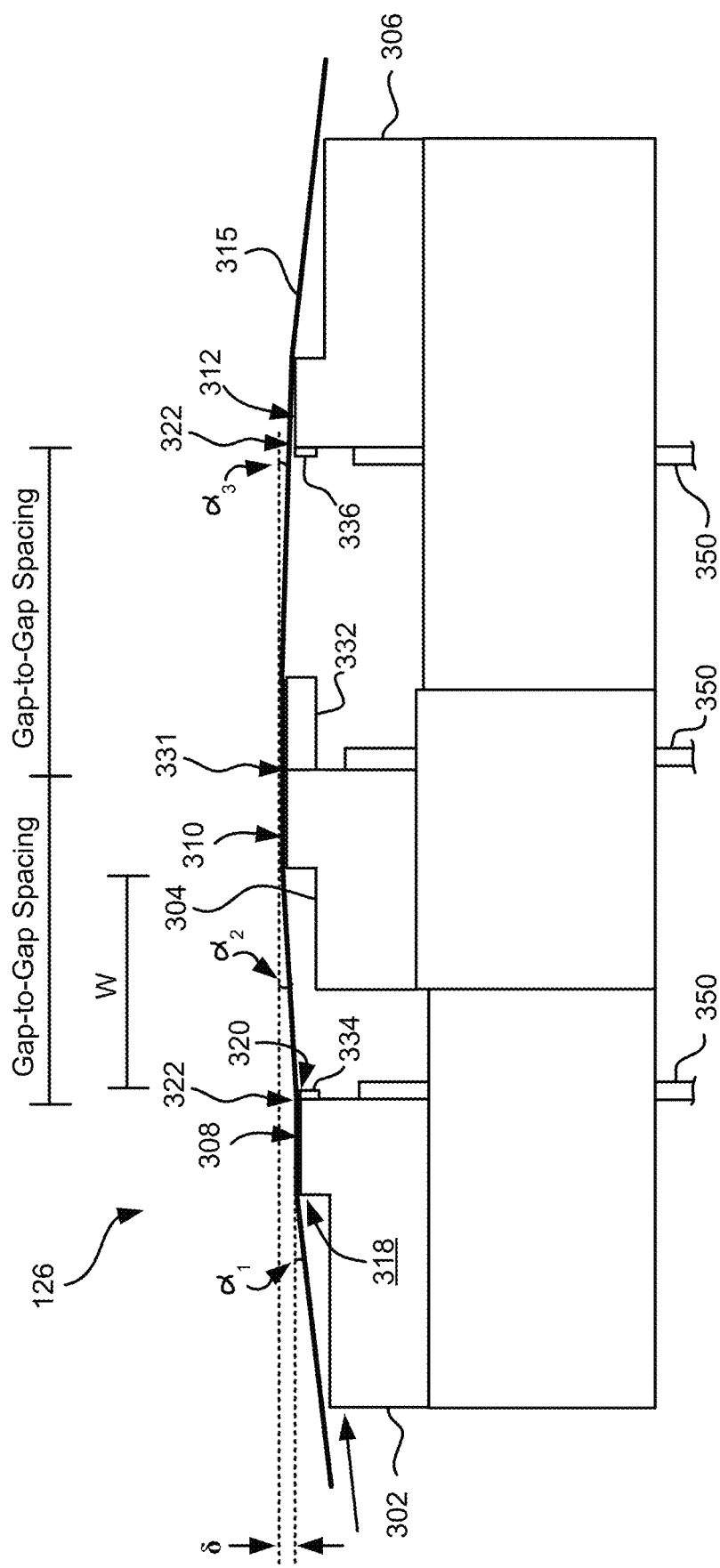
FIG. 5 is a side view of a magnetic tape head with three modules according to one embodiment where the modules all generally lie along about parallel planes.

FIG. 5 illustrates a magnetic head 126 according to one embodiment of the present invention that includes first, second and third modules 302, 304, 306 each having a tape bearing surface 308, 310, 312 respectively, which may be flat, contoured, etc. Note that while the term "tape bearing surface" appears to imply that the surface facing the tape 315 is in physical contact with the tape bearing surface, this is not necessarily the case. Rather, only a portion of the tape may be in contact with the tape bearing surface, constantly or intermittently, with other portions of the tape riding (or "flying") above the tape bearing surface on a layer of air, sometimes referred to as an "air bearing". The first module 302 will be referred to as the "leading" module as it is the first module encountered by the tape in a three-module design for tape moving in the indicated direction. The third module 306 will be referred to as the "trailing" module. The trailing module follows the middle module and is the last module seen by the tape in a three-module design. The leading and trailing modules 302, 306 are referred to collectively as outer modules. Also note that the outer modules 302, 306 will alternate as leading modules, depending on the direction of travel of the tape 315.

Figure 6:
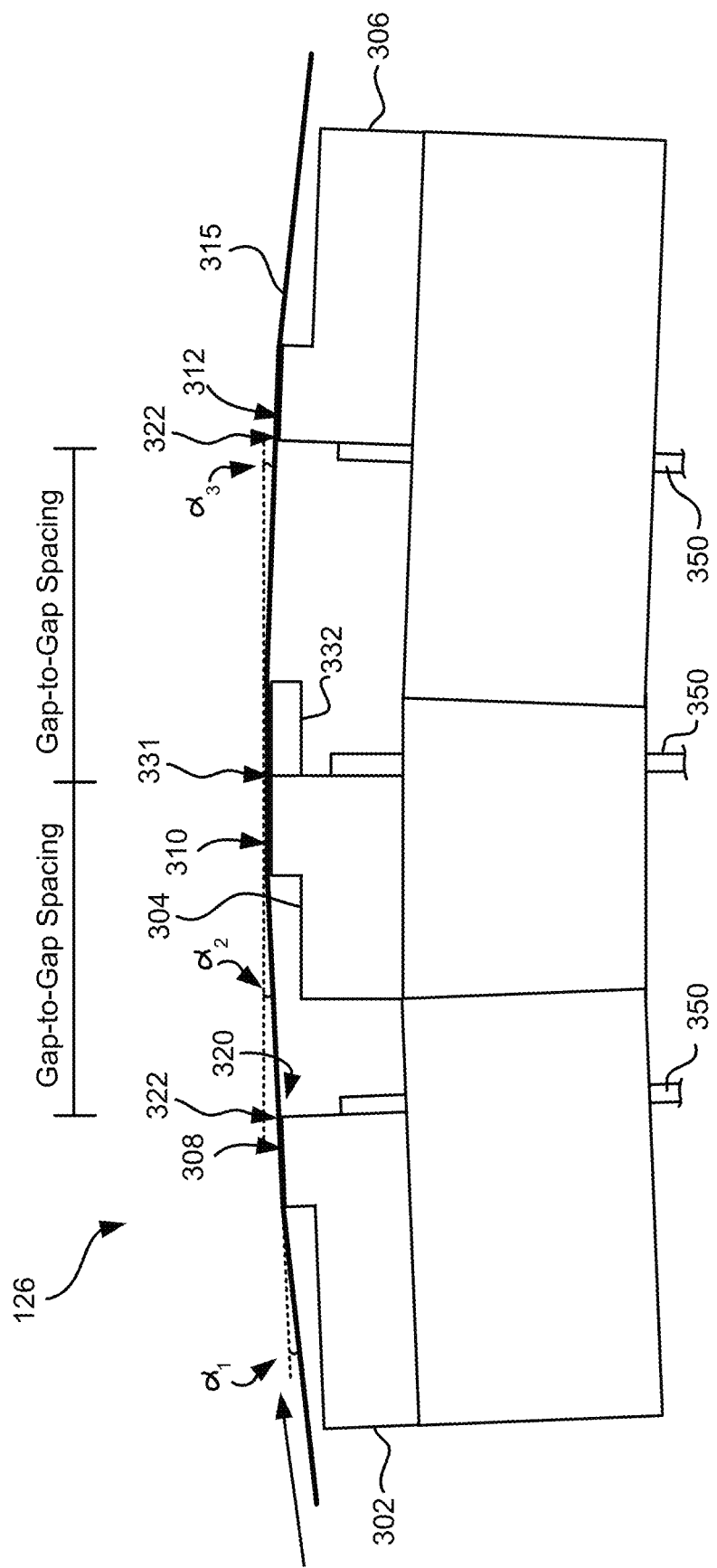
FIG. 6 is a side view of a magnetic tape head with three modules in a tangent (angled) configuration.

In one embodiment, the tape bearing surfaces 308, 310, 312 of the first, second and third modules 302, 304, 306 lie on about parallel planes (which is meant to include parallel and nearly parallel planes, e.g., between parallel and tangential as in FIG. 6), and the tape bearing surface 310 of the second module 304 is above the tape bearing surfaces 308, 312 of the first and third modules 302, 306. As described below, this has the effect of creating the desired wrap angle $\alpha_2$ of the tape relative to the tape bearing surface 310 of the second module 304.

Where the tape bearing surfaces 308, 310, 312 lie along parallel or nearly parallel yet offset planes, intuitively, the tape should peel off of the tape bearing surface 308 of the leading module 302. However, the vacuum created by the skiving edge 318 of the leading module 302 has been found by experimentation to be sufficient to keep the tape adhered to the tape bearing surface 308 of the leading module 302. The trailing edge 320 of the leading module 302 (the end from which the tape leaves the leading module 302) is the approximate reference point which defines the wrap angle $\alpha_2$ over the tape bearing surface 310 of the second module 304. The tape stays in close proximity to the tape bearing surface until close to the trailing edge 320 of the leading module 302. Accordingly, read and/or write elements 322 may be located near the trailing edges of the outer modules 302, 306. These embodiments are particularly adapted for write-read-write applications.

A benefit of this and other embodiments described herein is that, because the outer modules 302, 306 are fixed at a determined offset from the second module 304, the inner wrap angle $\alpha_2$ is fixed when the modules 302, 304, 306 are coupled together or are otherwise fixed into a head. The inner wrap angle $\alpha_2$ is approximately $\tan^{-1}(\delta/W)$ where $\delta$ is the height difference between the planes of the tape bearing surfaces 308, 310 and W is the width between the opposing ends of the tape bearing surfaces 308, 310. An illustrative inner wrap angle $\alpha_2$ is in a range of about 0.3° to about 1.1°, though can be any angle required by the design.

Beneficially, the inner wrap angle $\alpha_2$ on the side of the module 304 receiving the tape (leading edge) will be larger than the inner wrap angle $\alpha_3$ on the trailing edge, as the tape 315 rides above the trailing module 306. This difference is generally beneficial as a smaller $\alpha_3$ tends to oppose what has heretofore been a steeper exiting effective wrap angle.

Note that the tape bearing surfaces 308, 312 of the outer modules 302, 306 are positioned to achieve a negative wrap angle at the trailing edge 320 of the leading module 302. This is generally beneficial in helping to reduce friction due to contact with the trailing edge 320, provided that proper consideration is given to the location of the crowbar region that forms in the tape where it peels off the head. This negative wrap angle also reduces flutter and scrubbing damage to the elements on the leading module 302. Further, at the trailing module 306, the tape 315 flies over the tape bearing surface 312 so there is virtually no wear on the elements when tape is moving in this direction. Particularly, the tape 315 entrains air and so will not significantly ride on the tape bearing surface 312 of the third module 306 (some contact may occur). This is permissible, because the leading module 302 is writing while the trailing module 306 is idle.

Writing and reading functions are performed by different modules at any given time. In one embodiment, the second module 304 includes a plurality of data and optional servo readers 331 and no writers. The first and third modules 302, 306 include a plurality of writers 322 and no data readers, with the exception that the outer modules 302, 306 may include optional servo readers. The servo readers may be used to position the head during reading and/or writing operations. The servo reader(s) on each module are typically located toward the end of the array of readers or writers.

By having only readers or side by side writers and servo readers in the gap between the substrate and closure, the gap length can be substantially reduced. Typical heads have piggybacked readers and writers, where the writer is formed above each reader. A typical gap is 20-35 microns. However, irregularities on the tape may tend to droop into the gap and create gap erosion. Thus, the smaller the gap is the better. The smaller gap enabled herein exhibits fewer wear related problems.

In some embodiments, the second module 304 has a closure, while the first and third modules 302, 306 do not have a closure. Where there is no closure, preferably a hard coating is added to the module. One preferred coating is diamond-like carbon (DLC).

In the embodiment shown in FIG. 5, the first, second, and third modules 302, 304, 306 each have a closure 332, 334, 336, which extends the tape bearing surface of the associated module, thereby effectively positioning the read/write elements away from the edge of the tape bearing surface. The closure 332 on the second module 304 can be a ceramic closure of a type typically found on tape heads. The closures 334, 336 of the first and third modules 302, 306, however, may be shorter than the closure 332 of the second module 304 as measured parallel to a direction of tape travel over the respective module. This enables positioning the modules closer together. One way to produce shorter closures 334, 336 is to lap the standard ceramic closures of the second module 304 an additional amount. Another way is to plate or deposit thin film closures above the elements during thin film processing. For example, a thin film closure of a hard material such as Sendust or nickel-iron alloy (e.g., 45/55) can be formed on the module.

With reduced-thickness ceramic or thin film closures 334, 336 or no closures on the outer modules 302, 306, the write-to-read gap spacing can be reduced to less than about 1 mm, e.g., about 0.75 mm, or 50% less than commonly-used linear tape open (LTO) tape head spacing. The open space between the modules 302, 304, 306 can still be set to approximately 0.5 to 0.6 mm, which in some embodiments is ideal for stabilizing tape motion over the second module 304.

Depending on tape tension and stiffness, it may be desirable to angle the tape bearing surfaces of the outer modules relative to the tape bearing surface of the second module. FIG. 6 illustrates an embodiment where the modules 302, 304, 306 are in a tangent or nearly tangent (angled) configuration. Particularly, the tape bearing surfaces of the outer modules 302, 306 are about parallel to the tape at the desired wrap angle $\alpha_2$ of the second module 304. In other words, the planes of the tape bearing surfaces 308, 312 of the outer modules 302, 306 are oriented at about the desired wrap angle $\alpha_2$ of the tape 315 relative to the second module 304. The tape will also pop off of the trailing module 306 in this embodiment, thereby reducing wear on the elements in the trailing module 306. These embodiments are particularly useful for write-read-write applications. Additional aspects of these embodiments are similar to those given above.

Typically, the tape wrap angles may be set about midway between the embodiments shown in FIGS. 5 and 6.

Figure 7:
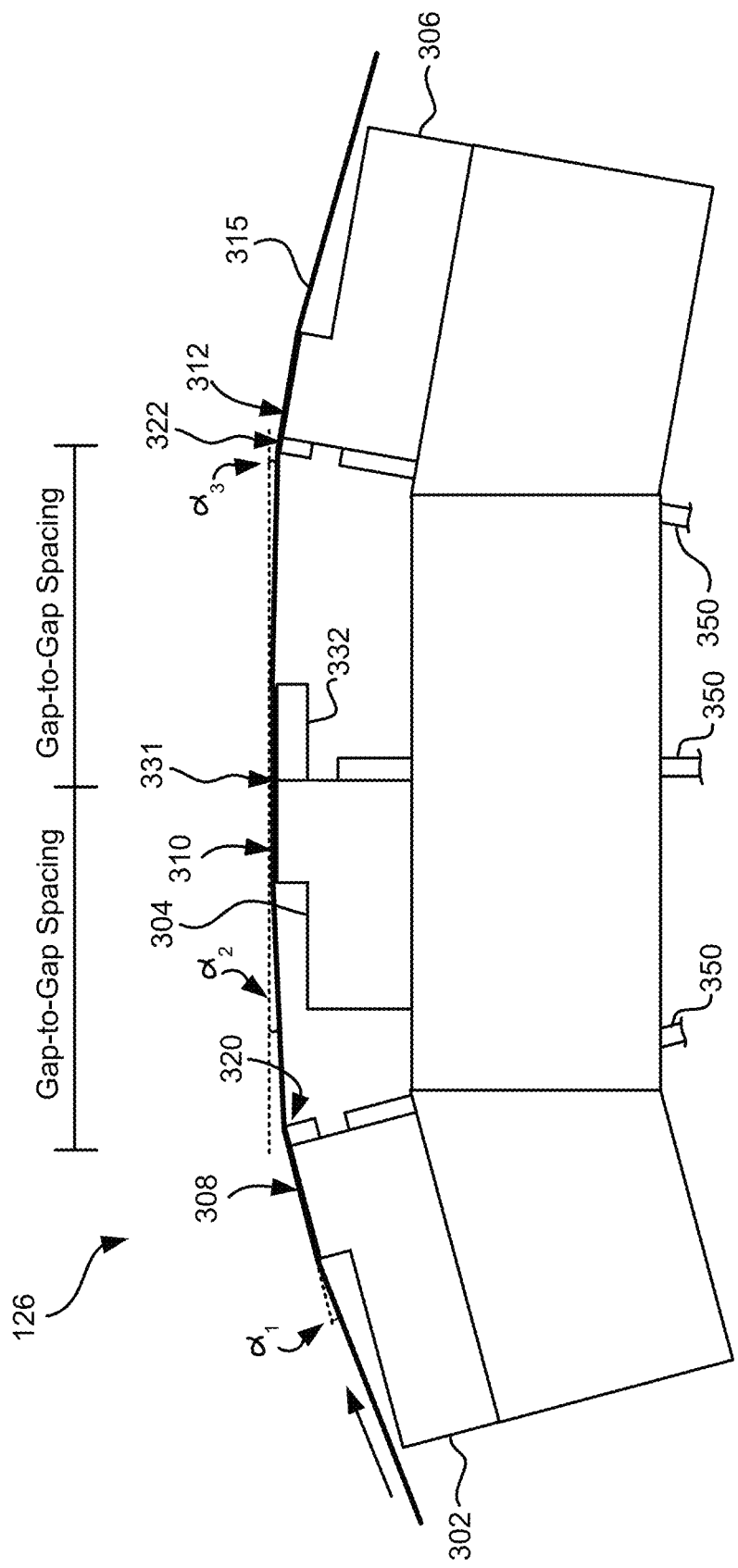
FIG. 7 is a side view of a magnetic tape head with three modules in an overwrap configuration.

FIG. 7 illustrates an embodiment where the modules 302, 304, 306 are in an overwrap configuration. Particularly, the tape bearing surfaces 308, 312 of the outer modules 302, 306 are angled slightly more than the tape 315 when set at the desired wrap angle $\alpha_2$ relative to the second module 304. In this embodiment, the tape does not pop off of the trailing module, allowing it to be used for writing or reading. Accordingly, the leading and middle modules can both perform reading and/or writing functions while the trailing module can read any just-written data. Thus, these embodiments are preferred for write-read-write, read-write-read, and write-write-read applications. In the latter embodiments, closures should be wider than the tape canopies for ensuring read capability. The wider closures may require a wider gap-to-gap separation. Therefore, a preferred embodiment has a write-read-write configuration, which may use shortened closures that thus allow closer gap-to-gap separation.

Additional aspects of the embodiments shown in FIGS. 6 and 7 are similar to those given above.

A 32-channel version of a multi-module head 126 may use cables 350 having leads on the same or smaller pitch as current 16 channel piggyback LTO modules, or alternatively the connections on the module may be organ-keyboarded for a 50% reduction in cable span. Over-under, writing pair unshielded cables may be used for the writers, which may have integrated servo readers.

The outer wrap angles $\alpha_1$ may be set in the drive, such as by guides of any type known in the art, such as adjustable rollers, slides, etc. or alternatively by outriggers, which are integral to the head. For example, rollers having an offset axis may be used to set the wrap angles. The offset axis creates an orbital arc of rotation, allowing precise alignment of the wrap angle $\alpha_1$.

To assemble any of the embodiments described above, conventional u-beam assembly can be used. Accordingly, the mass of the resultant head may be maintained or even reduced relative to heads of previous generations. In other approaches, the modules may be constructed as a unitary body. Those skilled in the art, armed with the present teachings, will appreciate that other known methods of manufacturing such heads may be adapted for use in constructing such heads. Moreover, unless otherwise specified, processes and materials of types known in the art may be adapted for use in various embodiments in conformance with the teachings herein, as would become apparent to one skilled in the art upon reading the present disclosure.

Figure 8A:
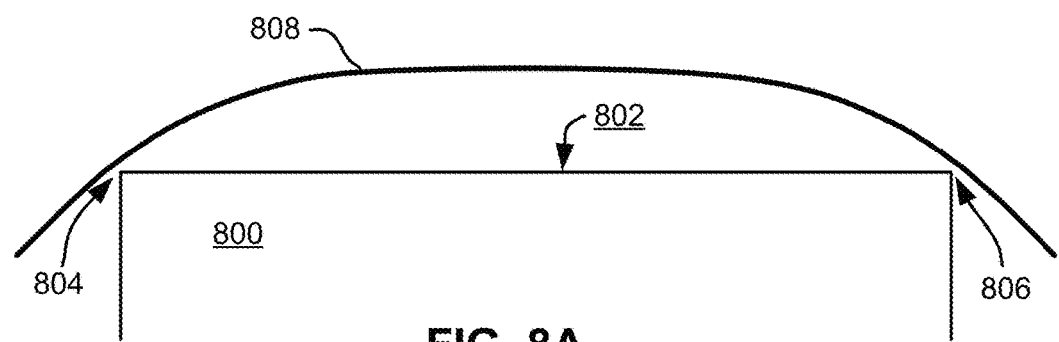
FIGS. 8A-8C are schematics depicting the principles of tape tenting.
Figure 8B:
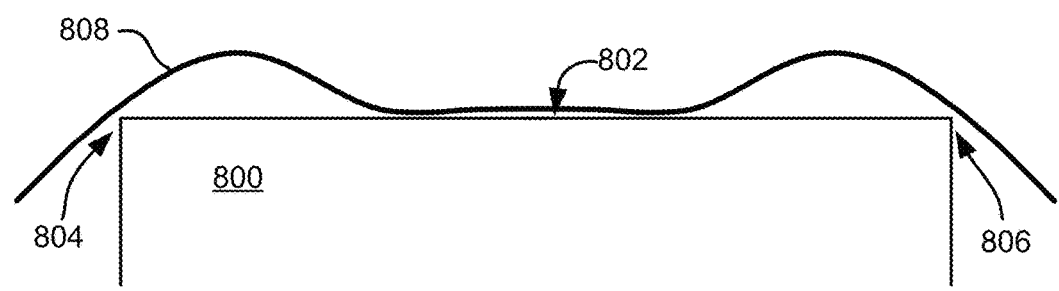
Figure 8C:
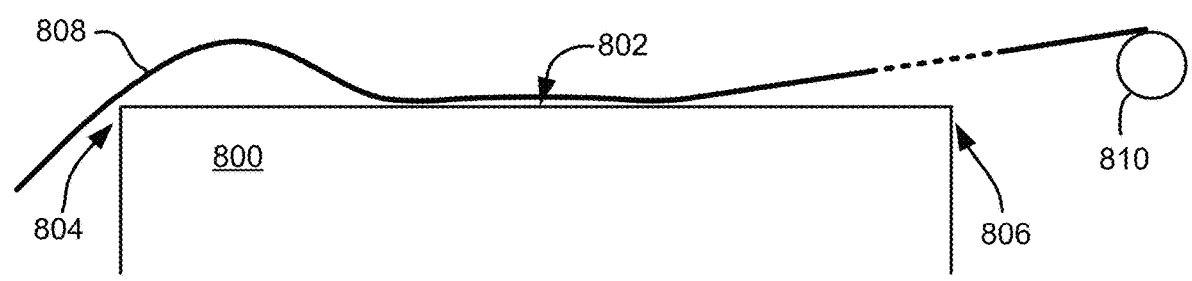

As a tape is run over a module, it is preferred that the tape passes sufficiently close to magnetic transducers on the module such that reading and/or writing is efficiently performed, e.g., with a low error rate. According to some approaches, tape tenting may be used to ensure the tape passes sufficiently close to the portion of the module having the magnetic transducers. To better understand this process, FIGS. 8A-8C illustrate the principles of tape tenting. FIG. 8A shows a module 800 having an upper tape bearing surface 802 extending between opposite edges 804, 806. A stationary tape 808 is shown wrapping around the edges 804, 806. As shown, the bending stiffness of the tape 808 lifts the tape off of the tape bearing surface 802. Tape tension tends to flatten the tape profile, as shown in FIG. 8A. Where tape tension is minimal, the curvature of the tape is more parabolic than shown.

FIG. 8B depicts the tape 808 in motion. The leading edge, i.e., the first edge the tape encounters when moving, may serve to skive air from the tape, thereby creating a subambient air pressure between the tape 808 and the tape bearing surface 802. In FIG. 8B, the leading edge is the left edge and the right edge is the trailing edge when the tape is moving left to right. As a result, atmospheric pressure above the tape urges the tape toward the tape bearing surface 802, thereby creating tape tenting proximate each of the edges. The tape bending stiffness resists the effect of the atmospheric pressure, thereby causing the tape tenting proximate both the leading and trailing edges. Modeling predicts that the two tents are very similar in shape.

FIG. 8C depicts how the subambient pressure urges the tape 808 toward the tape bearing surface 802 even when a trailing guide 810 is positioned above the plane of the tape bearing surface.

It follows that tape tenting may be used to direct the path of a tape as it passes over a module. As previously mentioned, tape tenting may be used to ensure the tape passes sufficiently close to the portion of the module having the magnetic transducers, preferably such that reading and/or writing is efficiently performed, e.g., with a low error rate.

Magnetic tapes may be stored in tape cartridges that are, in turn, stored at storage slots or the like inside a data storage library. The tape cartridges may be stored in the library such that they are accessible for physical retrieval. In addition to magnetic tapes and tape cartridges, data storage libraries may include data storage drives that store data to, and/or retrieve data from, the magnetic tapes. Moreover, tape libraries and the components included therein may implement a file system which enables access to tape and data stored on the tape.

File systems may be used to control how data is stored in, and retrieved from, memory. Thus, a file system may include the processes and data structures that an operating system uses to keep track of files in memory, e.g., the way the files are organized in memory. Linear Tape File System (LTFS) is an exemplary format of a file system that may be implemented in a given library in order to enables access to compliant tapes. It should be appreciated that various embodiments herein can be implemented with a wide range of file system formats, including for example IBM Spectrum Archive Library Edition (LTFS LE). However, to provide a context, and solely to assist the reader, some of the embodiments below may be described with reference to LTFS which is a type of file system format. This has been done by way of example only, and should not be deemed limiting on the invention defined in the claims.

A tape cartridge may be "loaded" by inserting the cartridge into the tape drive, and the tape cartridge may be "unloaded" by removing the tape cartridge from the tape drive. Once loaded in a tape drive, the tape in the cartridge may be "threaded" through the drive by physically pulling the tape (the magnetic recording portion) from the tape cartridge, and passing it above a magnetic head of a tape drive. Furthermore, the tape may be attached on a take-up reel (e.g., see 121 of FIG. 1A above) to move the tape over the magnetic head.

Once threaded in the tape drive, the tape in the cartridge may be "mounted" by reading metadata on a tape and bringing the tape into a state where the LTFS is able to use the tape as a constituent component of a file system. Moreover, in order to "unmount" a tape, metadata is preferably first written on the tape (e.g., as an index), after which the tape may be removed from the state where the LTFS is allowed to use the tape as a constituent component of a file system. Finally, to "unthread" the tape, the tape is unattached from the take-up reel and is physically placed back into the inside of a tape cartridge again. The cartridge may remain loaded in the tape drive even after the tape has been unthreaded, e.g., waiting for another read and/or write request. However, in other instances, the tape cartridge may be unloaded from the tape drive upon the tape being unthreaded, e.g., as described above.

Magnetic tape is a sequential access medium. Thus, new data is written to the tape by appending the data at the end of previously written data. It follows that when data is recorded on a tape having only one partition, metadata (e.g., allocation information) is continuously appended to an end of the previously written data as it frequently updates and is accordingly rewritten to tape. As a result, the rearmost information is read when a tape is first mounted in order to access the most recent copy of the metadata corresponding to the tape. However, this introduces a considerable amount of delay in the process of mounting a given tape.

To overcome this delay caused by single partition tape media, the LTFS format includes a tape that is divided into two partitions, which include an index partition and a data partition. The index partition may be configured to record metadata (meta information), e.g., such as file allocation information (Index), while the data partition may be configured to record the body of the data, e.g., the data itself. Additional index information may also be written at the end of data.

As index information is updated, it is preferably written over the previous version of the index information in the index partition, thereby allowing the currently updated index information to be accessible at the beginning of tape in the index partition. Old (e.g., outdated) indexes written at the end of data on previous write operations may remain on the medium, because information is written to tape by appending it to the end of the previously written data as described above, these old indexes may remain stored on the tape in the data partition without being overwritten. In other approaches, the index in the data partition may be overwritten upon performing a subsequent write operation.

The metadata may be updated in the index partition and/or the data partition differently depending on the desired embodiment. According to some embodiments, the metadata of the index partition may be updated in response to the tape being unmounted, e.g., such that the index may be read from the index partition when that tape is mounted again. The metadata may also be written in the data partition so the tape may be mounted using the metadata recorded in the data partition, e.g., as a backup option.

According to one example, which is no way intended to limit the invention, LTFS LE may be used to provide the functionality of writing an index in the data partition when a user explicitly instructs the system to do so, or at a time designated by a predetermined period which may be set by the user, e.g., such that data loss in the event of sudden power stoppage can be mitigated.

Various embodiments include combinations of some of the foregoing features with various combinations of the features described below.

Recessed TMR Sensor Structures

Various embodiments are directed to tape recording apparatuses that are comprised of one or more reading and/or writing modules that are not prone to the effects normally associated with running tape on heads for an extended duration. There are no known other solutions.

Various embodiments include an interface for the reading module comprised of a precise pre-recession level and a precise hard coating thickness. One unexpected and surprising result is that heads having a specific pre-recession level and coating thickness run with very little degradation in error rate, and have the capacity for severalfold longer lifespans than prior art heads. Furthermore, low friction is typically a requirement for high areal density tape recording, and in various embodiments, friction is addressed by providing a short tape contacting surface length in the direction of tape motion. For example, in some approaches, friction has been reduced by nearly a factor of two compared to prior art heads.

In addition, writing sharp transitions having well-defined track edges (e.g., no erase band) and reading using very narrow tunnel valve read transducers produces not only higher initial performance but also higher margin, and so are better able to accommodate small changes that may occur during the life of the drive. In experiments, drives constructed according to the teachings herein and run for 900 full file passes (FFPs), where the tape is entirely written to, showed little change in performance over the course of testing.

Figure 9:
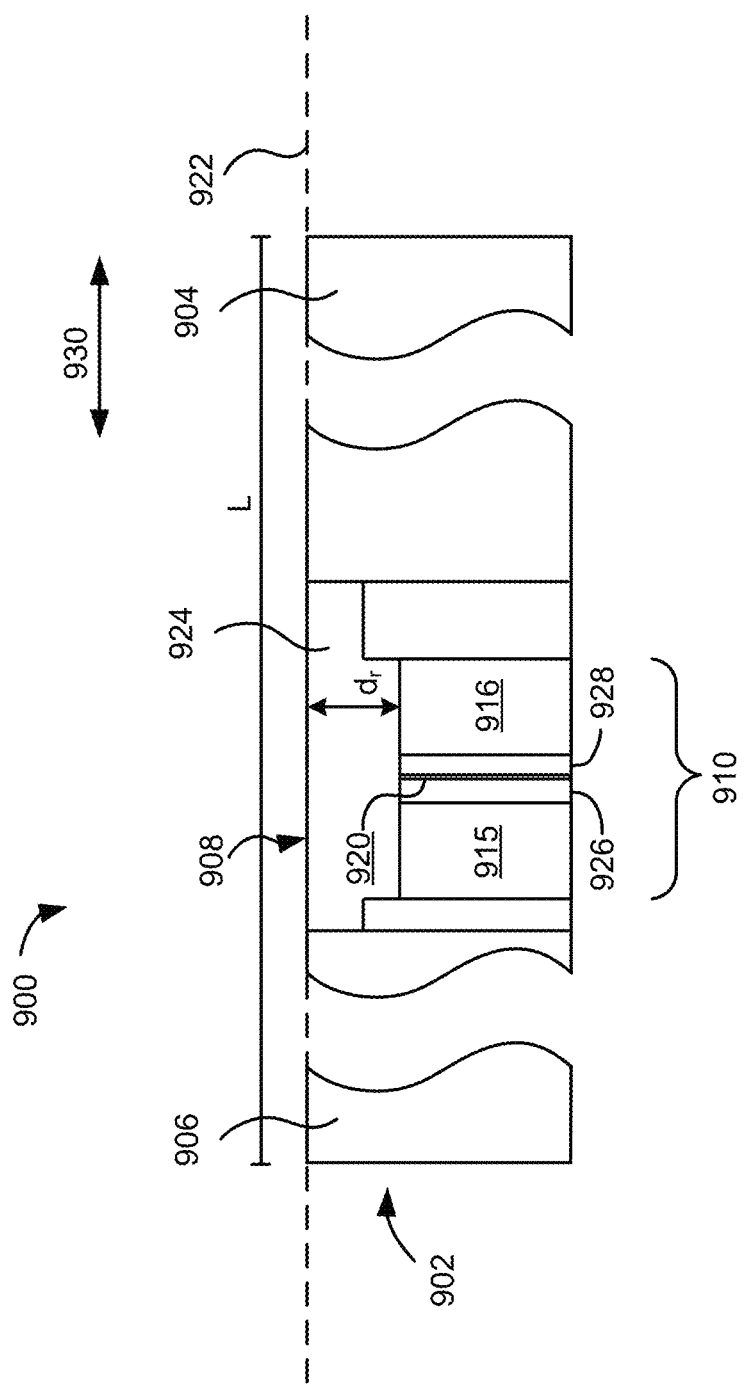
FIG. 9 is a partial cross-sectional view of an apparatus in accordance with various illustrative embodiments.

FIG. 9 depicts an apparatus 900 in accordance with various illustrative embodiments. As an option, the present apparatus 900 may be implemented in conjunction with features from any other embodiment listed herein, such as those described with reference to the other FIGS. Of course, however, such apparatus 900 and others presented herein may be used in various applications and/or in permutations, which may or may not be specifically described in the illustrative embodiments listed herein. Further, the apparatus 900 presented herein may be used in any desired environment.

As shown in FIG. 9, the apparatus 900 includes a module 902. In one approach, the apparatus 900 may include a second and/or third module having a configuration similar or identical to the module 902. For example, the apparatus 900 may include one or more modules in an arrangement similar to any of the magnetic heads described herein.

The module 902 may include a closure 904 and a substrate 906. As shown in FIG. 9, the closure 904 and substrate 906 may define a portion of a media facing surface 908 of the module 902.

Additionally, the module 902 may include one or more read transducers 910, as well as conventional layers such as insulating layers, leads, etc. as would be apparent to one skilled in the art upon reading the present description. The one or more read transducers 910 may be positioned toward the media facing surface 908 of the module 902, sandwiched in a gap portion between the closure 904 and the substrate 906. The one or more read transducers 910 may be present in an array of transducers extending along the media facing side 908 of the module 902.

In another embodiment, the module 902 may include one or more read transducers and one or more write transducers arranged as piggyback read-write transducers, such as those depicted in FIG. 2C; merged read-write transducers, where an upper sensor shield 916 acts as a pole of the writer as well as a sensor shield; or interleaved read and write transducers, where the read and write transducers alternate along the array.

The one or more read transducers 910 may be flanked by servo read transducers, e.g. as in FIG. 2B.

As shown e.g., in FIG. 9, the one or more read transducers may each have at least one shield 915, 916 and a sensor structure 920 having a free layer, a tunnel barrier layer, and a reference layer.

The sensor structure 920 of some or all of the tunnel valve read transducers 910 may be recessed a depth dr from a plane 922 extending along the tape bearing surface 908 of the module 902. Preferably, the recession dr is about 5 nm to about 25 nm below the plane 922 of the tape bearing surface of the head module, preferably 5 nm to about 15 nm.

As also shown in FIG. 9, an at least partially polycrystalline coating 924 is present on a media facing side of the recessed sensor structure 920, and preferably on all of the sensor structures. The at least partially polycrystalline coating may have an average thickness in a range of 5 nm to about 25 nm. The coating may include any hard material, and preferably includes at least partially polycrystalline aluminum oxide (alumina).

The tunnel valve read transducers, and the sensor structures therein, may have any known or conceivable configuration as long as the sensor structure includes the free layer, tunnel barrier layer, and reference layer.

In a preferred approach, each of the tunnel valve read transducers 910 includes an upper magnetic shield 916 above the associated sensor structure, a lower magnetic shield 915 below the associated sensor structure, an upper conducting spacer layer 928 between the sensor structure 920 and the upper magnetic shield 916, a lower conducting spacer layer 926 between the sensor structure and the lower magnetic shield 915. See also FIGS. 10A-11C for exemplary tunnel valve read transducer configurations.

A length L of the tape bearing surface 908 of the module 902 in a tape travel direction 930 is preferably in a range of about 125 to about 250 microns A height of the free layer measured in a direction perpendicular to a tape bearing surface of the module may be less than a width of the free layer measured in a cross-track direction perpendicular to an intended direction of media travel. Such embodiments may take various forms, and preferably include features such as those described in the section entitled "TMR Sensor Configurations for Reduced Magnetic Noise," below.

In some embodiments, the module has patterning for at least one of inducing a magnetic recording tape to fly thereover in an area away from the tunnel valve read transducers and reducing stiction of the magnetic recording tape to the tape bearing surface of the module. Such embodiments may take any reasonable form, and preferably include features such as those described in the section entitled "Patterned Tape Bearing Surface," below.

In some embodiments, the length of the module in the tape motion direction is in a range of about 125 to about 250 microns. Preferably, various embodiments include features such as those described below in the section entitled "Narrow Land and Tape Tenting." For example, in one approach, the tape bearing surface extends between first and second edges of the module. A first tape tenting region extends from the first edge along the tape bearing surface toward the second edge, and each tunnel valve read transducer is positioned in the first tape tenting region. In some approaches, a first guide is positioned relative to the first edge for inducing tenting of a moving magnetic recording tape, and the location of the tenting is above the first tape tenting region. In some approaches, a distance from the first edge to each tunnel valve read transducer is less than a distance from the second edge to the same tunnel valve read transducer.

TMR Sensor Structure Configurations for Reduced Magnetic Noise

Magnetic noise may be experienced in magnetic tape heads due to thermally and/or magnetically induced switching of unstable domains in free layers thereof. To overcome such issues, some of the embodiments included herein provide magnetic tape heads which include modules having tunnel valve read transducers with free layers having favorable dimensions in order to achieve shape anisotropy. Moreover, other embodiments included herein provide magnetic tape heads which include modules having tunnel valve read transducers with hard bias magnets. It follows that various embodiments included herein achieve a resulting structure which is both structurally and functionally different than those seen in conventional tape and/or hard disk drive (HDD) heads.

In order to operate as a magnetic sensor with a linear and symmetric response, the magnetization throughout the free layer slab should ideally constitute a single domain and be aligned to the specific direction for which the rest of the sensor layers are configured at zero applied sense field. Although it is preferred that the aforementioned "specific direction" is the cross-track direction 1052, it may vary depending on the specific embodiment. Moreover, this state of alignment is also preferably energetically stable, such that it is restored after an external sensing field (e.g. from magnetized tape) is applied and then removed again.

As described herein, particularly free layer slab dimensions may be selected to cause the free layer to form a largely homogeneous single magnetic domain aligned along the cross-track direction as a result of shape anisotropy. This may directly result in improved sensor performance and overall increased efficiency of a magnetic head, thereby achieving a significant improvement compared to conventional implementations.

However, in some instances, sensors having non-ideal shape anisotropy may also exhibit distortions of the magnetic alignment near the lateral edges of the domain. In these edge regions, the free layer magnetization may be locally torqued by demagnetizations fields toward a direction perpendicular to the air-bearing surface. Energetically, this causes bifurcation in the magnetic state at the lateral edges, and switching between these states may occur under the impulse of an external field transient (e.g., fringing fields from written tape traveling thereover) and/or thermal agitation. Such switching events undesirably translate into noise in the readback signal.

Biasing the entire free layer to this state of alignment may serve as a first purpose for using hard bias magnets in such instances, particularly as free layer slab dimensions typical for sensors in HDDs may not able to form a magnetization which is sufficiently homogeneous, and with a singly-aligned domain absent the implementation of hard bias magnets.

A further purpose of implementing hard bias magnets is to subject these distorted edge regions of the free layer to a magnetic field which favors torqueing their magnetic orientation back to being about parallel to the cross-track direction. The magnetic field from the hard bias magnets is preferably strong enough to dominate over the local demagnetization fields. The resulting magnetization of the free layer may thereby be influenced such that it constitutes a more homogeneous single domain. The edge regions may also be stabilized in the sense that they are held to this orientation and bifurcated-energy states are suppressed.

Applying a relatively weak magnetic bias to the edge regions of a free layer may create more split states resulting in an upshift of the spectral response of noise in the sensor structure, especially absent desirable shape anisotropy. However, increasing magnetic hard bias strength to overcome this may attenuate signal sensitivity. Thus, choosing the strength of the hard bias magnets involves a compromise between noise and signal strength. For instance, implementing relatively stronger hard bias magnets may decrease the sensitivity of the free layer particularly in the edge regions (which are a significant source of noise), but may also shift the spectral characteristics of the noise processes such that system signal to noise ratio (SNR) is less affected. Conversely, while relatively weaker hard bias magnets allow for retaining better overall signal sensitivity, it comes at a cost in noise performance due to a less homogeneous free layer domain which may include states between which switching can occur.

For reference, sensors implemented in HDDs have small width dimensions (about 50 nm) compared to the length scale of flux leakage toward the shields, resulting in little variation of the field strength from the hard bias across the width of the HDD sensor. There is therefore little latitude to engineer a high-susceptibility sensing region at the center of the free layer separate from low-susceptibility regions at the edges. Overall sensitivity being at a premium for HDDs, the compromise may generally gravitate toward implementing a moderate-to-small strength hard bias.

On the contrary, magnetic sensor structures for magnetic tape typically have widths that are much larger than the length scale of flux leakage toward the shields. According to an example, the width of a magnetic tape sensor structure may be about 1.5 µm, while the length scale of flux leakage toward the shields may be about 200 nm for a shield to shield spacing of about 100 nm. As a result, the outer edge regions of a free layer in the sensor stack may be strongly anchored in order to reduce noise. Moreover, this may be achieved while also exploiting the relatively steep decay of the hard bias field strength over distance from the free layer edges, thereby leaving the susceptibility largely unmodified near the central region of the free layer along its longitudinal axis. As a result, the effective magnetic width and the signal output of the sensor may be decreased moderately, e.g., by an amount in proportion with the width of the edge regions, whereas its noise performance may be significantly improved.

It follows that hard bias magnets may be used to stabilize a free layer and reduce magnetic switching noise in some of the embodiments described herein. However, due to the reduced field overlap between hard bias magnet pairs, and given that the peak bias strength corresponding to achieving optimal biasing conditions for a tape sensor is likely larger than that for an HDD, desirable biasing strengths are not achievable for tape simply by performing incremental changes to conventional HDD hard bias geometry. In sharp contrast to traditional structures and conventional wisdom, various embodiments described herein include new geometric characteristics for free layers and hard bias layers, each of which are able to achieve substantial improvements over conventional implementations, e.g., as will be described in further detail below.

Figure 10A:
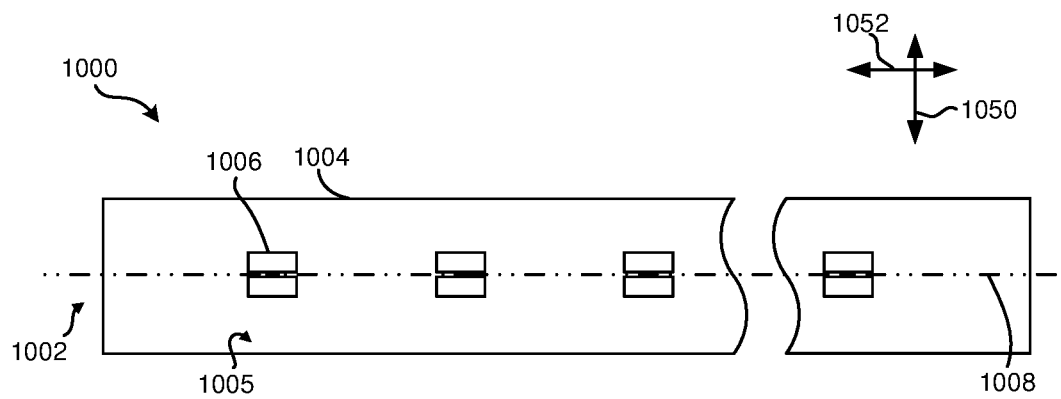
FIG. 10A is a partial tape facing surface view of a magnetic tape head according to one embodiment.
Figure 10B:
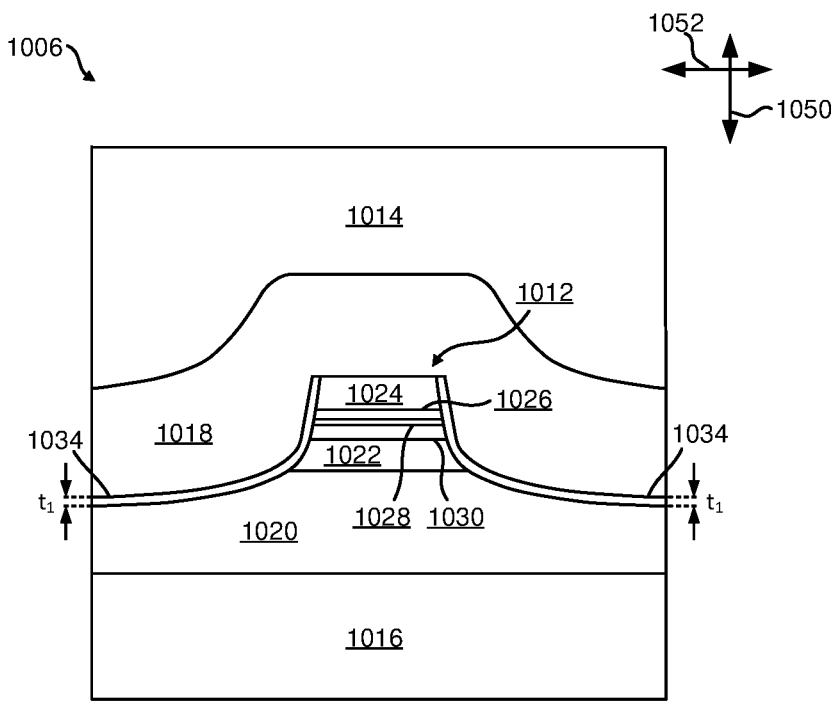
FIG. 10B is a partial detailed tape facing surface view of a tunnel valve read transducer from FIG. 10A.

FIGS. 10A-10B depict an apparatus 1000 in accordance with one embodiment. As an option, the present apparatus 1000 may be implemented in conjunction with features from any other embodiment listed herein, such as those described with reference to the other FIGS. However, such apparatus 1000 and others presented herein may be used in various applications and/or in permutations which may or may not be specifically described in the illustrative embodiments listed herein. Further, the apparatus 1000 presented herein may be used in any desired environment. Thus FIGS. 10A-10B (and the other FIGS.) may be deemed to include any possible permutation.

It should also be noted that additional layers may be present, and unless otherwise specified, the various layers in this and other embodiments may be formed using conventional processes. Additionally, the different figures are not drawn to scale, but rather features may have been exaggerated to help exemplify the descriptions herein.

As shown in FIG. 10A, apparatus 1000 includes a magnetic tape head 1002 which further includes a module 1004. It should be noted that magnetic tape heads are unique in that magnetic tape transducer widths are currently about 30 to about 50 times greater than transducer widths for HDD heads. Moreover, in preferred embodiments, the module 1004 of tape head 1002 includes an array of read transducers. Accordingly, the module 1004 includes a plurality of tunnel valve read transducers 1006 for reading data from data tracks on a magnetic tape. As shown, the plurality of tunnel valve read transducers 1006 are arranged in an array which extends along a longitudinal axis 1008 of the module 1004. Furthermore, in some approaches the module 1004 may further include tunnel valve read transducers which are positioned and configured to read data written to servo patterns (e.g., see servo readers 212 of FIG. 2B-2C).

The plurality of tunnel valve read transducers 1006 also share a common media-facing surface 1005 of the module 1004. According to the present embodiment, no write transducers are present on the common media-facing surface 1005, or even the module 1004 itself. However, it should be noted that in other embodiments, an array of write transducers may also be included on module 1004, on an adjacent module, etc., e.g., as shown in any one or more of FIGS. 2A-7. Moreover, in some embodiments, the apparatus 1000 may include a drive mechanism for passing a magnetic recording tape over the magnetic tape head, e.g., see 100 of FIG. 1A, and a controller electrically coupled to the sensor structure, e.g., see 128 of FIG. 1A.

Looking now to FIG. 10B, a partial detailed view of the tape facing surface of one of the tunnel valve read transducers 1006 in FIG. 10A is shown according to one embodiment. It should be noted that although a partial detailed view of only one of the tunnel valve read transducers 1006 is shown, any one or more of the tunnel valve read transducers 1006 included on module 1004 of FIG. 10A may have the same or a similar construction.

As shown, the tunnel valve read transducer 1006 includes a sensor structure 1012 as well as upper and lower magnetic shields 1014, 1016 respectively, which flank (sandwich) the sensor structure 1012. The separation between the upper and lower magnetic shields 1014, 1016 proximate to the sensor structure and measured along the intended direction of tape (e.g., media) travel 1050 is preferably less than about 120 nm, but could be lower or higher depending on the embodiment. Moreover, upper and lower non-magnetic, conducting (i.e., electrically conductive) spacer layers 1018, 1020 are positioned between the sensor structure 1012 and the magnetic shields 1014, 1016, respectively. In a preferred embodiment, the non-magnetic conducting spacer layers 1018, 1020 include iridium, ruthenium, titanium-nitride, etc.

Between the non-magnetic conducting spacer layers 1018, 1020, the sensor structure 1012 includes an antiferromagnetic layer 1022 and has a sensor cap layer 1024. The sensor structure 1012 also preferably has an active TMR region. Thus, the sensor structure 1012 is shown as also including a free layer 1026, a tunnel barrier layer 1028 and a reference layer 1030. According to various embodiments, the free layer 1026, the tunnel barrier layer 1028 and/or the reference layer 1030 may include construction parameters, e.g., materials, dimensions, properties, etc., according to any of the embodiments described herein, and/or conventional construction parameters, depending on the desired embodiment. In exemplary embodiments, the free layer 1026 may include layers of permalloy and/or cobalt-iron. Illustrative materials for the tunnel barrier layer 1028 include amorphous and/or crystalline forms of, but are not limited to, TiOx, MgO and $Al_2O_3$.

The tunnel valve read transducer 1006 illustrated in FIG. 10B further includes electrically insulating layers 1034 on opposite sides of the sensor structure 1012. The electrically insulating layers 1034 separate the upper conducting spacer layer 1018 from the lower conducting spacer layer 1020 and the sensor structure 1012 to avoid electrical shorting therebetween. According to some approaches, the thickness $t_1$ of the electrically insulating layers 1034 may be less than about 8 nm, but may be higher or lower depending on the desired embodiment. Moreover, it is preferred that the electrically insulating layers 1034 include a dielectric material.

Figure 10C:
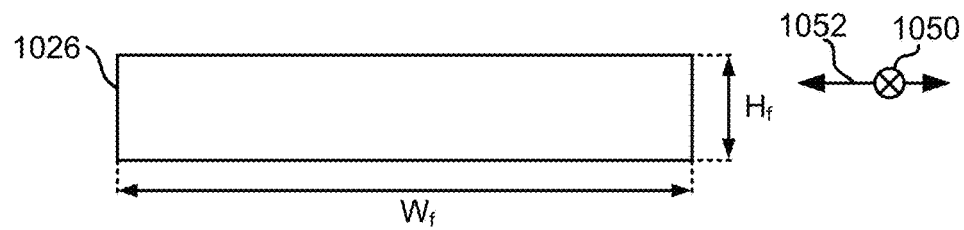
FIG. 10C is a detailed view of the free layer from FIG. 10B shown along a plane perpendicular to the plane of deposition of the free layer, according to one embodiment.
Figure 10D:
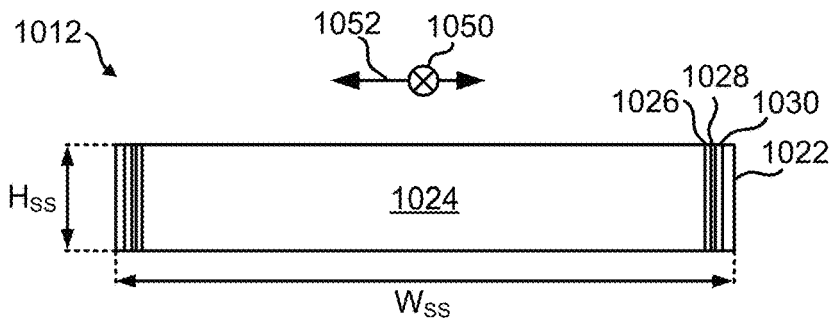
FIG. 10D is a detailed view of the sensor structure from FIG. 10B shown along a plane perpendicular to the plane of deposition of the sensor structure, according to one embodiment.

Looking to FIG. 10C, a view of the free layer 1026 of FIG. 10B is shown along a plane perpendicular to the plane of deposition of the free layer 1026. Arrows indicating the cross-track direction 1052 and the intended direction of tape travel 1050 have been added for reference. As shown, the height $H_f$ of the free layer 1026 is less than the width $W_f$ of the free layer 1026. As shown, the height $H_f$ of the free layer 1026 is measured in a direction perpendicular to a tape bearing surface of the module shown in FIGS. 10A-10B. According to an illustrative approach, which is in no way intended to limit the invention, the width $W_f$ of the free layer 1026 may be less than about 2 µm, but could be higher or lower depending on the desired approach. As mentioned above, free layer slab dimensions may be able to cause the free layer to form a largely homogeneous single magnetic domain aligned along the cross-track direction as a result of shape anisotropy alone. This may directly result in improved sensor performance and overall increased efficiency of a magnetic head. This is a significant improvement compared to conventional implementations which are unable to implement free layers having a width and height as shown in FIG. 10C.

The general shape of the free layer shown in FIG. 10C may also translate to the height and width of the overall sensor structure 1012 shown in FIG. 10B. Looking to FIG. 10D, a view of the sensor structure 1012 is shown along a plane perpendicular to the plane of deposition thereof (the same plane of view as shown in FIG. 10C). Although the sensor cap layer 1024 is in full view, portions of the other layers are also visible along the cross-track direction 1052 in FIG. 10D due to the sensor structure's flared profile shown in FIG. 10B. As described above for the free layer, it is preferred that the height $H_{SS}$ of the sensor structure 1012 is less than the width $W_{SS}$ of the sensor structure 1012. According to some approaches, the height $H_{SS}$ of the sensor structure 1012 may be less than about 0.8 times the width $W_{SS}$ of the sensor structure 1012. More preferably, in some approaches the height $H_{SS}$ of the sensor structure 1012 may be less than about 0.5 times the width $W_{SS}$ of the sensor structure 1012, but could be higher or lower depending on the desired embodiment. This general shape of the sensor structure 1012 may desirably provide improved sensor performance and overall increased efficiency of a magnetic head as a result of shape anisotropy, e.g., as described above in relation to the height $H_f$ and width $W_f$ of the free layer 1026 in FIG. 10C.

Figure 10E:
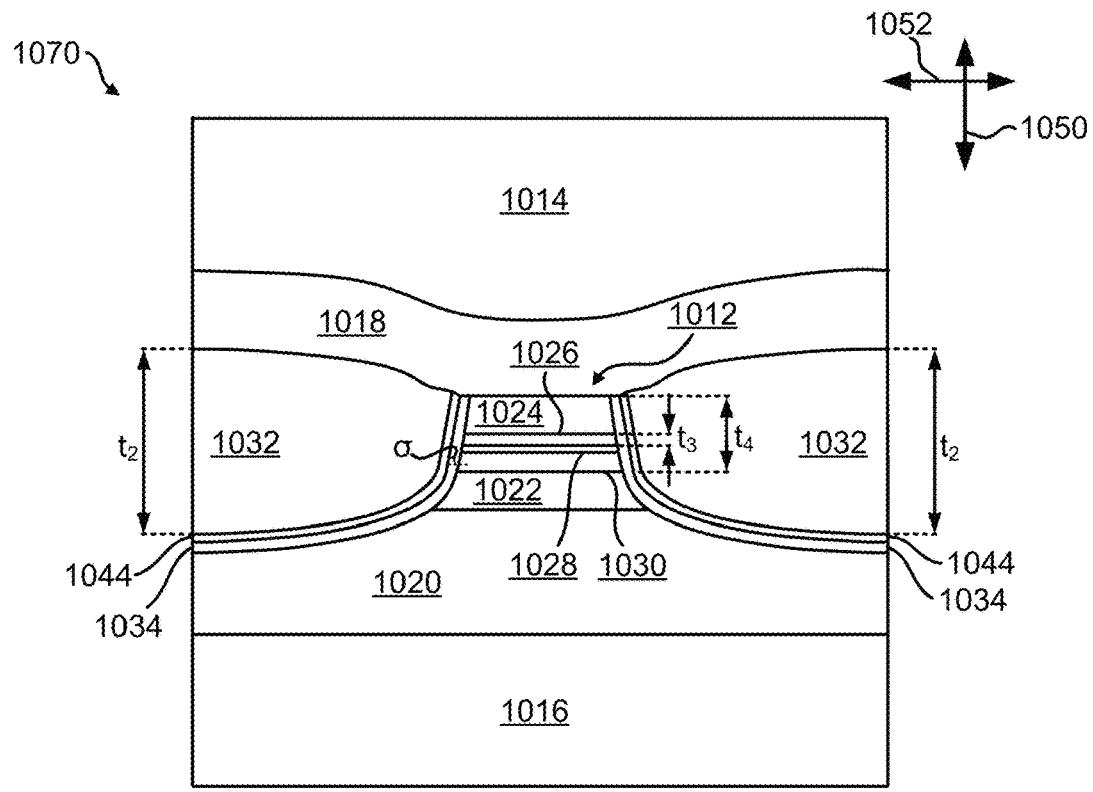
FIG. 10E is a partial detailed tape facing surface view of a tunnel valve read transducer according to one embodiment.

Although tunnel valve read transducers having slab dimensions which form a largely homogeneous single magnetic domain aligned along the cross-track direction of the free layer as a result of shape anisotropy alone are desirable, performance may further be improved by implementing hard bias magnets in some embodiments. As mentioned above, hard bias magnets may be used to further stabilize a free layer and reduce magnetic switching noise. Looking to FIG. 10E, a tunnel valve read transducer 1070 is shown in accordance with one embodiment. As an option, the present tunnel valve read transducer 1070 may be implemented in conjunction with features from any other embodiment listed herein, such as those described with reference to the other FIGS. Specifically, FIG. 10E illustrate variations of the embodiment of FIG. 10B depicting several exemplary configurations within a tunnel valve read transducer 1070. Accordingly, various components of FIG. 10E have common numbering with those of FIG. 10B.

However, such tunnel valve read transducer 1070 and others presented herein may be used in various applications and/or in permutations which may or may not be specifically described in the illustrative embodiments listed herein. Further, the tunnel valve read transducer 1070 presented herein may be used in any desired environment. Thus FIG. 10E (and the other FIGS.) may be deemed to include any possible permutation.

As shown, the tunnel valve read transducer 1070 includes upper and lower magnetic shields 1014, 1016, a sensor structure 1012, as well as upper and lower conducting layers 1018, 1020 positioned between the sensor structure 1012 and the magnetic shields 1014, 1016, respectively.

Furthermore, the sensor structure 1012 is sandwiched laterally along the cross-track direction 1052 by a pair of hard bias magnets 1032. In other words, the hard bias magnets 1032 are positioned proximate to a side of the sensor structure 1012 along a cross-track direction 1052 on opposite sides thereof. The hard bias magnets 1032 may include cobalt-platinum, cobalt-platinum-chrome, etc., or any other hard bias materials which would become apparent to one skilled in the art after reading the present description.

Moreover, electrically insulating layers 1034 are included on opposite sides of the sensor structure 1012. More specifically, an electrically insulating layer 1034 separates each of the hard bias magnets 1032 from the sensor structure 1012 and the lower conducting spacer layer 1020, to avoid electrical shorting therebetween. A seed layer 1044 may also be present between each of the hard bias magnets 1032 and the respective electrically insulating layers 1034 which may be used to form hard bias magnets 1032 having an at least partially crystalline composition, e.g., as will be described in further detail below.

Although the insulating layer 1034 is positioned between each of the hard bias magnets 1032 and the sensor structure 1012, each of the hard bias magnets 1032 are preferably magnetically coupled to (e.g., are in magnetic communication with) the free layer 1026 positioned therebetween. As would be appreciated by one skilled in the art, magnetic coupling may be achieved between two layers when the layers have proper characteristics, which may include: being positioned sufficiently close to each other, having the proper material composition, having proper dimensions, etc., e.g., as will soon become apparent.

As alluded to above, the construction of the hard bias magnets implemented in a given magnetic tape head were found by the inventors to have a significant impact on the performance of the overall magnetic tape head. The inventors were surprised to discover that by increasing a thickness of the hard bias magnets above what was previously considered to be adequate resulted in a very low incidence of noisy tracks. Previously, it was believed that increasing the thickness of the hard bias layers beyond a certain thickness would actually degrade read performance by causing a detrimental amount of hard bias flux to permeate the free layer, thereby reducing readback signal strengths. In sharp contrast, the improvements included herein were achieved, at least in part, by the increased magnetization from the thicker hard bias magnets effectively stabilizing the magnetic domains of the free layer near the lateral edges thereof. Moreover, magnetic tape heads implementing these thicker hard bias magnets were also discovered to be tolerant to variation in other aspects of the sensor structure, e.g., such as free layer magnetostriction and/or pinned layer design. Thus, by implementing hard bias magnet structures which go directly against conventional wisdom, the inventors were able to realize significant improvements in the performance of free layers in tunnel valve read transducers.

Specifically, referring still to FIG. 10E, the inventors were surprised to discover that implementing hard bias magnets

Figure 12:
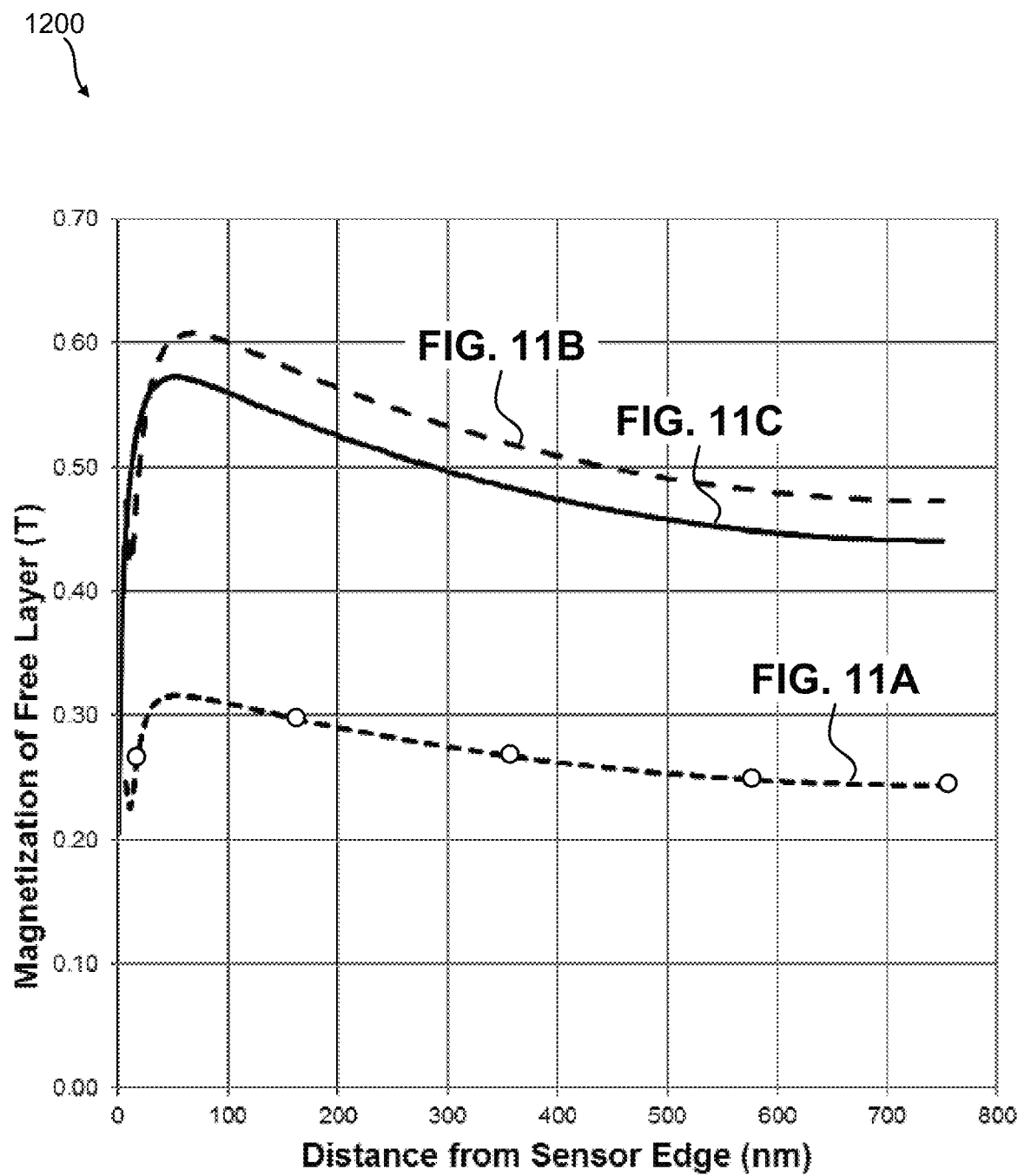
FIG. 12 is a graph plotting the calculated magnetization of the free layer for each of the structures in FIGS. 11A-11C vs. the distance from the sensor edge.

1032 having a deposition thickness $t_2$ that is 10 or more times greater than a deposition thickness $t_3$ of the free layer 1026 results in substantial improvements to the magnetization stability of the free layer 1026 (e.g., see graph 1200 of FIG. 12 below). Without wishing to be bound by any theory, the inventors believe that this surprising result is achieved because the thicker hard bias magnets 1032 are able to overcome the loss of field at the ends of the hard bias magnets 1032 due to magnetic flux leakage into the magnetic shields 1014, 1016 over the relatively large dimensions (e.g., large widths) of the tape transducer layers. It follows that, a deposition thickness $t_2$ of each of the hard bias magnets 1032 at about a thickest portion thereof is preferably at least 8 times greater, more preferably at least 10 times greater than a deposition thickness $t_3$ of the free layer 1026. In some embodiments, the thickness of the hard bias magnets may be expressed as a multiple of the thickness of the free layer times the ratio of the magnetic moment of the free layer divided by the magnetic moment of the hard bias magnets. Accordingly, the inventors found that while conventionally this ratio is about 8, a ratio of about 16 may be implemented for stabilizing the free layer. According to one approach, a thickness of the hard bias magnets at a thickest portion thereof may be at least 12 times greater than a thickness of the free layer times a ratio of the magnetic moment of the free layer divided by the magnetic moment of the respective hard bias magnet. According to another approach, the deposition thickness $t_2$ of each of the hard bias magnets 1032 at about a thickest portion thereof may be about 65 nm, while the deposition thickness $t_3$ of the free layer 1026 is about 6.5 nm. In preferred approaches, the deposition thickness $t_3$ of the free layer 1026 is at least 4 nm. However, it should be noted that the thickness $t_2$ of each of the hard bias magnets 1032 at about a thickest portion thereof may vary, e.g., depending on the material composition of the layer.

Moreover, the deposition thickness of each of the hard bias magnets 1032 may diminish toward the free layer 1026, thereby resulting in a tapered profile of the hard bias magnets 1032 toward the free layer 1026. According to an exemplary approach, the taper length of the hard bias magnets 1032 may be less than the maximum thickness $t_2$ of each of the hard bias magnets 1032. However, a deposition thickness $t_4$ of each of the hard bias magnets 1032 at an edge closest to the free layer 1026 is preferably at least greater than the deposition thickness $t_3$ of the free layer 1026. As a result, a significant amount of hard bias material is present at the interface between each of the hard bias magnets 1032 and the free layer 1026, thereby increasing the total amount of flux density that may be produced from the edge of the hard bias magnets 1032.

It is also preferred that a first portion of each of the hard bias magnets 1032 is positioned below a lower surface of the free layer 1026, and a second portion of each of the hard bias magnets 1032 is positioned above an upper surface of the free layer 1026. Referring to the present description, the terms "lower"/"below" and "upper"/"above" are intended to be relative to each other along a deposition direction of the layers, the deposition direction being parallel to the intended direction of tape travel 1050 in the present embodiment. In other words, it is desirable that the edge of each of the hard bias magnets 1032 facing the free layer 1026 overlaps the free layer 1026 along the intended direction of tape travel 1050, and may even be centered relative to the free layer 1026, e.g., as shown in FIG. 10E.

The edge of each of the hard bias magnets 1032 closest to the free layer 1026 preferably has about a vertical profile. In other words, it is desirable that the edge of each of the hard bias magnets 1032 closest to the free layer 1026 is oriented at an angle α relative to a plane of deposition of the free layer, where the angle α may be in a range from about 65° to about 105°, more preferably in a range from about 70° to about 95°, ideally in a range from about 70° to about 90°. By implementing hard bias magnets 1032 having an edge closest to the free layer 1026 that is sufficiently vertical relative to a horizontally-oriented plane of deposition of the free layer, magnetization of the free layer 1026 is significantly improved as a result (e.g., see graph 1200 of FIG. 12 below). However, the angle α of one or more of the hard bias magnets 1032 may be higher or lower depending on the desired embodiment. Furthermore, a free layer 1026 having edges facing the hard bias magnets which are about perpendicular (e.g., between about 80° and about 100°) relative to a plane of deposition thereof may also improve magnetization of the free layer 1026, as will soon become apparent.

It should be noted that in other embodiments, the shape and thickness of the hard bias magnets 1032 may be selected to result in maximum coupling of magnetic flux into the free layer 1026. Accordingly, depending upon the thickness $t_3$ of the free layer 1026, the magnetic flux from the hard bias magnets 1032 may serve to reduce the output of the free layer 1026 in response to recorded data on a tape. While not ideal in terms of signal output, such designs may be more magnetically stable.

Figure 11A:
FIG. 11A is a partial detailed view of a hard bias structure and a free layer according to the prior art.
Figure 11B:
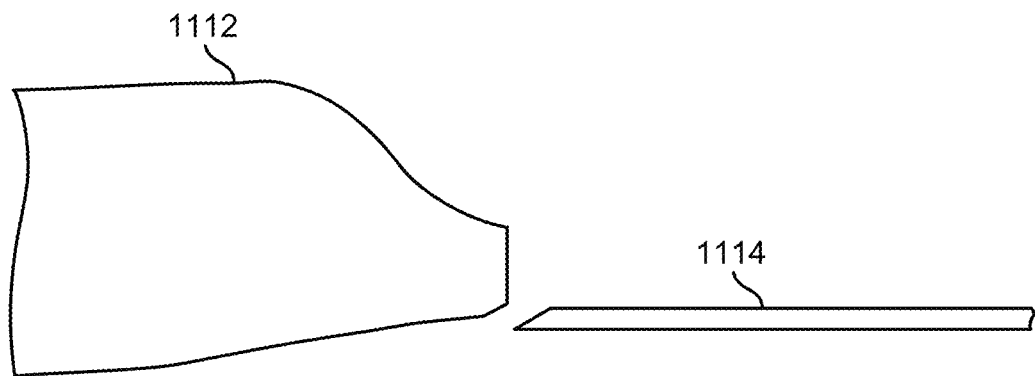
FIG. 11B is a partial detailed view of a hard bias magnet and a free layer according to one embodiment.
Figure 11C:
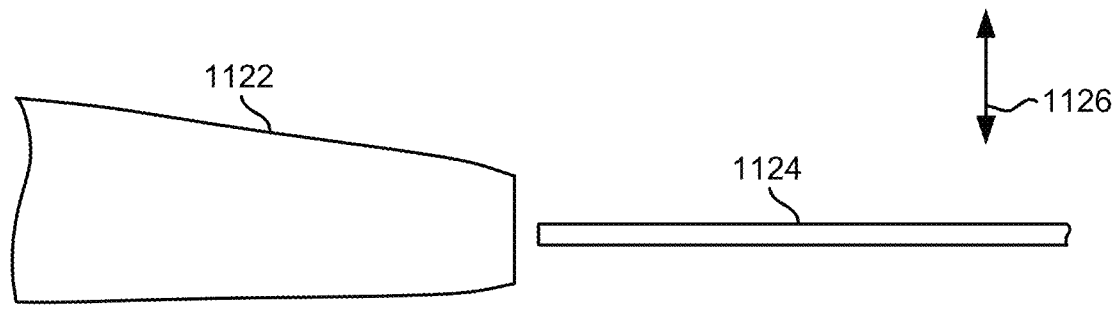
FIG. 11C is a partial detailed view of a hard bias magnet and a free layer according to one embodiment.

Referring momentarily to FIGS. 11A-11C, three different hard bias magnet configurations are illustrated relative to a free layer. Moreover, graph 1200 of FIG. 12 includes plots showing magnetization of the free layer vs. the distance from the sensor edge (along the width of the free layer) for each of the three configurations in FIGS. 11A-11C. It should be noted that the plots included in graph 1200 were obtained using finite element analysis, and well-known materials properties for the free layer and hard bias magnets, while keeping the variables therebetween equal, other than the geometric differences of the hard bias and free layers as described below.

Looking first to FIG. 11A, the hard bias structure 1102 included therein is consistent with conventional hard bias structures. As shown, the hard bias structure 1102 is only slightly thicker than the free layer 1104, and the hard bias structure 1102 oriented almost entirely above the free layer 1104. As illustrated by the corresponding plot in graph 1200 of FIG. 12, the resulting magnetization of the free layer is adversely low. Moreover, the magnetization of the free layer makes an adverse dip before rising to a maximum value at the distance of about 50 nm.

Conversely, FIG. 11B includes a hard bias magnet 1112 which has a maximum thickness that is much greater than the thickness of the free layer 1114, e.g., according to any of the approaches included herein. The corresponding plot in graph 1200 of FIG. 12 illustrates that the increased thickness of the hard bias magnet 1112 desirably causes a significant increase to the magnetization of the free layer 1114, thereby improving the magnetic stability of the free layer 1114, particularly at its lateral edge. Although the resulting increase to the magnetization of the free layer 1114 is desirable, the plot in graph 1200 corresponding to the structure of FIG. 11B still includes an undesirable dip before rising to a maximum value at the distance of about 75 nm.

However, as described above, the inventors discovered that by orienting the hard bias magnet such that it is about centered with the free layer along the deposition direction and/or by making an edge of the hard bias magnet facing the free layer about perpendicular to the plane of deposition, even greater improvements may be achieved. Accordingly, the embodiment illustrated in FIG. 11C illustrates a hard bias magnet 1122 which is about centered with the free layer 1124 along the deposition direction 1126. The hard bias magnet 1122 also has an edge facing the free layer which is about perpendicular to the plane of deposition (or about parallel to the deposition direction 1126). Moreover, by forming the free layer 1124 such that an edge thereof facing the hard bias magnet 1122 is also about perpendicular to the plane of deposition, performance may even further be improved. As a result, the corresponding plot in graph 1200 of FIG. 12 indicates significant improvements to the magnetization of the free layer relative to what was conventionally achievable (see plot for FIG. 11A), while also eliminating the previously experienced dip in the magnetization of the free layer. It follows that various embodiments described herein were surprisingly discovered by the inventors to provide a sufficient magnetic field to stabilize the free layer and reduce magnetic noise.

Referring again to FIG. 10E, the hard bias magnets 1032 may be formed to have different dimensions (e.g., a different structure) according to various approaches. However, according to preferred approaches, the hard bias magnets 1032 included herein are formed such that the magnetic field produced by each of the hard bias magnets 1032 is close to a maximum achievable value. In other words, each of the hard bias magnets 1032 is preferably characterized as producing a magnetic field that is greater than or equal to 90% of a maximum achievable magnetic field for the material of the respective hard bias magnet 1032. Producing a magnetic field close to the maximum achievable magnetic field for the material of the respective hard bias magnet 1032 may be accomplished by implementing favored (e.g., ideal) processing steps during the manufacture thereof, e.g., such as ensuring proper seed layer templated growth, performing a proper annealing process on the resulting structure, etc.

Figure 10F:
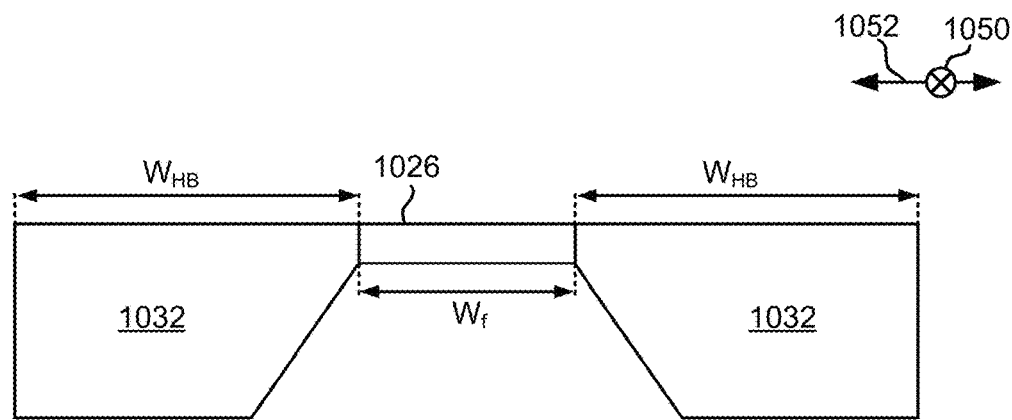
FIG. 10F is a detailed view of the free layer and hard bias magnets from FIG. 10E shown along a plane perpendicular to the plane of deposition of the free layer and the hard bias magnets, according to one embodiment.

Referring momentarily to FIG. 10F, a view of the hard bias magnets 1032 and free layer 1026 of FIG. 10E are shown along a plane perpendicular to the plane of deposition of the hard bias magnets 1032 and the free layer 1026. Arrows indicating the cross-track direction 1052 and the intended direction of tape travel 1050 have been added for reference. As shown, the width $W_{HB}$ of the hard bias magnets 1032 are measured in the cross-track direction 1052. Moreover, according to preferred embodiments, the width of the hard bias magnets 1032 is at least about 0.3 µm, but could be higher or lower depending on the desired embodiment.

Referring again to FIG. 10E, according to some approaches, each of the hard bias magnets 1032 may be at least partially crystalline. In other words, the hard bias magnets 1032 may be formed in such a way that the material composition thereof is crystalline in nature.

As previously mentioned, the hard bias magnets 1032 in FIG. 10E may have an at least partially crystalline material composition. A hard bias magnet 1032 having a crystalline material composition may be formed by first depositing a seed layer 1044, and then forming the hard bias magnet layer 1032 from the seed layer 1044. By using the seed layer 1044 as a base, the hard bias magnet layer 1032 may desirably form such that the material composition thereof is crystalline in nature.

Accordingly, the hard bias magnet 1032 may be formed in full above the seed layer in some approaches. However, crystalline structure growth may become less uniform as the hard bias magnet becomes thicker, and the distance from the seed layer increases. Thus, in some approaches, additional seed layers may be implemented to avoid structural degradations caused by a loss of templating. In one such approach, a hard bias magnet may be a split hard bias structure which includes two seed layers, each of the seed layers having an at least partially crystalline structure formed thereabove.

Figure 10G:
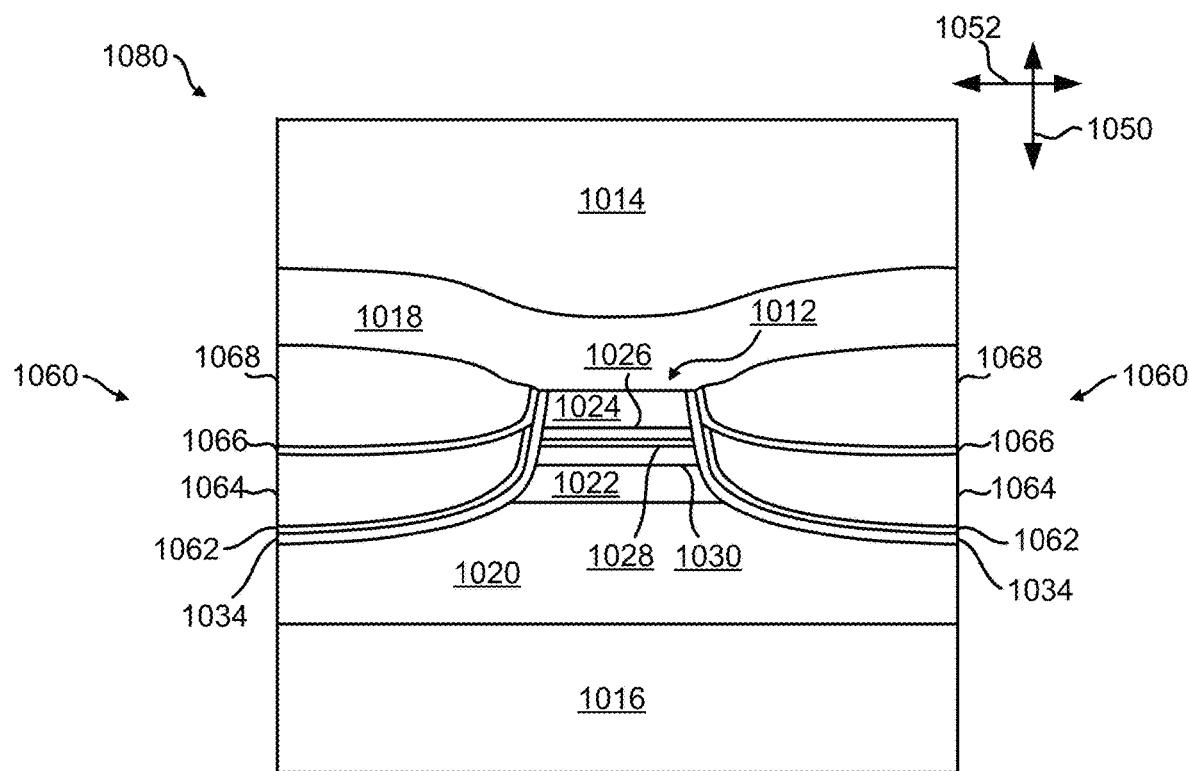
FIG. 10G is a partial detailed tape facing surface view of a tunnel valve read transducer according to one embodiment.

Referring momentarily now to FIG. 10G, a tunnel valve read transducer 1080 having split hard bias magnets 1060 having a crystalline material composition may be formed by first depositing a seed layer 1062, and then forming a first hard bias layer 1064 from the seed layer 1062, e.g., as described above. Once a portion, e.g., about one half, of the total hard bias magnet 1060 has been formed, formation of the first hard bias layer 1064 may be stopped, and a second seed layer 1066 is deposited on an upper surface of the first hard bias layer 1064 as shown. Thereafter, a second hard bias layer 1068 may be formed from the second seed layer 1066. The first and second hard bias layers 1064, 1068 may be formed using a same or similar material, e.g., depending on the desired embodiment. It should be additionally noted that FIG. 10G illustrates variations of the embodiment of FIG. 10E depicting an exemplary configuration within a magnetic tape head 1002. Accordingly, various components of FIG. 10G also have common numbering with those of FIG. 10E.

As mentioned above, shape anisotropy achieved by free layer dimensions and/or dimensions of the sensor structure as a whole were able to improve overall performance of various tunnel valve read transducers described herein. Furthermore, hard bias magnets according to various embodiments described herein were surprisingly discovered by the inventors to provide a magnetic field that more effectively stabilizes the free layer. Without wishing to be bound by any theory, the inventors believe that this surprising result is achieved because the thicker hard bias magnets are able to overcome the loss of field at the ends of the hard bias magnets due to magnetic flux leakage into the magnetic shields over the larger dimensions (e.g., width and/or length) of the tape transducer. Accordingly, some of the embodiments included herein are successfully able to significantly reduce magnetic noise in magnetic tape heads conventionally caused by thermally and/or magnetically induced switching of unstable domains in a tunnel valve free layer.

Patterned Tape Bearing Surface

In some embodiments, which may include any of the other features described herein in any combination, a module may have patterning for inducing the magnetic recording tape to fly thereover in an area away from the transducers and/or to reduce stiction of the magnetic recording tape to the tape bearing surface of the portion (as compared to a smooth, planar tape bearing surface). Examples of patterning include texturing, beveling of sections of the tape bearing surface edge, formation of ridges or ribs thereon, formation of channels therein, etc.

In preferred embodiments, to enhance the formation of an air wedge between a moving magnetic recording tape and the tape bearing surface of a module in an area away from the transducers, the outer edges of the tape bearing surface of the module are patterned with a beveled edge on outer portions of the module. The beveled edge encourages formation of an air wedge between the tape and the tape bearing surface, thereby reducing friction as compared to a smooth, planar tape bearing surface, allowing a broader set of approach angles for the tape, and/or allowing use of a no-wrap or even slightly overwrapped design where the tape approaches the leading outer portion in a plane parallel to or nearly parallel to the tape bearing surface of the leading outer portion.

Figure 13:
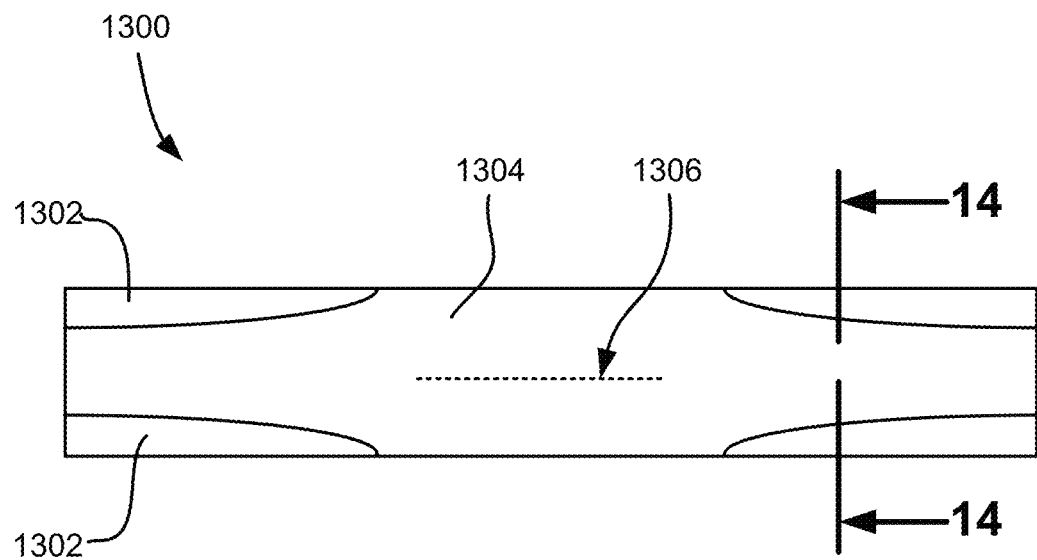
FIG. 13 is a tape bearing surface view of a portion of a tape head module having patterning according to one embodiment.
Figure 14:
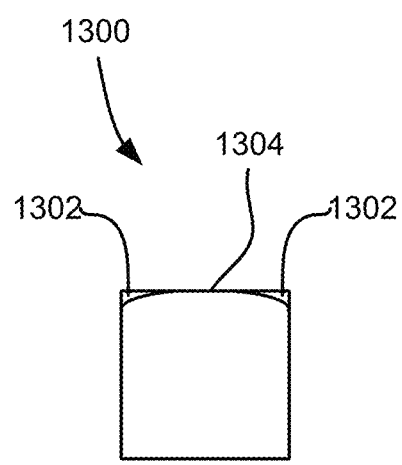
FIG. 14 is a cross sectional view taken from Line 14-14 of FIG. 13.

FIGS. 13 and 14 depict a module 1300 in accordance with one embodiment. As an option, the present module 1300 may be implemented in conjunction with features from any other embodiment listed herein, such as those described with reference to the other FIGS. Of course, however, such module 1300 and others presented herein may be used in various applications and/or in permutations which may or may not be specifically described in the illustrative embodiments listed herein. Further, the module 1300 presented herein may be used in any desired environment.

FIGS. 13 and 14 illustrate an example of a module 1300 having patterning as can be achieved by tape lapping. In a tape lapping process, a tape having abrasive sections, e.g., of diamond, alumina, etc. is drawn over the portion to selectively abrade areas thereof. In this example, the abrasive tape would have abrasive strips flanking a central nonabrasive strip. As shown in the example of FIGS. 13 and 14, areas 1302 of edges of the tape bearing surface 1304 not aligned with the transducers 1306 become beveled. The beveling promotes entrainment of air between the magnetic recording tape and the tape bearing surface. The sections of the edges of the tape bearing surface aligned with the transducers is not significantly affected by the tape lapping, and therefore retains its ability to skive air from the tape. In one illustrative embodiment, the central portion and outer portions have patterning with physical characteristics of being lapped by tape lapping.

Narrow Land and Tape Tenting

FIGS. 15A-15B depicts an apparatus 1500 in accordance with one embodiment. As an option, the present apparatus 1500 may be implemented in conjunction with features from any other embodiment listed herein, such as those described with reference to the other FIGS. Of course, however, such an apparatus 1500 and others presented herein may be used in various applications and/or in permutations which may or may not be specifically described in the illustrative embodiments listed herein. Further, the apparatus 1500 presented herein may be used in any desired environment.

In the depicted embodiment of apparatus 1500, the module 1501 includes a tape bearing surface 1508, a first edge 1506, and a second edge 1504.

Looking to FIG. 15A-15B, the module 1501 preferably includes a thin film region 1514 with a TMR sensor structure 1509 positioned between the tape support surfaces 1522, 1524.

According to some embodiments, the sensor structure 1509 may be configured as a data sensor for reading data tracks of a magnetic recording tape. In some approaches, the apparatus 1500 includes one or more arrays of such data sensors.

According to other embodiments, the sensor structure 1509 may be configured as a servo pattern reading sensor of a servo reader. For example, the sensor structure 1509 may be configured as a servo pattern reading sensor where apparatus 1500 includes one or more arrays of data sensors and/or writers and one or more servo pattern reading sensors for reading servo data on a magnetic recording tape.

Looking to FIG. 15A-15B, the thin film region 1514 may have a first shield 1519 and a second shield 1520. In addition, the second shield 1520 may be positioned proximate to the first edge 1506. A CPP sensor structure 1509 (e.g. such as a TMR sensor structure, GMR sensor structure, etc. of a type known in the art) is positioned between the first and second shields 1519, 1520. As would be appreciated by one skilled in the art, the first and second shields 1519, 1520 preferably provide magnetic shielding for the CPP sensor structure 1509. Thus, one or both of the shields 1519, 1520 may desirably include a magnetic material of a type known in the art.

Furthermore, in one embodiment of apparatus 1500, the sensor structure 1509 in the thin film region 1514 of the module 1501 may have a reference layer 1515. Particularly, as shown in FIG. 15B, the active TMR region of the sensor structure 1509 includes a tunnel barrier layer 1512 as the spacer layer 1512 positioned between the free layer 1516 and the reference layer 1515 e.g., of conventional construction. According to various embodiments, the free layer 1516, the tunnel barrier layer 1512 and/or the reference layer 1515 may include construction parameters, e.g., materials, dimensions, properties, etc., according to any of the embodiments described herein, and/or conventional construction parameters, depending on the desired embodiment. Illustrative materials for the tunnel barrier layer 1512 include amorphous and/or crystalline forms of, but are not limited to, TiOx, MgO and $Al_2O_3$.

Moreover, the free layer 1516 may be positioned between the reference layer 1515 and the first edge 1506.

First and second spacer layers 1517, 1518 may also be included in the transducer structure of the thin film region 1514 as shown in FIG. 15B. The spacer layers 1517, 1518 are preferably conductive in some approaches, but may be dielectric in other approaches. The spacer layers 1517, 1518 preferably have a very low ductility, e.g., have a high resistance to bending and deformation in general, and ideally a lower ductility than refractory metals such as Ir, Ta, Ru and Ti. The first spacer layer 1517 is positioned between the sensor structure 1509 and the first shield 1519 (e.g., the shield closest thereto). Similarly, the second spacer layer 1518 is positioned such that it is sandwiched between the sensor structure 1509 and the second shield 1520 (e.g., the shield closest thereto).

As shown in FIGS. 15A-15B, tenting may be induced above the sensitive transducers, thereby minimizing tape-transducer contact in the tenting region. Particularly, when the tape 1502 moves across the head in the tape travel direction 1540, air is skived from below the tape 1502 by the leading edge of the tape support surface 1524, and though the resulting reduced air pressure in the area between the tape 1502 and the tape bearing surface 1508 allows atmospheric pressure to urge the tape toward the tape bearing surface 1508, the combination of wrap angle and tape bending stiffness causes the tape 1502 to lift from the tape bearing surface 1508 of the module 1501 proximate to the leading edge. Similarly, when the tape 1502 moves across the module 1501, the tape is also lifted from the tape bearing surface 1508 proximate to the trailing edge due to the combination of wrap angle $\alpha_2$ at the trailing edge and tape bending stiffness. Accordingly, the tenting effect is bidirectional.

For present purposes, the wrap angle $\alpha_2$ is measured between a plane 1535 of the tape bearing surface 1508 and a straight line 1523 drawn tangent to the tape supporting surface of the respective guide 1562, 1560 and intersecting the edge 1504. As shown, the tape tends to bow as it wraps the edge, and consequently the angle the tape makes relative to the plane 1535 of the tape bearing surface 1508 at the edge is smaller than the wrap angle $\alpha_2$.

Any wrap angle $\alpha_1$ greater than 0° results in a tent 1511 being formed by the tape 1502 proximate the leading edge 1506 of the tape bearing surface 1508. A wrap angle $\alpha_2$ greater than 0° at the trailing edge 1504 results in a tent 1510 being formed by the tape 1502 proximate the trailing edge 1504 of the tape bearing surface 1508. This effect is a function of the wrap angle, tape bending stiffness, tape surface roughness, tape surface compressibility, atmospheric pressure, and tape tension, and to a lesser extent, tape speed. For given geometrical wrap angles for example, stiffer tapes tend to produce larger tents 1510, 1511. Nonetheless, where conditions such as wrap angle and tape tension are otherwise identical, tapes of a given type from a particular manufacturer tend to exhibit a similar tenting profile whereby the tenting region defined thereunder varies only slightly from tape to tape. Tapes from different manufacturers and/or generations may exhibit dissimilar tenting characteristics under otherwise identical conditions. Fortunately, tenting characteristics are readily determinable using numerical modeling techniques known to those of skill in the art, such as Finite Element Modeling (FEM), Finite Difference Modeling (FDM), etc. and combinations thereof. Nonetheless, differences in tenting characteristics from tape to tape in the same generation under otherwise identical conditions may be considered negligible.

If the wrap angle $\alpha_1$ is high, the tape 1502 will tend to bend away further from the tape bearing surface 1508 in spite of the vacuum. The larger the wrap angle $\alpha_1$, the larger the tent 1510,1511. Ultimately, the forces (atmospheric pressure) urging the tape 1502 toward the tape bearing surface 1508 may be overcome and the tape 1502 becomes decoupled from the tape bearing surface 1508. Therefore, the wrap angle $\alpha_1$ is preferably selected to provide the desired tenting without destroying the vacuum induced by skiving. In a preferred embodiment of apparatus 1500, the wrap angle $\alpha_1$ created by the guide may be in a range of about 0.1 to about 1.5 degrees, but may be higher or lower.

A guide mechanism 1560 may be configured to set a wrap angle $\alpha_1$ of the magnetic recording tape 1502 at the first edge 1506 of the module 1501. Another guide mechanism 1562 may be configured to set the wrap angle at the second edge 1504. One or both of such guide mechanisms 1560, 1562 may include, e.g., a tape guide such as guide 125 of FIG. 1A, a pitch roller, a tension arm, another module, etc. in any combination.

Multiple modules may be assembled to form a tape head having an internal wrap angle that may be selected based on a measurement of the edge-to-sensor separation for each module.

According to the illustrative embodiment in FIG. 15A, the guide mechanism 1560 may be positioned relative to the first edge 1506 at a location that induces tenting 1511 of a magnetic recording tape 1502 moving over the module 1501, where the sensor structure 1509 may be positioned under the location of the first tent 1511. In some approaches, the guide 1560 may be positioned to set a wrap angle of the magnetic recording tape 1502 relative to a plane 1535 of the tape bearing surface 1508. The tape bearing surface 1508 is shown to be planar, but may be arcuate in other embodiments.

The length of the tape bearing surface 1508 may accommodate tape tenting regions 1507, 1513 along the tape bearing surface 1508. The first tape tenting region 1513 is generally defined as the region along the tape bearing surface under the tape 1502 as the tape 1502 forms a tent 1511 while moving. The second tape tenting region 1507 is generally defined as the region along the tape bearing surface 1508 under the tape 1502 as the tape 1502 forms the tent 1510 while moving. Preferably, the two tents 1511, 1510 formed by the tape 1502 do not overlap and thus the two tents 1511, 1510 may not interfere with one another.

Furthermore, the module 1501 includes a sensor structure 1509 in a thin film region 1514, where a distance $d_1$ from the first edge 1506 to the sensor structure 1509 may be less than a distance $d_2$ from the second edge 1504 to the sensor structure 1509. As shown, the sensor structure 1509 may be positioned in the first tape tenting region 1513. Moreover, in some approaches, the distance $d_2$ from the second edge 1504 to the sensor structure 1509 may be at least as long as the first tape tenting region 1513.

In some approaches, the first distance $d_1$ from the first edge 1506 to the sensor structure 1509 may be about equal to a second distance $d_2$ from the second edge 1504 to the sensor structure 1509. Where length $d_1$ and length $d_2$ are about equal and the wrap angles $\alpha_1$, $\alpha_2$ are about the same at both edges 1506, 1504, the sensor structure 1509 within the thin film region 1514 may be positioned at about a peak of the locations of the tenting 1511 and 1510.

Furthermore, the configuration of the two tenting regions 1513, 1507 along a tape bearing surface 1508 may include a region 1503 where the tape 1502 may not be subject to significant bending from the edges 1504, 1506 but rather may be essentially parallel to the tape bearing surface 1508. Thus, at the region 1503, the tape 1502 may be in very close contact with the tape bearing surface 1508.

With continued reference to FIG. 15A, a second guide 1562 may be positioned relative to the second edge 1504 for inducing tenting 1510 of a moving magnetic recording tape 1502, where the first guide 1560 positioned relative to the first edge 1506 may be positioned to create a first wrap angle $\alpha_1$ and the second guide 1562 positioned relative to the second edge 1504 may be positioned to create a second wrap angle $\alpha_2$, where the first wrap angle $\alpha_1$ may not be the same as the second wrap angle $\alpha_2$, e.g., are at least 0.1 degree different, and preferably greater than about 0.2 degrees different. In preferred embodiments, the first wrap angle $\alpha_1$ created by the first guide 1560 may be in a range of about 0.1 to about 1.5 degrees, but may be higher or lower.

As alluded to above, the second wrap angle $\alpha_2$ may be at a different angle than the first wrap angle $\alpha_1$ to induce tenting having differing characteristics, as described in more detail below. In some approaches, the second wrap angle $\alpha_2$ may be greater than the first wrap angle $\alpha_1$. In other approaches, the second wrap angle $\alpha_2$ may be less than the first wrap angle $\alpha_1$, e.g., as shown in FIG. 15A. In another approach, the second wrap angle $\alpha_2$ may be 0, e.g., as shown in FIG. 16, discussed immediately below.

Figure 16:
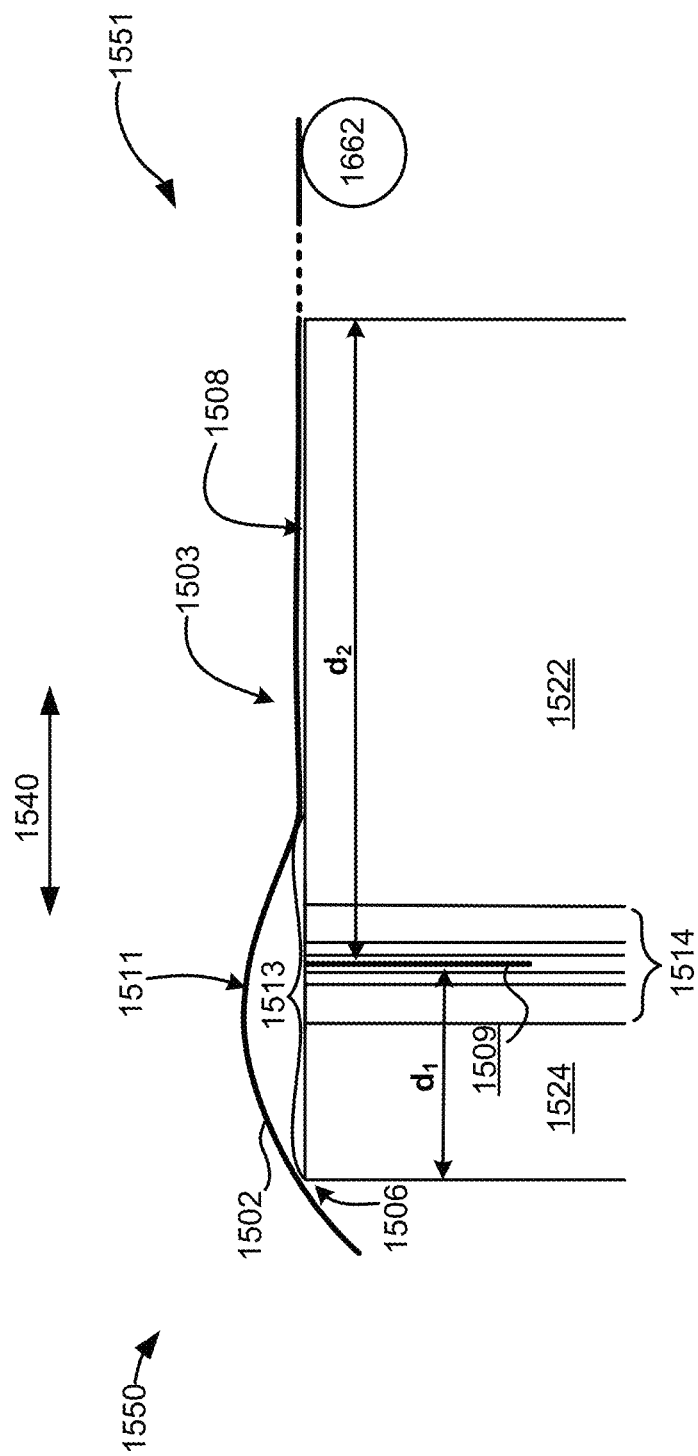
FIG. 16 is a side view of a magnetic tape head according to one embodiment.

FIG. 16 depicts an apparatus 1550 in accordance with one embodiment. As an option, the present apparatus 1550 may be implemented in conjunction with features from any other embodiment listed herein, such as those described with reference to the other FIGS. Of course, however, such an apparatus 1550 and others presented herein may be used in various applications and/or in permutations which may or may not be specifically described in the illustrative embodiments listed herein. Further, the apparatus 1550 presented herein may be used in any desired environment.

In one embodiment of apparatus 1550 as shown in FIG. 16, the module 1551 includes a first guide 1560 positioned relative to the first edge 1506 to create a first wrap angle $\alpha_1$. There is no second wrap angle. There may be a second guide mechanism 1662 in which the tape runs approaches and exits the tape bearing surface adjacent guide 1662 without a wrap angle. In some approaches, the first wrap angle $\alpha_1$ created by the first guide 1560 may be in a range of about 0.1 to about 1.5 degrees, but could be higher or lower.

Referring once again to FIG. 15B, the guide 1560 may be positioned to create an inflection point 1526 of the moving magnetic recording tape 1502, the inflection point 1526 being at a location above the tape bearing surface 1508 that may be between the free layer 1516 and the second edge 1504. In some embodiments, the free layer 1516 may be positioned under the convex region 1528 of the magnetic recording tape 1502, as shown in FIG. 15B. In other approaches, the free layer 1516 may be positioned such that the inflection 1526 point of the magnetic recording tape 1502 is at a location about directly above the tape bearing surface 1508 of the free layer 1516. In yet other approaches, the free layer 1516 may be positioned under the concave region 1530 of the magnetic recording tape 1502. In preferred embodiments, the sensor structure is under the convex region 1528.

In one embodiment of apparatus 1500, the sensor structure 1509 may have a reference layer 1515, and a spacer layer 1512 positioned between the free layer 1516 and the reference layer 1515. Moreover, the free layer 1516 may be positioned between the reference layer 1515 and the first edge 1506. In some approaches, the spacer layer 1512 may be a tunnel barrier layer.

Figure 17A:
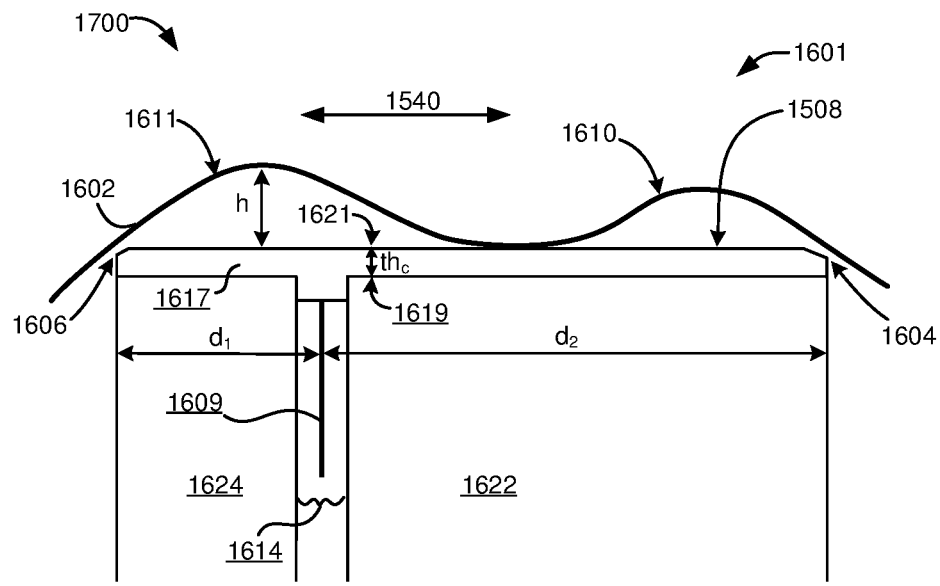
FIG. 17A is a side view of a magnetic tape head according to one embodiment.
Figure 17B:
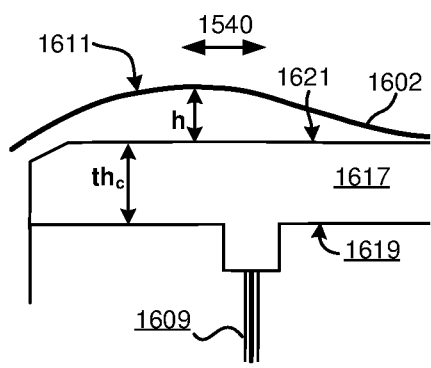
FIG. 17B is a detailed side view of a magnetic tape head according to one embodiment.

FIGS. 17A-17B depict an apparatus 1700 in accordance with one embodiment. As an option, the present apparatus 1700 may be implemented in conjunction with features from any other embodiment listed herein, such as those described with reference to the other FIGS. Of course, however, such an apparatus 1700 and others presented herein may be used in various applications and/or in permutations which may or may not be specifically described in the illustrative embodiments listed herein. Further, the apparatus 1700 presented herein may be used in any desired environment.

As shown, apparatus 1700 includes a module 1601 having a tape bearing surface 1508, a first edge of the tape bearing surface 1508 forming a first edge 1606, a second edge of the tape bearing surface 1508 forming a second edge 1604, where tents 1610, 1611 formed by the magnetic tape 1602 may extend from the edges 1604, 1606 along the tape bearing surface 1508. A sensor structure 1609 is positioned in a thin film region 1614 of the module 1601. Moreover, the sensor structure 1609 includes a free layer.

Furthermore, the distance $d_1$ from the first edge 1606 along the tape bearing surface 1508 of the free layer of the sensor structure 1609 may be less than a distance $d_2$ from the second edge 1604 to the free layer of the sensor structure 1609.

In other approaches of apparatus 1700, a media facing side of the sensor structure 1609 may be recessed from the tape bearing surface 1508.

In an exemplary embodiment, e.g., as shown in FIGS. 17A-17B, the module 1601 includes a wear coating 1617 on a media facing side of the sensor structure 1609 where a peak height h may be defined between a peak of the tenting 1611 and an upper surface 1621 of the coating 1617. The thickness the of the coating 1617 may be defined by the distance between the upper surface 1619 of the tape support surface 1622, 1624 and the upper surface 1621 of the coating 1617. In some approaches, the thickness the of the coating 1617 may be in a range of between about 0.5 and about 3 times the peak height h. For example, FIG. 17B illustrates a thickness the of a coating 1617 that may be about two times the peak height h.

In yet another approach of apparatus 1700, the guide may be a second module having magnetic transducers thereon such as one of the other modules, e.g., as shown in the various FIGS. (see FIG. 2A with two modules and FIG. 7 with three modules).

One embodiment of apparatus 1700 may include a drive mechanism such as a motor or other known mechanism that is configured to cause the tape to move over the first block and a controller electrically coupled to the drive mechanism. For example, the motor or other known mechanism may drive a tape supply cartridge, e.g., tape supply cartridge 120 of FIG. 1A, and a take-up reel, e.g., take-up reel 121 also of FIG. 1A, of a drive in which the block is implemented in, to move the tape media over the block and/or other components of the drive.

Figure 18A:
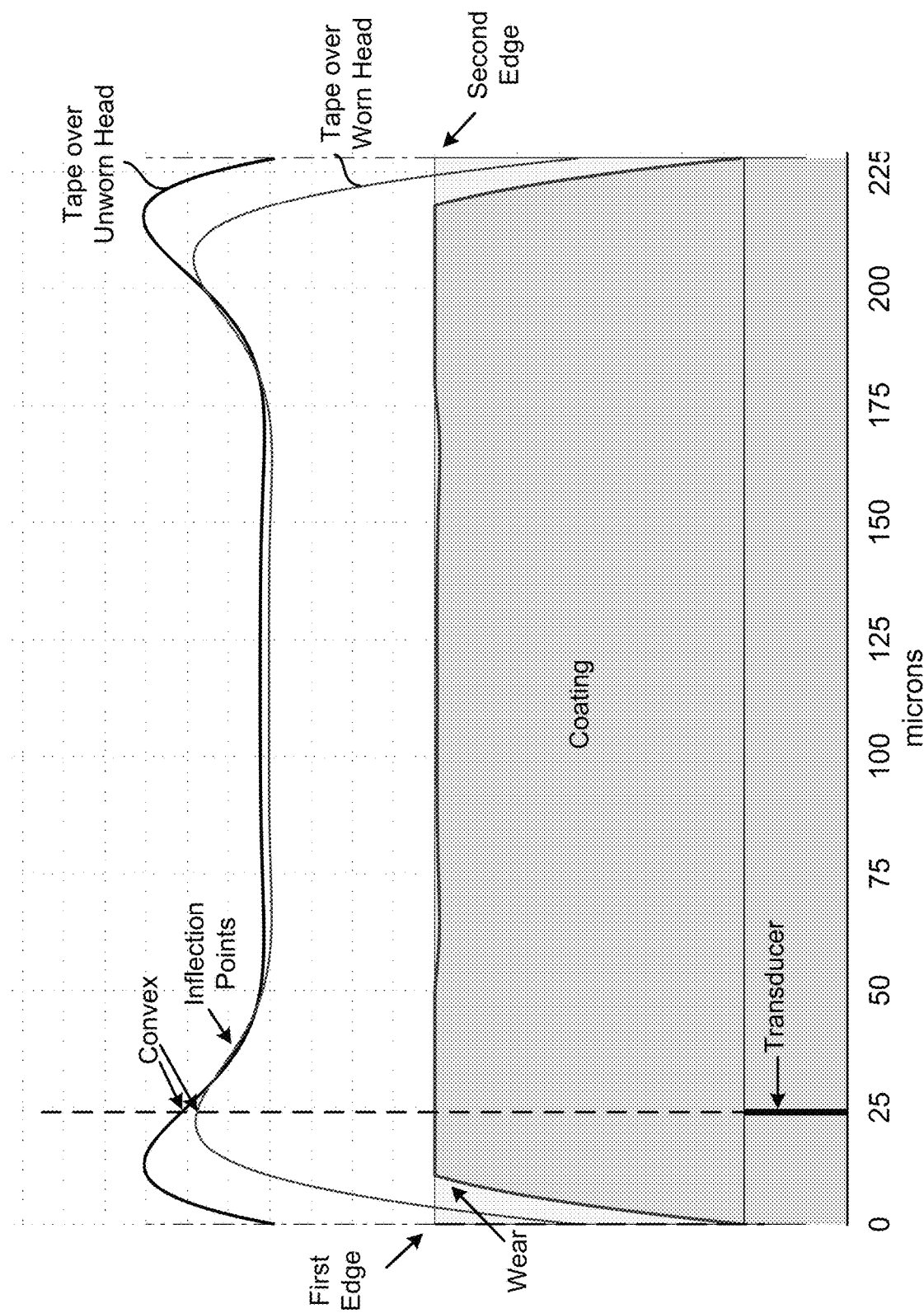
FIG. 18A-18B are graphic examples of Finite Element Modeling (FEM) according to various embodiments
Figure 18B:
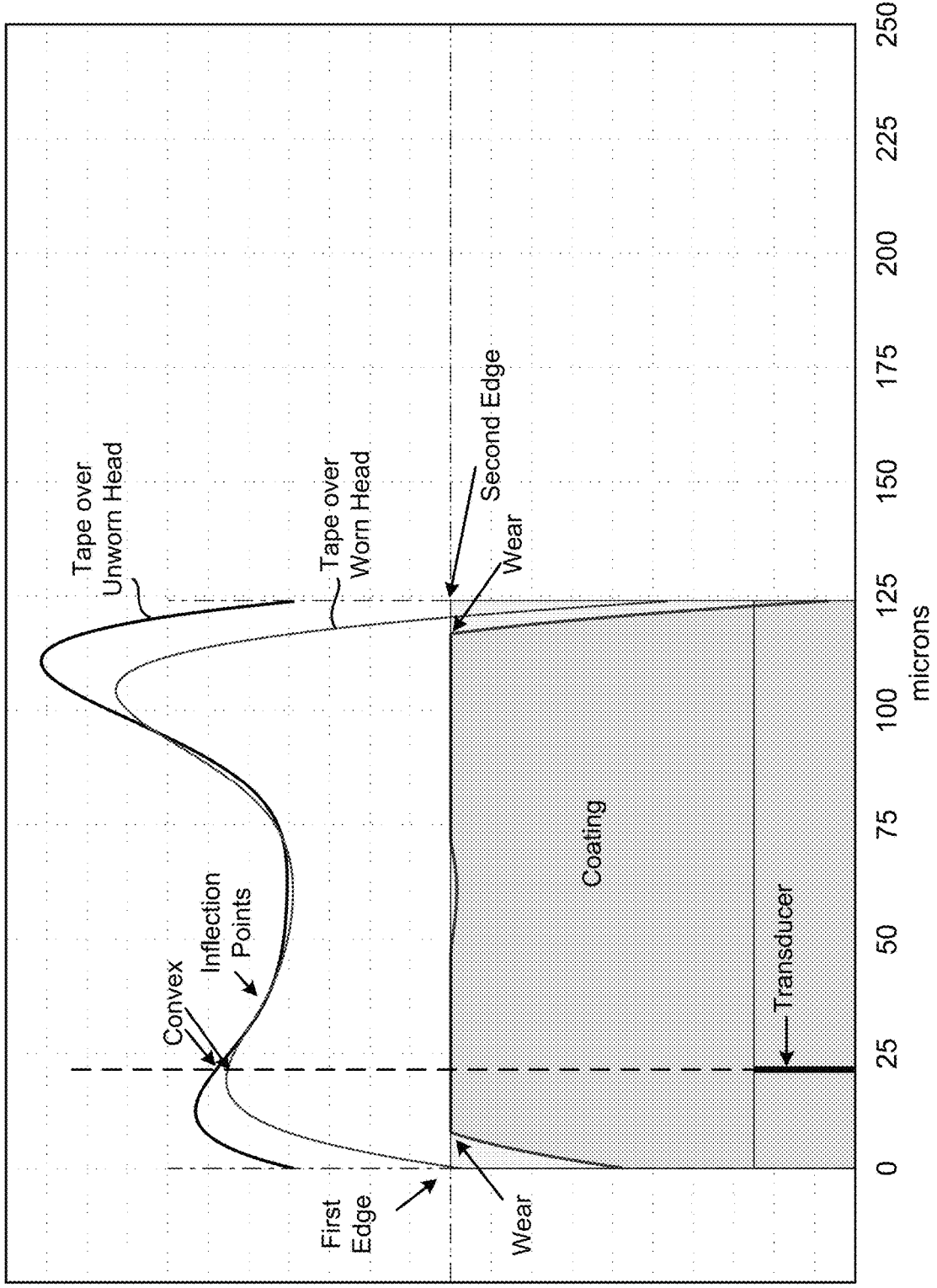

FIGS. 18A-18B represent modeling examples from a Finite Element Modeling (FEM) technique that shows how the wear on the module by the running tape may change the tape profile as the tape head becomes worn. The x-axis shows the distances between the edges of the modules in the two models (0 to 225 μm on the x-axis in FIG. 18A, and 0 to 125 μm on the x-axis in FIG. 18B) with the sensor structure placed nearest the edge on the left of the head. Preferably, the free layer of the sensor structure is positioned between the tunnel barrier layer and the first edge in order to mitigate shorting across the TMR sensor structure.

In the modeling examples of FIGS. 18A and 18B, the y-axis shows the height of the tape and the tenting profile above the module. The upper surface of the coating is indicated by 0 thereby representing the tape bearing surface. The substrate, sensor structure, and closure show an upper surface (below the coating) at approximately −15 nm on the y-axis. Each figure (FIGS. 18A and 18B) shows the tape profile modeling for different extents of wear of the tape bearing surface, either tape an unworn head with coating (thick black line), or tape over a worn head with coating (thin black line).

FIG. 18A illustrates the modeling wear simulations of a preferred embodiment. Wear near the center of the module is indicated by a slight dip in the upper surface of the coating along the 0 marker of the y-axis. At the edges of the closure and substrate, there is minimal wear since conventional modern tapes are less likely to wear the hard ceramic material of the substrate and closure (the bottom portion −20 and −15 nm on the y-axis). Running the tape over the module will generally cause the coatings to wear, especially at the edges and to a smaller extent in the center of the module (shown in FIG. 18A at the edges of the coating portion, at the 0 on the y-axis). This pattern of head wear may even be seen with very durable coatings.

Wear of the coating slows significantly or effectively stops when the tape begins to contact the edges of the ceramic of the head at the substrate and closure. At this level of wear on the module, the coating tends to acquire a bevel. With continued reference to FIG. 18A, comparing the tape profile of the tape run over an unworn head (thick black line) and the tape run over a worn head (thin black line), it was surprising and unexpected that the tape-to-head spacing above the sensor structure remained essentially unchanged, thereby suggesting that the spacing was unaffected by the wear.

Furthermore, the region of the tape having a convex curvature (as opposed to a flatter shape at the inflection point) tended to move toward the sensor structure position. Thus, without wishing to be bound by any theory, the inventor believes that having a thick durable coating gives the surprising benefit that as the coating slowly wears, the curvature of the tape above the sensor structures may change to a convex shape but may not increase in head-to-tape spacing. In other words, on a coated head, the convex region may move into a desired location above the sensor structures where the coating is approximately twice as thick as the magnetic head-to-tape spacing (as illustrated in FIG. 17B). In contrast, on the uncoated head, the convex region created by the tape may be closer to the edge and therefore may tend to have higher spacing. Coatings with intermediate thicknesses may produce results in between these two cases.

FIG. 18B illustrates the modeling wear simulation in an embodiment where the land length is significantly shorter (125 μm) than the embodiment shown in FIG. 18A (225 μm). In addition, the wrap angle on the right is relatively large, 0.9 degrees. This embodiment shows that positioning the sensor structure asymmetrically (toward the first edge of the head) may be combined with a narrow land and asymmetrical wrap angles and large wrap angles. The smaller land with increased wrap angle may result in the tents formed by the tape between the two edges colliding together and thus the length between the tents may not flatten above the module.

The simulation shown in FIG. 18B also demonstrates the surprising and unexpected result that the head-to-tape spacing proximate to the sensor structure may not be notably affected by wear when the sensor structure is positioned asymmetrically near one edge. In contrast, the inventor had expected that the absence of a flattened portion of the tape near the center of the module would result in greater head-to-tape spacing above the sensor structure in the tenting region. Surprisingly, the opposite effect was observed.

Without wishing to be bound by any theory, it appears that any sensitivity to changes with wear may not be dependent on starting shape of the module or wrap angles. Thus, there are advantages to this design. Namely, the asymmetrical head geometry may accommodate variations in tape and head design. Moreover, the wrap angle on the distant edge (second edge) may be adjusted to help stiffen the tape profile along with narrowing the land. In turn, stiffening the tape may improve flutter and help mitigate shorting.

Moreover, as demonstrated by FIG. 18B, the tenting regions may overlap. One way of controlling the amount of overlap without significantly changing the height of the tape above the transducer is to control the second wrap angle at the second edge. This may provide additional bending stiffness in the tape between the peaks, which may reduce tape jitter and may improve signal quality. This may also be facilitated by making the distance between the two edges smaller.

Figure 19:
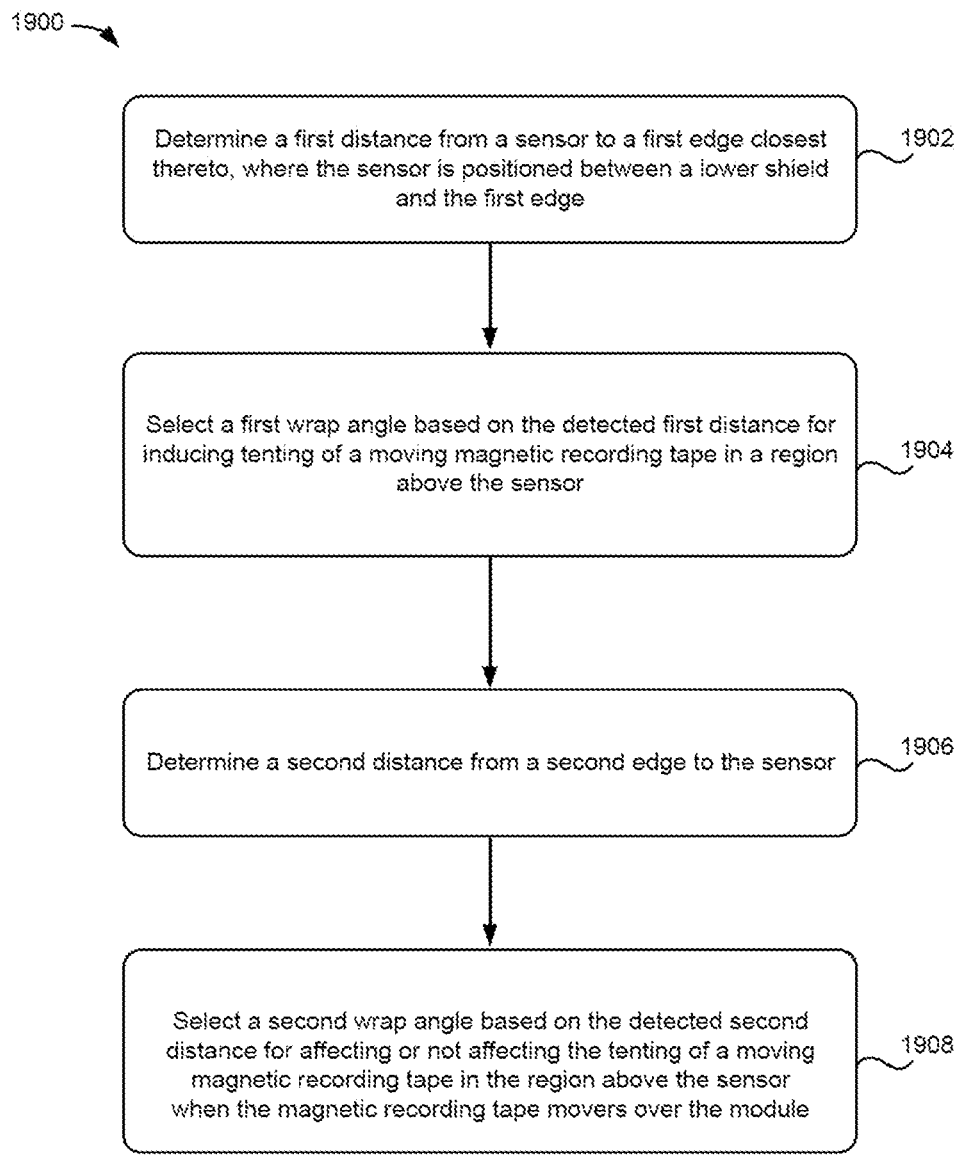
FIG. 19 is a flow chart of a method according to one embodiment.

FIG. 19 depicts a method 1900 for determining a wrap angle to induce a desired tenting in accordance with one embodiment. As an option, the present method 1900 may be implemented in conjunction with features from any other embodiment listed herein, such as those described with reference to the other FIGS. Of course, however, such a method 1900 and others presented herein may be used in various applications and/or in permutations which may or may not be specifically described in the illustrative embodiments listed herein. Further, the method 1900 presented herein may be used in any desired environment.

According to one embodiment as shown in FIG. 19, method 1900 includes a step 1902 of determining a distance from a first edge to a sensor structure of a module. Looking to FIG. 15B which represents the circle 15B in FIG. 15A, a distance $d_1$ may represent the length of the portion between the edge 1506 and the sensor structure 1509. As illustrated in FIG. 15B, the tape bearing surfaces 1508 of the module 1501 may be primarily planar. In embodiments where the tape bearing surface 1508 of the module 1501 is primarily planar, the planar portions of the tape bearing surface 1508 may lie along a common plane 1535.

In one embodiment, the distance $d_1$ is a stored value that is retrieved. In another embodiment, the distance $d_1$ is detected. In some approaches, the distance $d_1$, from first edge 1506 to sensor structure 1509, and/or the distance $d_2$ from the second edge 1504 to the sensor structure 1509, may be measured mechanically using conventional techniques. For example, atomic force microscopy and/or stylus profilometry may be used. In other approaches, the distance $d_1$ and/or distance $d_2$ may be measured optically using conventional techniques. For example, machine vision may be used. In one approach, laser or other optical interferometry may be used. Preferably, the resolution of the optical detector is in the sub-micron level. The module may have a distance $d_1$ from edge 1506 to sensor structure 1509, of less than 100 μm in order for the module to be wide enough for accurate positioning of the guide to determine a wrap angle $\alpha_1$.

With continued reference to FIG. 19, method 1900 includes a step 1904 of selecting a first wrap angle based on the detected distance for inducing tenting of a magnetic recording tape in a region above the sensor structure when the magnetic recording tape moves over the module. For example, looking to FIG. 15B a wrap angle $\alpha_1$ may be selected based on the distance $d_1$ for inducing a tenting of a magnetic recording tape 1502 in a region (e.g. region of tenting 1511) above the sensor structure 1509 when the magnetic recording tape 1502 moves across the module.

In various embodiments of method 1900, the wrap angle may be selected based on one or more desired tenting characteristics that are variable with changing wrap angle.

One such tenting characteristic is peak height of the tenting formed at a particular wrap angle $\alpha_1$. See, e.g., peak height h of a tent 1511 in FIG. 15B (which, like other features shown, is not to scale). Another tenting characteristic is tent height $h_m$ directly above the transducer. In some approaches, the peak height h and/or tent height $h_m$ may be in a range of from about 5 to about 30 nanometers from a tape bearing surface 1508 of media support surface 1524, but could be higher or lower. In various approaches, the peak height h and/or tent height $h_m$ may be measured from the plane of the media facing surface of a sensor structure or from the media facing surface of a sensor structure that is recessed from the plane of the tape support surface (see FIGS. 17A and 17B).

In some approaches, the tenting characteristic may be a length of a tent 1511 formed at a particular wrap angle $\alpha_1$.

Tenting characteristics corresponding to differing wrap angles may be determined experimentally, e.g., by running a tape over the module and measuring characteristics; determined via modeling; extrapolated from experimental or modeled data; etc. Tenting characteristics may be approximated and/or averaged across several different types of tapes that are compatible with the module to select a wrap angle that is a best fit for all types of tape. In some approaches, the wrap angle may be selected under an assumption that the tenting characteristics of all tapes suitable for use with the module behave in a substantially similar manner and therefore any commercially-available tape may be used in experimentation or modeling to determine the tenting characteristics.

In another approach, wrap angles may be calculated for each of a plurality of magnetic recording tapes from different manufacturers to create a similar desired tent region above the tape bearing surface of the sensor structure. The results can be stored in a table and applied when each particular tape is detected by the drive.

Whichever approach is used to determine a wrap angle, the determined wrap angle(s) may be output, e.g., for use in positioning components of a tape drive for creating the desired wrap angle.

With continued reference to FIG. 19, method 1900 includes a step 1906 of determining a distance from a second edge to a sensor structure of a module. Looking to FIG. 15A, a distance $d_2$ may represent the length of the portion between the second edge 1504 and the sensor structure 1509. The tape bearing surfaces 1508 of the module 1501 may be primarily planar. In embodiments where the media bearing surface 1508 of the module 1501 is primarily planar, the planar portions of the media bearing surface 1508 may lie along a common plane 1535.

With continued reference to FIG. 19, method 1900 includes a step 1908 of selecting a second wrap angle based on the detected distance for inducing tenting of a magnetic recording tape in a region above the sensor structure when the magnetic recording tape moves over the module. For example, looking to FIG. 15A a wrap angle $\alpha_2$ may be selected based on the distance $d_2$ for affecting or not affecting the tenting of the magnetic recording tape 1502 in a region (e.g. region of tenting 1511) above the sensor structure 1509 when the magnetic recording tape 1502 moves across the module. The second wrap angle on the $\alpha_2$ may be selected to further adjust the height of the tape tent, or to have no effect at all.

In various embodiments of method 1900, the wrap angle may be selected based on one or more tenting characteristics that vary with changing wrap angle.

In one embodiment of method 1900, consideration may be given to whether the wrap angles are to be set using a second module. If so, then positioning a second module may be used to set the selected wrap angle. If not, positioning a guide may be used to set the selected wrap angle.

In some approaches, one or both of the wrap angles $\alpha_1, \alpha_2$ may be set in the drive by dynamic guides. One approach employs eccentric rollers, whereby the offset axis creates an orbital arc of rotation, allowing precise alignment of the wrap angles $\alpha_1, \alpha_2$. Alternatively, outriggers of a type known in the art may be used to set the wrap angles $\alpha_1, \alpha_2$.

In some embodiments, the wrap angles $\alpha_1, \alpha_2$ may be dynamically set in the drive. In one approach, a dynamically-positionable tape head may be used with fixed rollers. In another approach, the wrap angles $\alpha_1, \alpha_2$ may be set by a positionable tape support within the drive. Following method 1900 in which the distance of the sensor structure to the edge closest thereto is measured and may be used to determine the wrap angle at a given sensor-to-tape spacing, the tape guide may be adjusted to set the desired wrap angle.

Magnetic recording tapes from different manufacturers may perform differently as the tape runs over the edge. Thus, different wrap angles may be calculated for magnetic recording tapes from different manufacturers to create a similar desired tent region above the tape bearing surface of the sensor structure. Various embodiments described herein provide a method to determine a wrap angle for a magnetic recording tape over a sensor structure.

FIG. 20 depicts a method 2000 in accordance with one embodiment. As an option, the present method 2000 may be implemented in conjunction with features from any other embodiment listed herein, such as those described with reference to the other FIGS. Of course, however, such a method 2000 and others presented herein may be used in various applications and/or in permutations which may or may not be specifically described in the illustrative embodiments listed herein. Further, the method 2000 presented herein may be used in any desired environment.

As shown in FIG. 20, in one embodiment of method 2000, step 2002 includes running a magnetic recording tape over an edge adjacent a sensor structure of a module.

Step 2004 of method 2000 involves detecting magnetic fields from the tape e.g., data, where an extent of spacing is detectable as spacing loss, and representative of the distance at differing wrap angles of the tape over the edge for a height of tenting of the tape above the sensor structure.

Step 2006 of method 2000 includes selecting one of the wrap angles to provide about a desired height of tenting of the tape above the sensor structure. In preferred embodiments, the portion of the tape directly above the sensor structure is convex. See, e.g., FIG. 11A.

In some approaches, method 2000 may involve positioning a second module to set the selected wrap angle. In other approaches, method 2000 may involve positioning a guide to set the selected wrap angle.

In some approaches to method 2000, the wrap angle may be selected based on a tenting characteristic that varies with changing wrap angle. In other approaches, the tenting characteristic may be a peak height of a tent formed at a particular wrap angle. In yet other approaches, the peak height may be in a range of from about 5 to about 30 nanometers from a media facing side of the transducer.

In another embodiment of method 2000 the tenting characteristic may be a length of a tent formed at a particular wrap angle.

Figure 21:
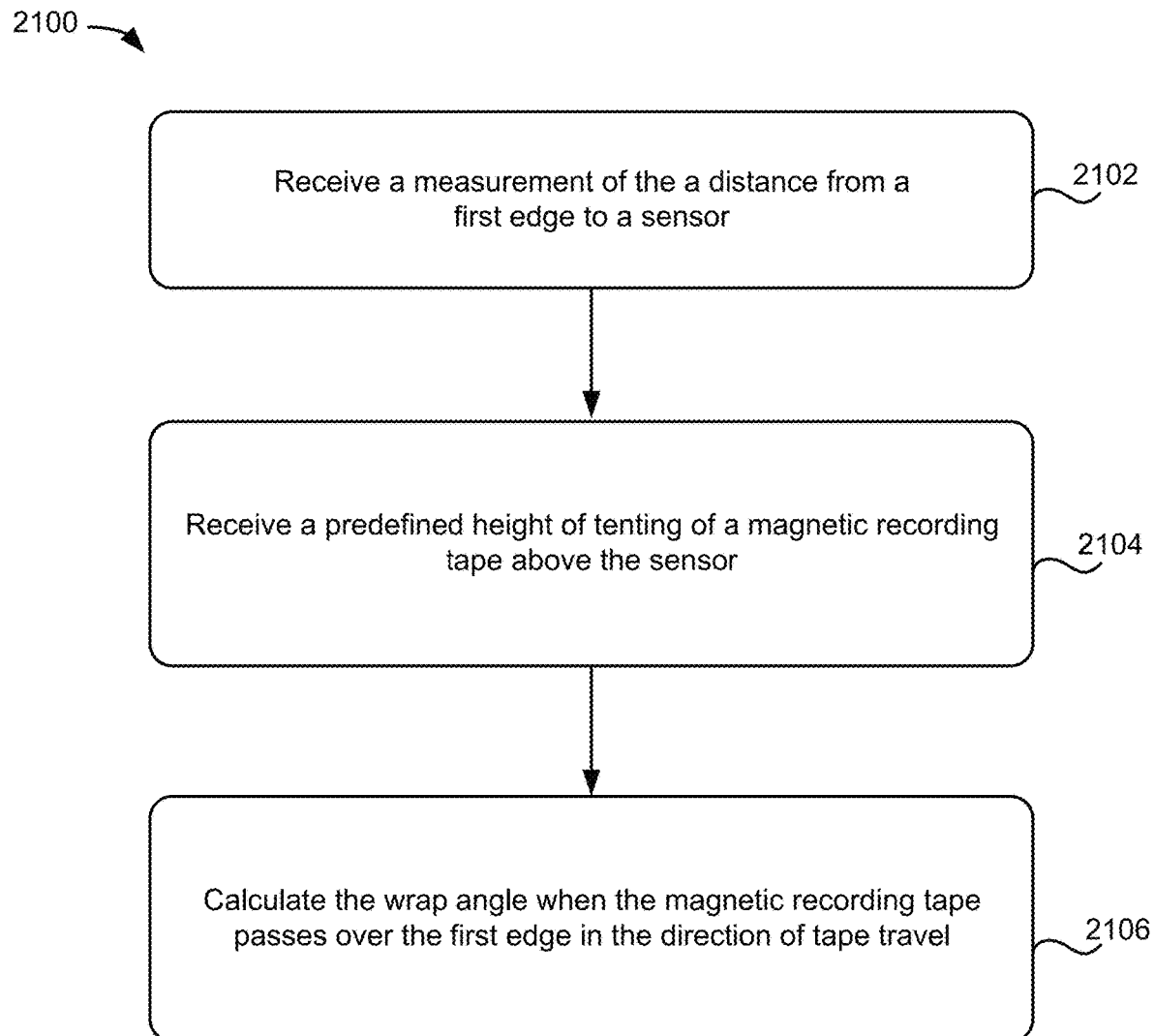
FIG. 21 is a flow chart of a method according to one embodiment.

Now referring to FIG. 21, a flowchart of a method 2100 is shown according to one embodiment. The method 2100 may be performed in accordance with the present invention in any of the environments depicted in the other figures, in various embodiments. Of course, more or less operations than those specifically described in FIG. 21 may be included in method 2100, as would be understood by one of skill in the art upon reading the present descriptions.

Each of the steps of the method 2100 may be performed by any suitable component of the operating environment. For example, in various embodiments, the method 2100 may be partially or entirely performed by a controller, a processor, a tape drive, or some other device having one or more processors therein. The processor, e.g., processing circuit(s), chip(s), and/or module(s) implemented in hardware and/or software, and preferably having at least one hardware component, may be utilized in any device to perform one or more steps of the method 2100. Illustrative processors include, but are not limited to, a CPU, an ASIC, a FPGA, etc., combinations thereof, or any other suitable computing device known in the art.

As shown in FIG. 21, method 2100 may initiate with operation 2102 where the processor receives a measurement of the distance from a first edge to a sensor structure. The distance may be measured optically, such as using autocollimators and/or laser focusing. In other approaches, the distance may be measured mechanically.

Method 2100 may proceed with operation 2104 in which the processor receives a predefined height of tenting of a magnetic recording tape above the sensor structure.

Method 2100 includes operation 2106 where the processor calculates the wrap angle when the magnetic recording tape moves over the module.

In some embodiments of method 2100, a module of a tape head may be adjusted in a vertical direction to create the calculated wrap angle when the magnetic recording tape moves over the module.

In other embodiments of method 2100, a guide may be set to create the calculated wrap angle of the magnetic recording tape.

Write Transducers with High Moment Layer

Various embodiments described herein address issues conventionally associated with implementing multichannel tape heads for writing to high coercivity media in the attempt to increase the achievable areal density thereof. Some of the embodiments herein implement a thin film layer of a high moment material, e.g., as will be described in further detail below. This may allow for improved writing to a high coercivity tape media while maintaining sharper transitions on the tape media than conventionally achievable.

An apparatus according to one embodiment includes an array of write transducers, e.g., on the same module or on a different module as the tunnel valve read transducers noted elsewhere herein, e.g., in the section entitled "Recessed TMR Sensors," above. Each write transducer includes a first write pole having a pole tip extending from a media facing side of the first write pole, a second write pole having a pole tip extending from a media facing side of the second write pole, a nonmagnetic write gap between the pole tips of the write poles, and a high moment layer between the write gap and the pole tip of the second write pole. The high moment layer has a higher magnetic moment than a magnetic moment of the pole tip of the second write pole.

Additional features that may be included in various aspects of the foregoing embodiment are described in this section and the section entitled "Write Transducers with Beaked High Moment Layer," below. For example, the second write pole may be comprised of a yoke portion and the pole tip, where the high moment layer does not extend along the yoke portion. In another approach, for at least one of the write transducers, the pole tip of the first write pole has a pedestal extending toward the write gap, where a width of a trimmed portion of the pedestal extends in a cross-track direction for a distance about equal to a width of the pole tip of the second write pole measured in the same direction. In various approaches, the high moment layer extends to the plane extending along the tape bearing surface; and in other approaches, the high moment layer extends beyond the plane in a beaked configuration. A second high moment layer may be located between the write gap and the pedestal of the pole tip of the first write pole, the second high moment layer having a higher magnetic moment than a magnetic moment of the pole tip of the first write pole. In some approaches, a media facing side of the pole tip of the second write pole is recessed from the plane extending along the tape bearing surface by a distance in a range of 5 nm to about 25 nm, preferably between 5 nm and about 15 nm. In other approaches, the pole tip of the second write pole is not recessed.

Figure 22A:
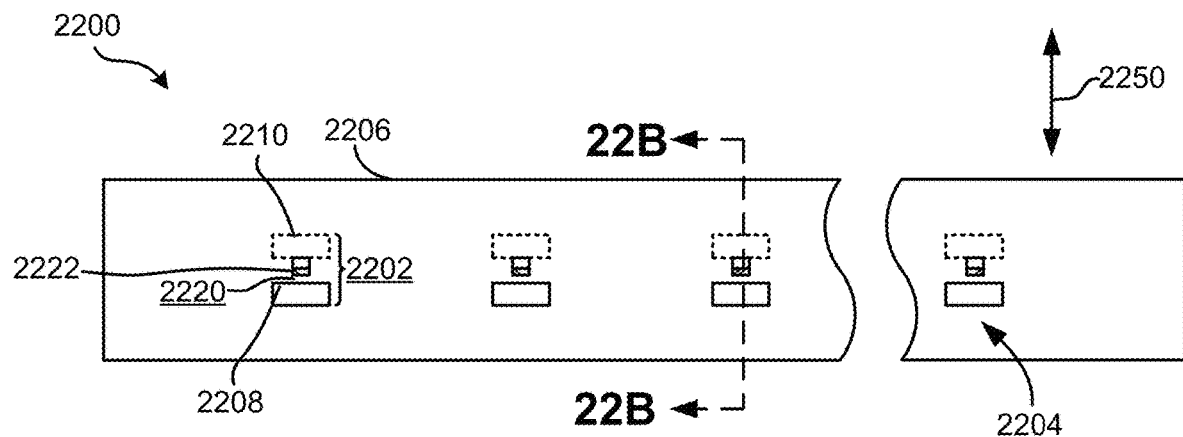
FIG. 22A is a media facing side view of a write transducer array according to one embodiment.
Figure 22B:
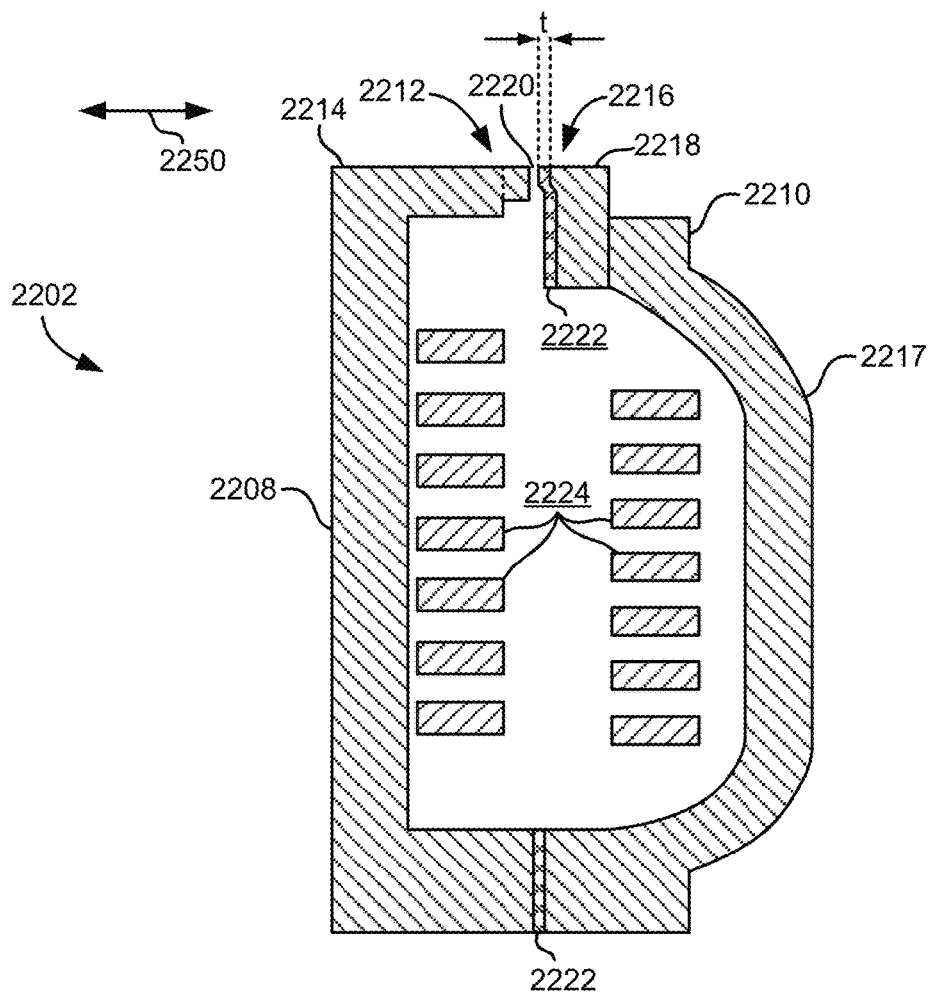
FIG. 22B is a partial cross-sectional view of a write transducer of FIG. 22A taken along line 22B-22B of FIG. 22A.

Looking to FIGS. 22A-22B, an apparatus 2200 is depicted in accordance with one embodiment. As an option, the present apparatus 2200 may be implemented in conjunction with features from any other embodiment listed herein, such as those described with reference to the other FIGS., such as FIG. 1A-18B. However, such apparatus 2200 and others presented herein may be used in various applications and/or in permutations which may or may not be specifically described in the illustrative embodiments listed herein. Further, the apparatus 2200 presented herein may be used in any desired environment. Thus FIGS. 22A-22B (and the other FIGS.) may be deemed to include any possible permutation. It should also be noted that unless otherwise specified, the various layers in this and other embodiments may be formed using conventional processes and/or materials, preferably having high magnetic permeability and low corrosion susceptibility.

As shown in FIG. 22A, apparatus 2200 includes a plurality of write transducers 2202 positioned in an array 2204 on a module 2206. The number of write transducers 2202 included in the array 2204 may vary depending on the desired approach. For instance, the array 2204 may include 16 write transducers 2202 in some approaches, while in other approaches, the array 2204 may include 32, 64, or more write transducers 2202. Furthermore, it should be noted that although only write transducers 2202 are included on module 2206 in the present embodiment, other types of transducers may be included on the same module as the write transducers in other embodiments, e.g., see servo readers 212 and readers 216 of FIGS. 2C-2D.

Referring still to FIGS. 22A-22B, each of the write transducers 2202 includes a first (e.g., lower) write pole 2208 and a second (e.g., upper) write pole 2210. According to the present description, "lower" and "upper" may refer to a position of each of the write poles with respect to each other along a deposition direction of the write transducer 2202, which is parallel to the intended direction of tape travel 2250. As alluded to above, the deposition direction may typically be oriented such that the first write pole 2208 is a lower write pole while the second write pole 2210 is an upper write pole formed above the first write pole 2208 for each of the write transducers 2202 in the array 2204. However, in other approaches the second write pole 2210 may be a lower write pole while the first write pole 2208 is an upper write pole formed above the second write pole 2210 for each of the write transducers 2202 in the array 2204.

Similarly, the intended direction of tape travel at a given point in time and/or the relative orientation of the first and second write poles 2208, 2210 may also determine which of the first and second write poles 2208, 2210 is the trailing pole. For instance, a drive mechanism (e.g., see FIG. 1A) may be configured to pass a magnetic recording tape over the first and second write poles 2208, 2210 in a direction such that each of the second write poles 2210 of the write transducers 2202 in the array 2204 are trailing write poles. Alternatively, a drive mechanism (e.g., see FIG. 1A) may be configured to pass a magnetic recording tape over the first and second write poles 2208, 2210 in a direction such that each of the first write poles 2208 of the write transducers 2202 in the array 2204 are trailing write poles. The write transducer 2202 may be used for unidirectional writing such that the first write pole 2208 is leading, and the second write pole 2210 is trailing. In this embodiment, a high moment layer 2222 is positioned proximate to the write gap 2220 on the second write pole 2210, thereby improving write performance for the write transducers 2202, e.g., which will be described in further detail below. It should also be noted that in some embodiments, one or more write transducers of an array may include a high moment layer that is coupled only to (e.g., formed on) the pole tip 2212 of the first write pole 2208, e.g., according to any of the approaches described herein.

Looking specifically to the partial cross-sectional view in FIG. 22B of one of the write transducers 2202 taken along line 22B-22B of FIG. 22A, the first write pole 2208 includes a pole tip 2212 which extends back from a media facing side 2214 of the first write pole 2208. Moreover, the second write pole 2210 also includes a respective pole tip 2216 which extends back from a media facing side 2218 of the second write pole 2210 toward a yoke portion 2217 thereof, the yoke portion 2217 including the curved portion of the second write pole 2210, as would be appreciated by one skilled in the art after reading the present description. Cross-sections of a write coil 2224 are also shown. It should be noted that although FIG. 22B only shows a partial cross-sectional view of one of the write transducers 2202, any of the layers, portions, components, etc., shown in FIG. 22B and/or the descriptions thereof may be incorporated in any one or more of the other write transducers 2202 included along the array 2204 in apparatus 2200.

A nonmagnetic write gap 2220 is additionally included between the pole tips 2212, 2216 of the first and second write poles 2208, 2210 respectively. In some approaches the write gap 2220 may be electrically conductive, e.g., rather than an electrically insulating write gap as typically implemented in conventional structures. It follows that the write gap 2220 may include a nonmagnetic metal in some approaches. As described below, a trimming process may be implemented to shape some of the write transducers included herein. By including an electrically conductive nonmagnetic metal write gap 2220, a more uniform trimming processes may be achieved for the various layers of the write transducer 2202, as would be appreciated by one skilled in the art after reading the present description. Moreover, implementing a nonmagnetic metal write gap 2220 may help minimize write gap erosion caused by the media being run thereover.

The high moment layer 2222 is positioned between the write gap 2220 and the pole tip 2216 of the second write pole 2210. According to preferred approaches, the high moment layer 2222 may be implemented as a thin film seed layer, as would be appreciated by one skilled in the art after reading the present description. Moreover, the high moment layer 2222 may be formed using any desired process, e.g., sputtering, ion-beam deposition, etc.

The high moment layer 2222 preferably includes a higher magnetic moment in the bulk material thereof than a magnetic moment of the pole tip 2216 of the second write pole 2210. The high moment layer 2222 preferably includes an alloy of iron and one or more of cobalt, nickel, aluminum and platinum. Exemplary high moment materials include cobalt-iron-nickel alloys; high concentration iron-nickel alloys, e.g., such as 78% iron-22% nickel; etc. However, in some approaches the high moment layer 2222 may include other metals therein. Accordingly, the high moment layer 2222 has a higher saturation magnetization than the remainder of the pole tip 2216, thereby allowing the high moment layer 2222 to focus flux emitted from and/or absorbed by the second write pole 2210 more effectively than conventional write poles. As mentioned above, in some embodiments, the write transducer 2202 is used for unidirectional writing such that the first write pole 2208 is leading, and the second write pole 2210 is trailing. As a result, flux may be delivered to the pole tip 2216 of the second write pole 2210 such that the flux is concentrated by the high moment material 2222 to emerge from the write transducer 2202 to write data to a magnetic recording tape by setting the magnetic transitions thereon. Moreover, the high moment material 2222 is able to focus a greater amount of flux than a conventional write pole before becoming saturated, thereby allowing the write transducer 2202 to more efficiently write data to magnetic media (e.g., magnetic tape) having a high coercivity while also achieving a fine granularity. Thus, implementing the high moment material 2222 as described in the present embodiment is able to improve the write performance of the write transducers 2202, as for example, when the second write pole 2210 is trailing.

The inventors were surprised to discover that the deposition thickness t of the high moment layer 2222 has an influence on the effectiveness of the second write pole 2210. More specifically, the inventors surprisingly discovered that as the deposition thickness t of the high moment layer 2222 increased beyond a certain thickness, it became less effective in focusing flux and thereby did not improve the performance of the second write pole 2210. In view of the inventors' surprising discovery, it is preferred that the deposition thickness t of the high moment layer 2222 is in a range of about 50 nm to about 400 nm, more preferably in a range of about 50 nm to about 200 nm. Again, as the deposition thickness t of the high moment layer 2222 increased above the upper bounds of these ranges, the effectiveness of the high moment layer 2222 is reduced, thereby resulting in no improvement in performance of the apparatus 2200 as a whole. It follows that the inventors also discovered that a high moment layer 2222 having a deposition thickness t in the above ranges is able to focus flux emitted from and/or absorbed by the second write pole 2210 even more effectively than a write pole having a pole tip that is fully constructed from a high moment material. Without wishing to be bound by any particular theory, the reduction in the effectiveness of the high moment layer 2222 corresponding to an increase in the deposition thickness thereof may be at least partially attributed to the lower magnetic permeability of the high moment material of the high moment layer 2222, e.g., compared to the magnetic permeability of typical write pole material such as 45/55 NiFe.

With continued reference to FIG. 22B, the placement of the high moment layer 2222 along the second write pole 2210 also influences the effectiveness of the second write pole 2210. As shown in FIG. 10B, the high moment layer 2222 does not extend along the yoke portion 2217. Attempts were made to line the yoke portion 2217 in addition to the pole tip 2216 with the high moment layer 2222, but such embodiments surprisingly did not work as well as those having a high moment layer 2222 extending solely along the pole tip 2216, e.g., as shown in FIG. 22B. While not wishing to be bound by any particular theory, it is believed that it is more difficult to preserve the magnetic properties of high moment materials when forming one or more of the high moment materials on a sloped surface, for example having a slope angle of greater than 3 degrees. Thus, the high moment layer 2222 is preferably not included along the curved yoke portion 2217. However, it should be noted that high moment material may be implemented differently than as shown in the present embodiment, as will soon become apparent.

Figure 23A:
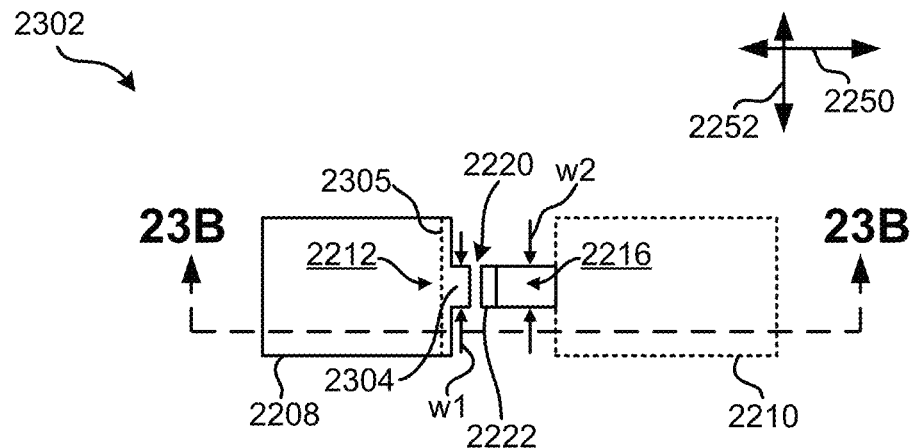
FIG. 23A is a media facing side view of a write transducer according to one embodiment.
Figure 23B:
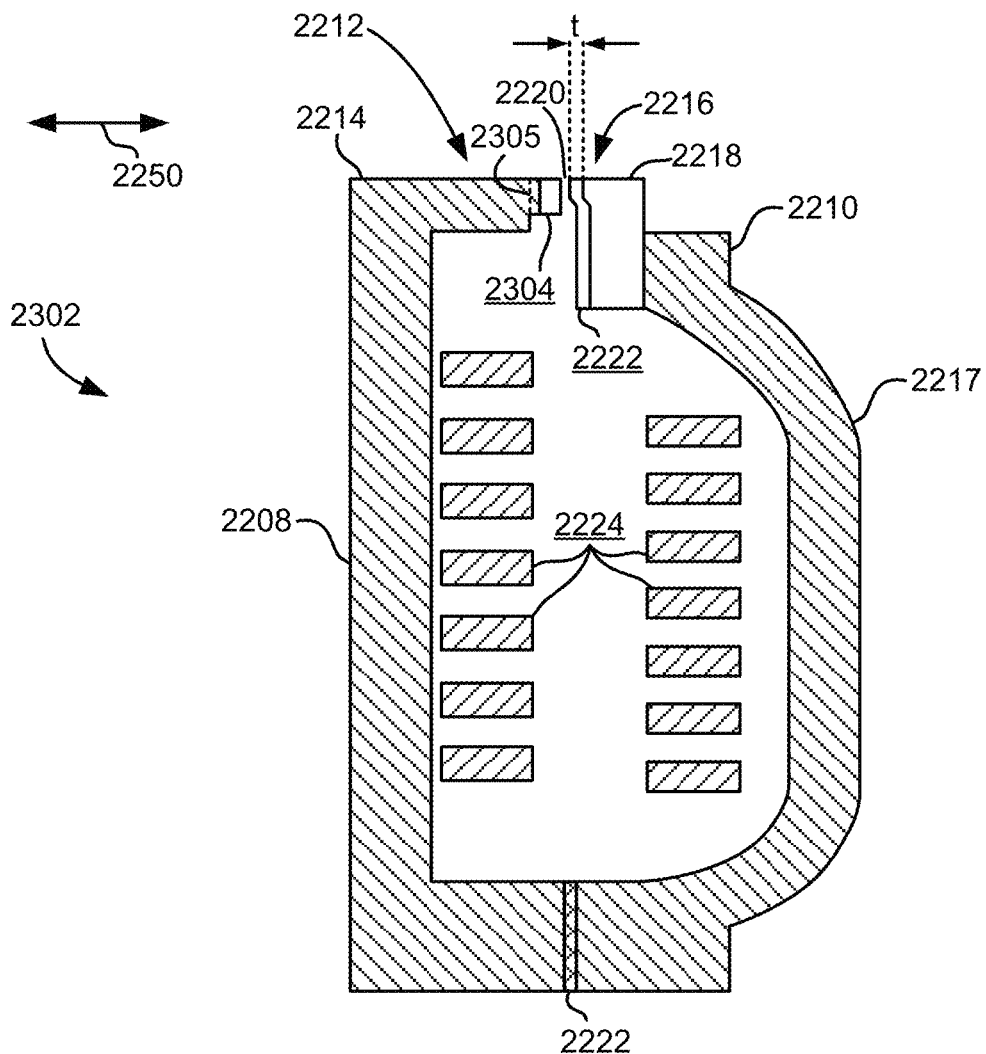
FIG. 23B is a partial cross-sectional view of the write transducer in FIG. 23A taken along line 23B-23B of FIG. 23A.

Looking to FIGS. 23A-23B, a write transducer 2302 is depicted in accordance with one embodiment. As an option, the present write transducer 2302 may be implemented in conjunction with features from any other embodiment listed herein, such as those described with reference to the other FIGS., such as FIG. 1A-22B. Specifically, FIGS. 23A-23B illustrate variations of the embodiment of FIGS. 22A-22B depicting several exemplary configurations within a write transducer 2302. Accordingly, various components of FIGS. 23A-23B have common numbering with those of FIGS. 22A-22B.

Note that such write transducer 2302 and others presented herein may be used in various applications and/or in permutations which may or may not be specifically described in the illustrative embodiments listed herein. Further, the write transducer 2302 presented herein may be used in any desired environment. Thus FIGS. 23A-23B (and the other FIGS.) may be deemed to include any possible permutation. It should also be noted that unless otherwise specified, the various layers in this and other embodiments may be formed using conventional processes and/or materials, preferably having high magnetic permeability and low corrosion susceptibility.

As shown in FIGS. 23A-23B, the pole tip 2212 of the first write pole 2208 includes a pedestal 2304 that extends from the dashed line 2305 toward the write gap. During fabrication of the write transducer 2302 (e.g., at the wafer level), the surface of the pedestal 2304 facing the write gap 2220 may be trimmed using any desired process, such as etching, milling (e.g., ion milling), etc. to form a trimmed portion having lateral edges. Accordingly, the trimmed portion of the pedestal 2304, positioned at the distal end of the pedestal 2304, may have a smaller width w1 relative to the width of the first write pole 2208 and any untrimmed portion of the pedestal 2304. By trimming the pedestal 2304 of the first write pole 2208, the fringing field created by the write transducer 2302 may be controlled (e.g., reduced), thereby desirably reducing the extent of erase bands.

As shown in the present embodiment, a width w1 of the pedestal 2304 may extend in a cross-track direction 2252 (which is perpendicular to the intended direction of tape travel 2250) for a distance which is about equal to a width w2 of the pole tip 2216 of the second write pole 2210 measured in the cross-track direction 2252. However, the width w1 of the trimmed portion of the pedestal 2304 may vary depending on the type and/or duration of the trimming process implemented to form the trimmed portion of the pedestal 2304, e.g., depending on the desired embodiment.

As mentioned above, more than one write transducer 2302 may be implemented in an array on a module, e.g., as shown in FIGS. 2C-2D and/or FIG. 22A. The number of write transducers 2302 included in the array may vary depending on the desired approach. For instance, the array may include 16 of the write transducers 2302 in some approaches, while in other approaches, the array may include 32, 33 or more of the write transducers 2302. Furthermore, it should be noted that other types of transducers may be included on the same module as the write transducer 2302 in other embodiments, e.g., see servo readers 212 and readers 216 of FIGS. 2C-2D.

Referring again to FIGS. 23A-23B, as described above, write transducer 2302 may be used for unidirectional writing, particularly where the high moment layer 2222 is only positioned on one side of the write gap 2220. Again, in this embodiment, the intended direction of tape travel may be directed such that the second write pole 2210 and high moment layer 2222 are trailing compared to the first write pole 2208, which is leading. However, some embodiments may include a second high moment layer on an opposite side of the write gap 2220 as high moment layer 2222 thereby enabling bi-directional recording, as will soon become apparent.

Looking to FIGS. 24A-24H, several write transducers 2402, 2422, 2442, 2462 are depicted in accordance with several embodiments. As an option, any one of the write transducers 2402, 2422, 2442, 2462 may be implemented in conjunction with features from any other embodiment listed herein, such as those described with reference to the other FIGS., such as FIG. 1A-22B. Specifically, FIGS. 24A-24H illustrate variations of the embodiment of FIGS. 22A-22B depicting several exemplary configurations within several write transducers 2402, 2422, 2442, 2462. Accordingly, various components of FIGS. 24A-24H have common numbering with those of FIGS. 22A-22B.

However, such write transducers 2402, 2422, 2442, 2462 and others presented herein may be used in various applications and/or in permutations which may or may not be specifically described in the illustrative embodiments listed herein. Further, the write transducers 2402, 2422, 2442, 2462 presented herein may be used in any desired environment. Thus FIGS. 24A-24H (and the other FIGS.) may be deemed to include any possible permutation. It should also be noted that unless otherwise specified, the various layers in these and other embodiments may be formed using conventional processes and/or materials, preferably having high magnetic permeability and low corrosion susceptibility.

Figure 24A:
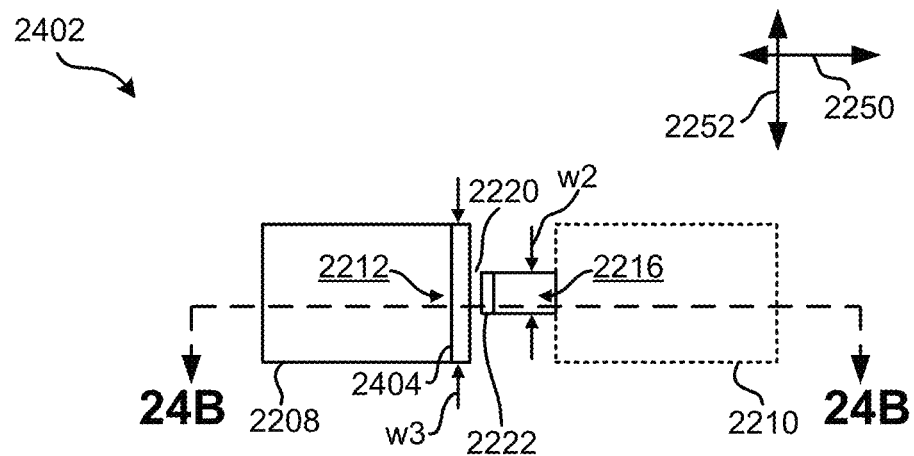
FIG. 24A is a media facing side view of a write transducer according to one embodiment.
Figure 24B:
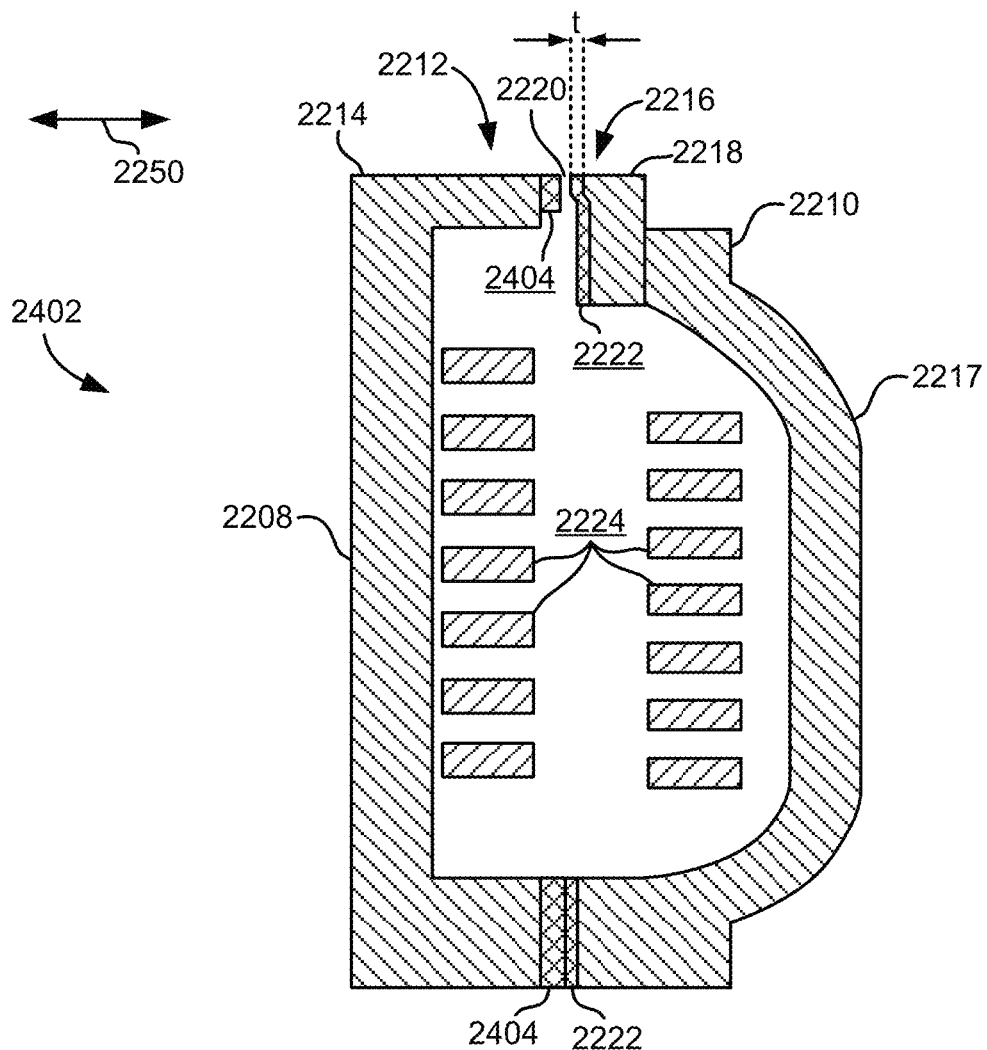
FIG. 24B is a partial cross-sectional view of the write transducer in FIG. 24A taken along line 24B-24B of FIG. 24A.

As shown in FIGS. 24A-24B, in addition to high moment layer 2222, a second high moment layer 2404 is included between the write gap 2220 and the pole tip 2212 of the first write pole 2208. According to preferred approaches, the second high moment layer 2404 may be implemented as a thin film layer, and may be formed using any desired process, e.g., plating, sputtering, ion-beam deposition, etc.

According to the present embodiment, a width w3 of the second high moment layer 2404 extends along the pole tip 2212 of the first write pole 2208 in a cross-track direction 2252 for a distance greater than a width w2 of the pole tip 2216 of the second write pole 2210 measured in the same cross-track direction 2252. In some approaches, the second high moment layer 2404 may be deposited (e.g., full film) on a write gap-facing surface of the pole tip 2212 of the first write pole 2208. It follows that the width w3 of the second high moment layer 2404 may extend about as wide as the pole tip 2212 of the first write pole 2208.

Although the high moment layer 2222 and the second high moment layer 2404 may not have equal (the same) deposition thicknesses, e.g., resulting from being formed by different processes, the inventors made a surprising discovery that the deposition thickness of a high moment layer (e.g., 2222, 2404) has an influence on the effectiveness of the respective write pole. More specifically, the inventors surprisingly discovered that as the deposition thickness of a high moment layer increased beyond a certain thickness, it became less effective in focusing flux and thereby does not improve the performance of the respective write pole. Thus, a deposition thickness of the high moment layer 2222 and/or the second high moment layer 2404 is preferably in a range of about 50 nm to about 400 nm, more preferably in a range of about 75 nm to about 200 nm. However, in some approaches the second high moment layer 2404 may have a thickness that is thicker than the above ranges due to limitations of the formation process (e.g., plating) of the second high moment layer 2404. Although the thickness of the second high moment layer 2404 may be greater than the preferred ranges, improvements to the one or more write transducers and the module on which they are positioned may be achieved by simply including the second high moment layer 2404 to produce a symmetrical write gap.

The second high moment layer 2404 preferably has a higher magnetic moment in the bulk material thereof than a magnetic moment of the pole tip 2212 of the first write pole 2208. The second high moment layer 2404 may include one or more of the same materials as high moment layer 2222, but may have a different composition in some approaches. It follows that the second high moment layer 2404 preferably includes an alloy of iron and one or more of cobalt, nickel, aluminum and platinum. However, in some approaches the second high moment layer 2404 may include other metals therein. Accordingly, the second high moment layer 2404 has a higher saturation magnetization than the remainder of the pole tip 2212, thereby allowing the second high moment layer 2404 to focus flux emitted from and/or absorbed by the first write pole 2208 more effectively than conventional write poles.

By implementing the second high moment layer 2404, the write transducer 2402 no longer has an asymmetrical write gap, e.g., as seen in FIGS. 22A-23B. Rather, a high moment layer is positioned on either side of the write gap 2220, thereby achieving improved write performance regardless of which one of the first or second write poles 2208, 2210 are trailing, as dependent upon the given direction of tape travel. As a result, flux may be delivered to either pole tip 2212, 2216 of the write poles 2208, 2210 where the flux is concentrated by the respective high moment material 2222, 2404 to emerge from the write transducer 2402 to write data to a magnetic recording tape. Moreover, the high moment materials 2222, 2404 are each able to focus a greater amount of flux than a conventional write pole before becoming saturated, thereby allowing the write transducer 2402 to efficiently write data to magnetic recording tape having a high coercivity while also achieving a fine granularity. Moreover, the symmetrical write gap 2220 allows for the aforementioned improvements to be achieved for either intended direction of tape travel 2250.

Figure 24C:
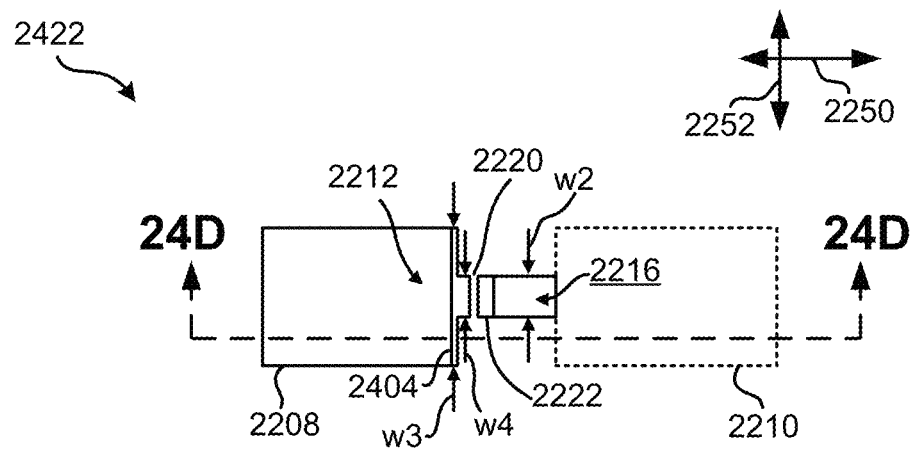
FIG. 24C is a media facing side view of a write transducer according to one embodiment.
Figure 24D:
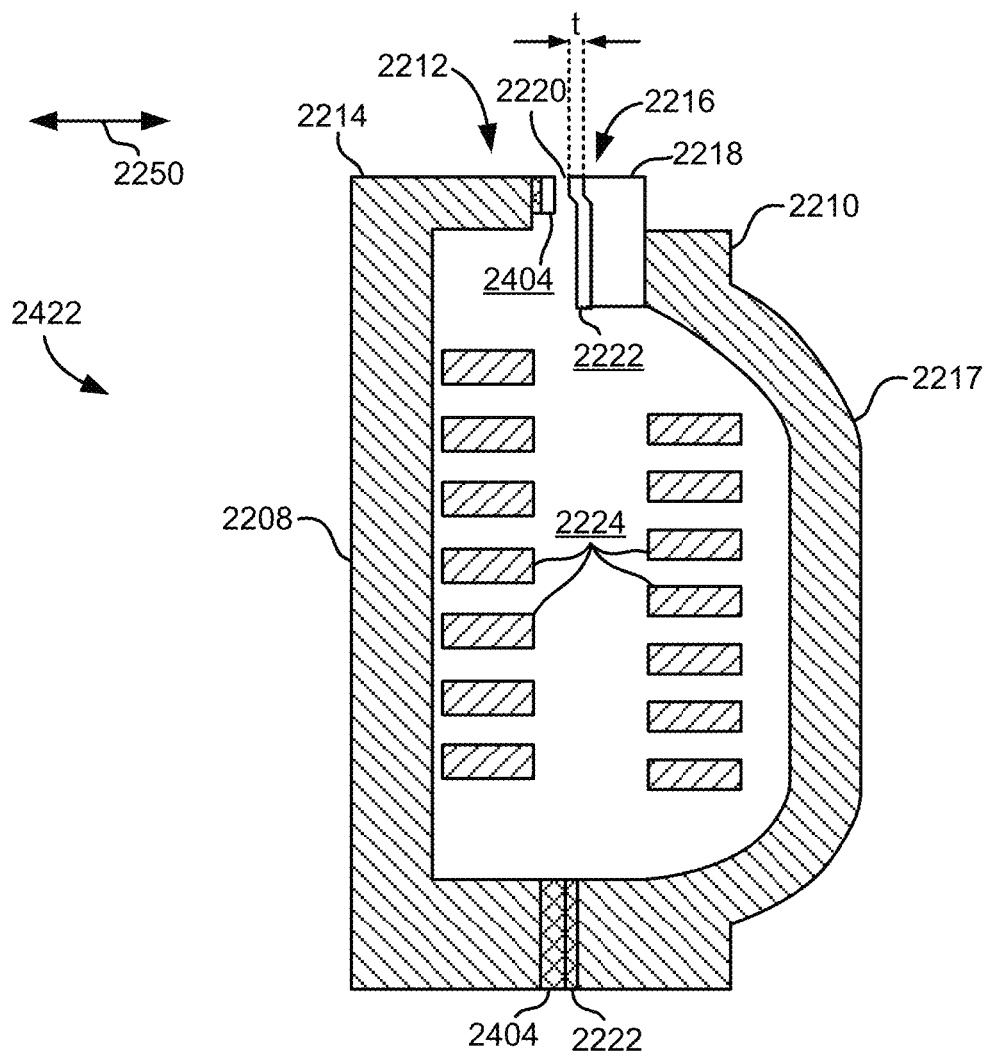
FIG. 24D is a partial cross-sectional view of the write transducer in FIG. 24C taken along line 24D-24D of FIG. 24C.

In some approaches, the write transducer configuration illustrated in FIGS. 24A-24B may be processed by trimming a write gap-facing side of the second high moment layer 2404, thereby resulting in the write transducer configuration illustrated in FIGS. 24C-24D. As shown, the second high moment layer 2404 has a trimmed portion that extends toward the write gap 2220. The trimming performed on the second high moment layer 2404 may be performed during fabrication of the write transducer 2402, by etching, milling (e.g., ion milling), etc., the surface of the first write pole 2208 facing the write gap 2220. As mentioned above, by trimming the second high moment layer 2404 to form the trimmed portion of the second high moment layer 2404, the fringing field created by the write transducer 2402 may be controlled (e.g., reduced), thereby desirably reducing the extent of erase bands. The inventors found that the fringing field is smaller and symmetrical when both pole tips contain the same material.

The width w3 of the second high moment layer 2404 at the widest portion thereof may still extend along the pole tip 2212 of the first write pole 2208 in a cross-track direction 2252 for a distance greater than a width w2 of the pole tip 2216 of the second write pole 2210 measured in the same direction. However, a width w4 of the trimmed portion of the second high moment layer 2404 may extend in a cross-track direction 2252 for a distance which is about equal to a width w2 of the pole tip 2216 of the second write pole 2210. In other approaches, the width w4 and/or w3 of either portion of the second high moment layer 2404 may vary depending on the type and/or duration of the trimming process implemented to form the trimmed portion of the second high moment layer 2404, e.g., depending on the desired embodiment.

It should be noted that the configuration illustrated in FIGS. 24C-24D may be formed by implementing different processes. For example, the non-trimmed portion of the second high moment layer 2404 (having the wider width w3) may be deposited across the entire pole 2208, while the trimmed portion of the second high moment layer 2404 (having the narrower width w4) may be formed by masking and depositing (e.g., sputtering).

Although the high moment layer 2222 and the second high moment layer 2404 may not have equal (the same) deposition thicknesses, it is preferred that the respective thicknesses thereof are in a range of about 50 nm to about 400 nm, more preferably in a range of about 75 nm to about 200 nm, e.g., in view of the surprising results discovered by the inventors as described above. Looking to the side of the write transducer 2402 opposite a media facing surface 2214 thereof, a portion of the second high moment layer 2404 may be thinner than a deposition thickness of the portion of the second high moment layer 2404 adjacent the media facing surface 2214 of the write transducer 2402. Accordingly, the portion of the second high moment layer 2404 adjacent the side of the write transducer 2402 opposite the media facing surface 2214 may be in a range of about 50 nm to about 400 nm, more preferably in a range of about 75 nm to about 200 nm, but may be higher or lower depending on the desired embodiment.

Figure 24E:
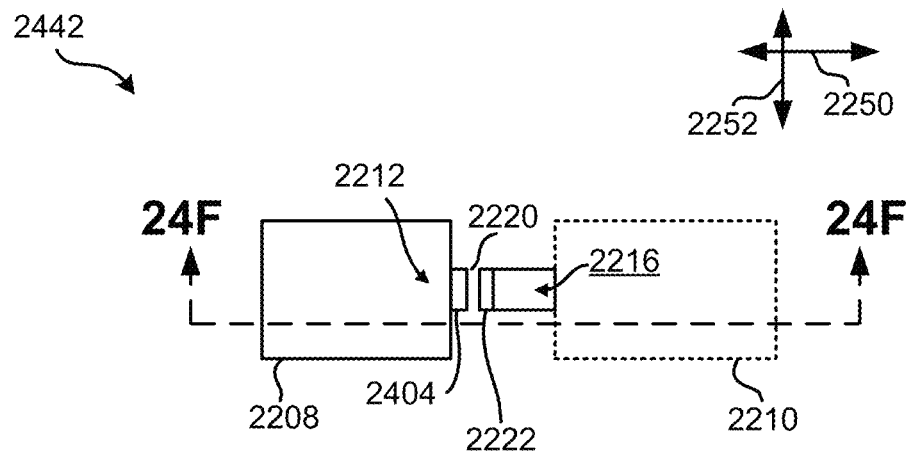
FIG. 24E is a media facing side view of a write transducer according to one embodiment.
Figure 24F:
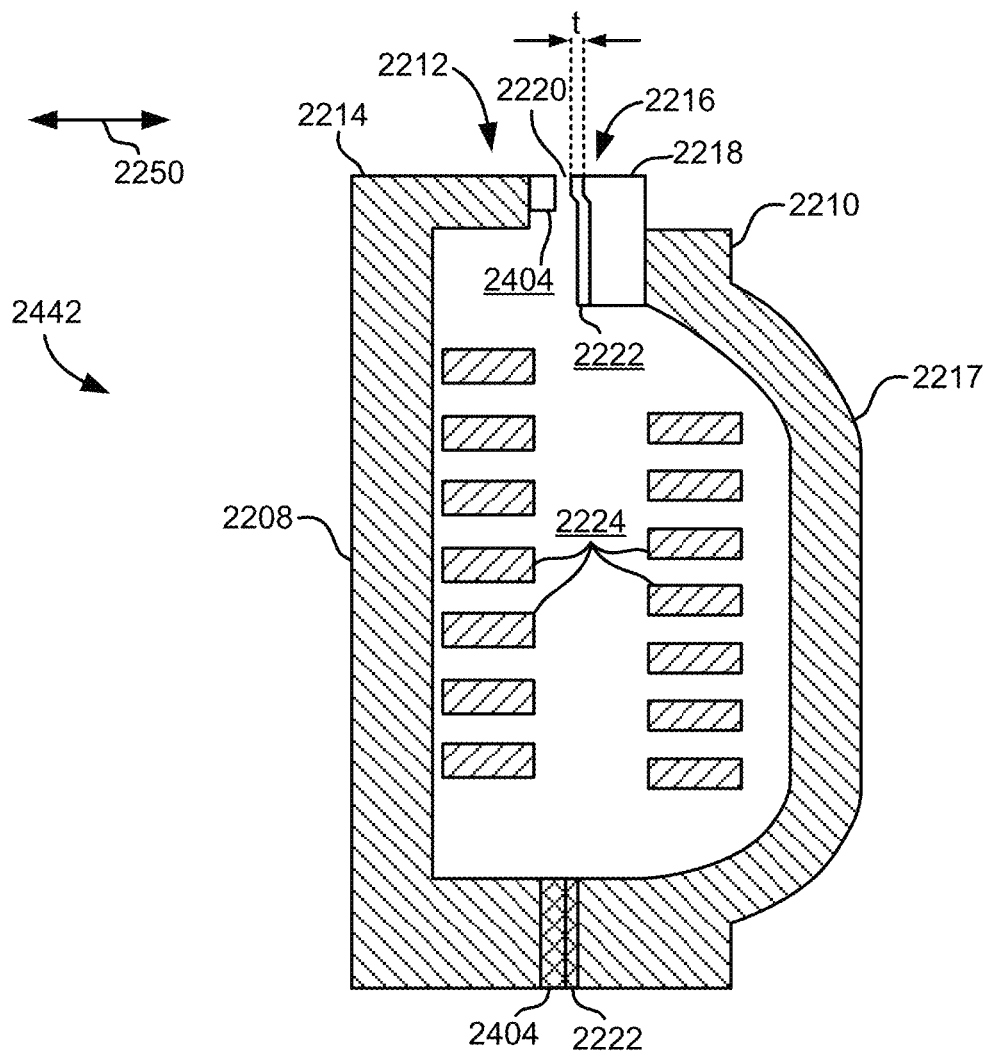
FIG. 24F is a partial cross-sectional view of the write transducer in FIG. 24E taken along line 24F-24F of FIG. 24E.

In some approaches, the write transducer configuration illustrated in FIGS. 24C-24D may be processed by etching, milling (e.g., ion milling), etc., the non-trimmed portion of the second high moment layer 2404 (having the wider width w3), thereby resulting in the write transducer configuration illustrated in the write transducer 2442 of FIGS. 24E-24F.

As shown in FIGS. 24E-24F, the second high moment layer 2404 of write transducer 2442 has been processed (e.g., etched) such that only the trimmed portion thereof remains. In other words, the second high moment layer 2404 may be processed such that portions of the second high moment layer 2404 no longer remain along the write gap-facing surface of the pole tip 2212 of the first write pole 2208. The portion of the second high moment layer 2404 that still remains may extend along the pole tip 2212 of the first write pole 2208 for a distance that is about equal to the width of the pole tip 2216 of the second write pole 2210 measured in the same direction. It follows that the second high moment layer 2404 may be processed in some approaches without affecting the width of the trimmed portion thereof.

Figure 24G:
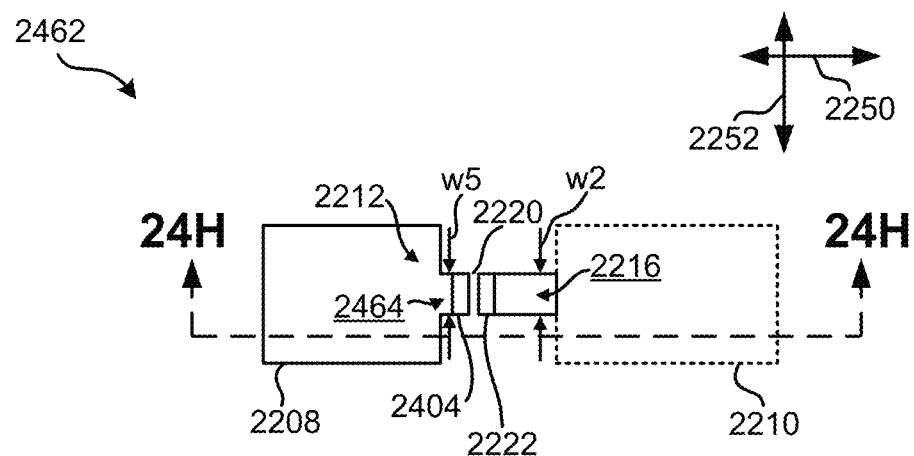
FIG. 24G is a media facing side view of a write transducer according to one embodiment.
Figure 24H:
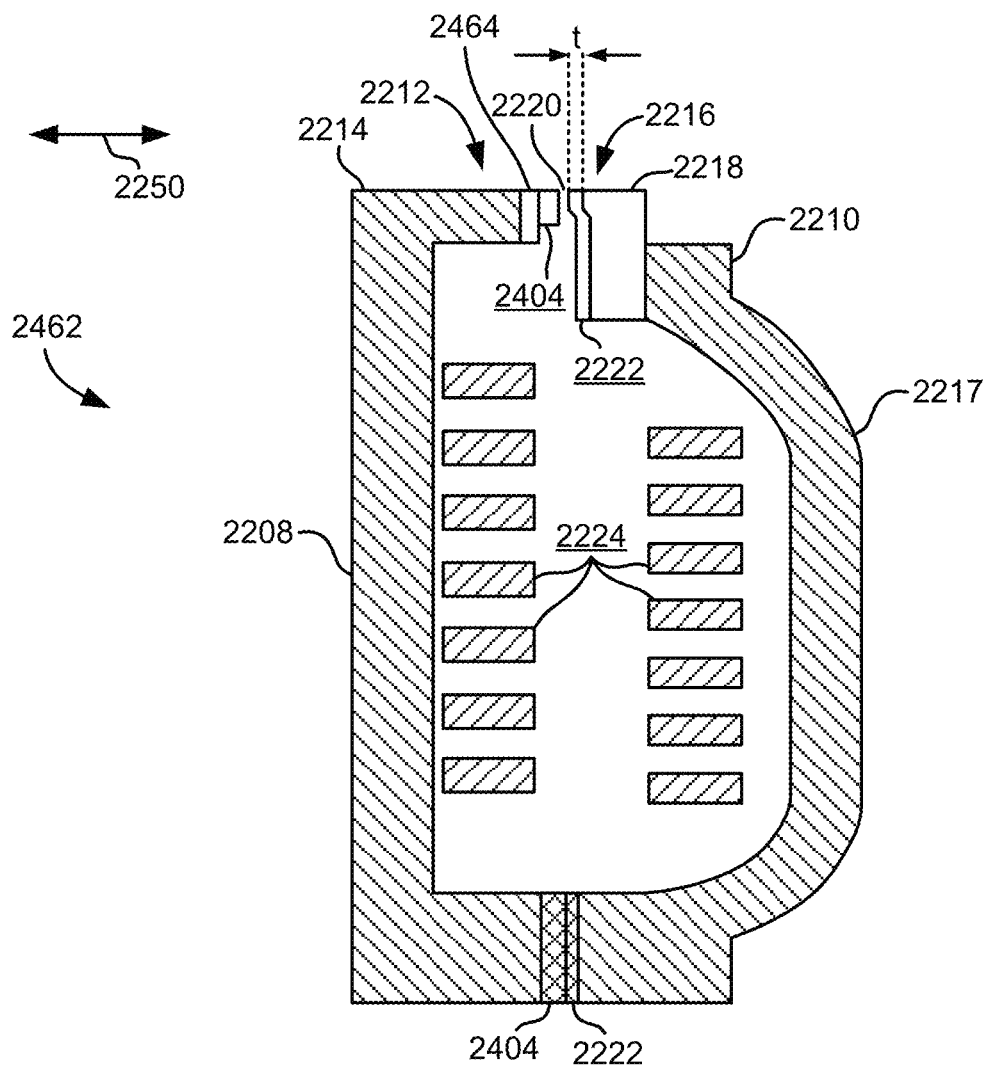
FIG. 24H is a partial cross-sectional view of the write transducer in FIG. 24G taken along line 24H-24H of FIG. 24G.

In still other approaches, the write transducer configuration illustrated in FIGS. 24E-24F may be processed by etching, milling (e.g., ion milling), etc., the non-trimmed portion of the first write pole 2208, thereby resulting in the write transducer configuration illustrated in the write transducer 2462 of FIGS. 24G-24H.

As shown in FIGS. 24G-24H, the processing (e.g., trimming) is preferably performed on the write gap-facing surface of the first write pole 2208. The trimming of the pole tip 2212 of the first pole 2208 may create a portion 2464 that extends from the first pole 2208 toward the write gap 2220. A width w5 of the portion extends in a cross-track direction 2252 for a distance about equal to a width w2 of the pole tip 2216 of the second write pole 2210 measured in the same cross-track direction 2252.

In preferred approaches, the second high moment layer 2404 may still extend along the pole tip 2212 of the first write pole 2208 for a distance that is about equal to the width w2 of the pole tip 2216 of the second write pole 2210, as well as width w5, measured in the same cross-track direction 2252.

It follows that various embodiments included herein are able to improve performance when writing to high coercivity media. The inventors were able to achieve surprising results by implementing thin film layers of high moment materials as described in the different configurations above, thereby increasing the achievable areal density of magnetic tape beyond what was conventionally possible. This improvement is realized particularly when writing to magnetic media having high coercivity, e.g., such as BaFe media having perpendicular magnetic orientation. Thus, various embodiments included herein are able to achieve improved writing to high coercivity tape media while maintaining sharper transitions on the tape media than conventionally achievable.

Figure 25A:
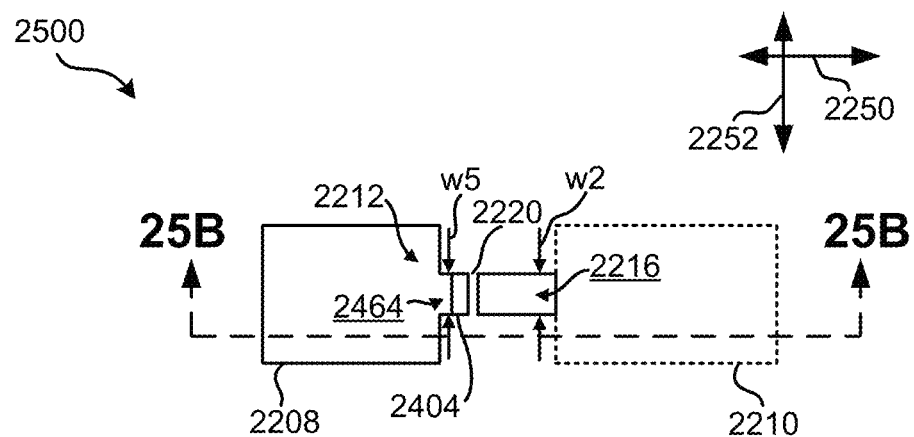
FIG. 25A is a media facing side view of a write transducer according to one embodiment.
Figure 25B:
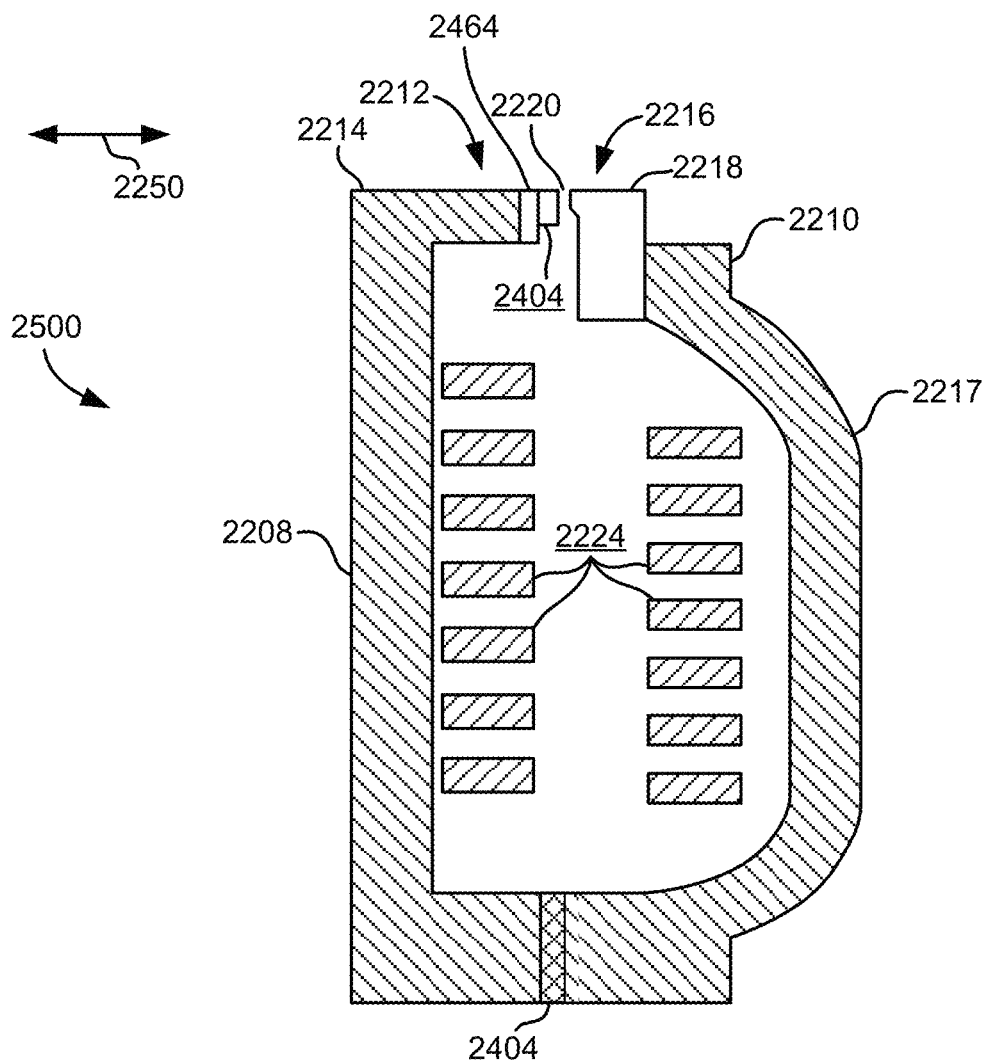
FIG. 25B is a partial cross-sectional view of the write transducer in FIG. 25A taken along line 25B-25B of FIG. 25A.

FIGS. 25A-25B depict an apparatus 2500 is depicted in accordance with one embodiment. As an option, the present apparatus 2500 may be implemented in conjunction with features from any other embodiment listed herein, such as those described with reference to the other FIGS., such as FIG. 1A-18B. However, such apparatus 2500 and others presented herein may be used in various applications and/or in permutations which may or may not be specifically described in the illustrative embodiments listed herein. Further, the apparatus 2500 presented herein may be used in any desired environment. Thus FIGS. 25A-25B (and the other FIGS.) may be deemed to include any possible permutation. It should also be noted that unless otherwise specified, the various layers in this and other embodiments may be formed using conventional processes and/or materials, preferably having high magnetic permeability and low corrosion susceptibility.

Apparatus 2500 is similar to write transducer 2462 of FIG. 24H, and accordingly has common numbering therewith. Apparatus 2500 includes a high moment layer 2404 between the write gap 2220 and the pole tip 2212 of the first write pole 2208. However, a high moment layer is not present between the write gap 2220 and the pole tip 2216 of the second write pole 2210.

Write Transducers with Beaked High Moment Layer

In various embodiments, one or more of the write transducers may have a high moment layer or layers that extend(s) beyond the plane of the media facing side of the associated pole tip write transducer, e.g., where the associated pole tip is prerecessed. This configuration is referred to herein in a beaked configuration.

Figure 26A:
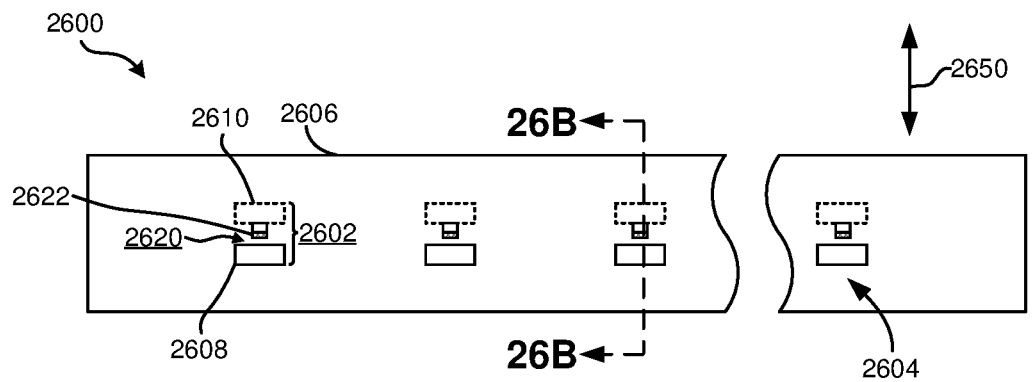
FIG. 26A is a media facing side view of a write transducer array according to one embodiment.
Figure 26B:
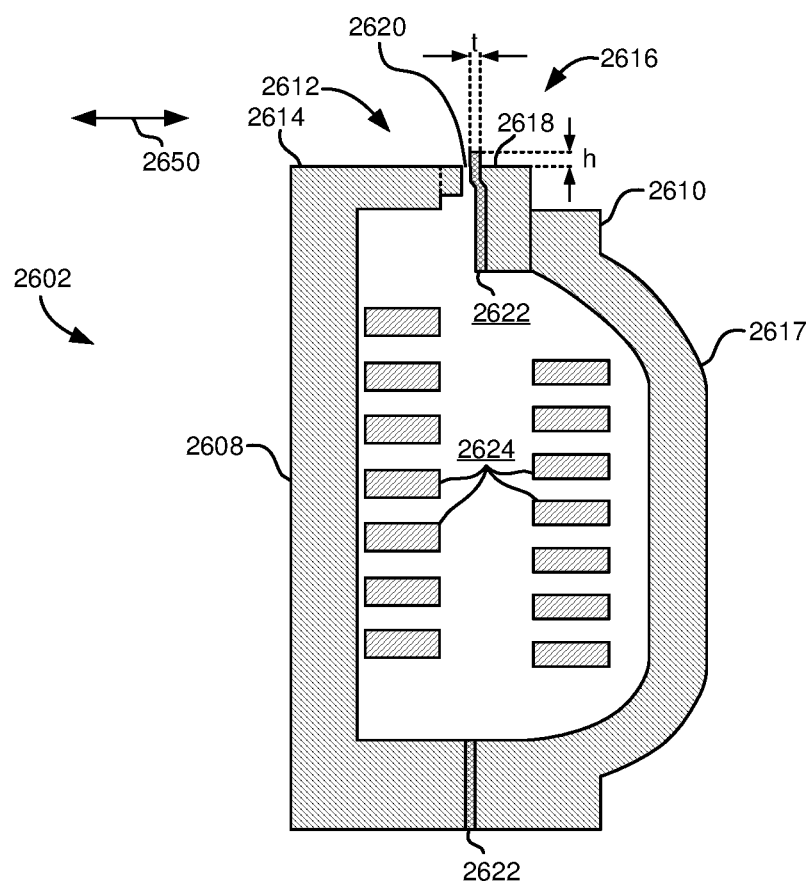
FIG. 26B is a partial cross-sectional view of a write transducer of FIG. 26A taken along line 26B-26B of FIG. 26A.

Looking to FIGS. 26A-26B, an apparatus 2600 is depicted in accordance with one embodiment. As an option, the present apparatus 2600 may be implemented in conjunction with features from any other embodiment listed herein, such as those described with reference to the other FIGS., such as FIG. 1A-18B. However, such apparatus 2600 and others presented herein may be used in various applications and/or in permutations which may or may not be specifically described in the illustrative embodiments listed herein. Further, the apparatus 2600 presented herein may be used in any desired environment. Thus FIGS. 26A-26B (and the other FIGS.) may be deemed to include any possible permutation. It should also be noted that unless otherwise specified, the various layers in this and other embodiments may be formed using conventional processes and/or materials, preferably having high magnetic permeability and low corrosion susceptibility.

As shown in FIG. 26A, apparatus 2600 includes a plurality of write transducers 2602 positioned in an array 2604 on a module 2606. The number of write transducers 2602 included in the array 2604 may vary depending on the desired approach. For instance, the array 2604 may include 16 write transducers 2602 in some approaches, while in other approaches, the array 2604 may include 32, 64, or more write transducers 2602. Furthermore, it should be noted that although only write transducers 2602 are included on module 2606 in the present embodiment, other types of transducers may be included on the same module as the write transducers in other embodiments, e.g., see servo readers 212 and readers 216 of FIGS. 2C-2D.

Referring still to FIGS. 26A-26B, each of the write transducers 2602 includes a first (e.g., lower) write pole 2608 and a second (e.g., upper) write pole 2610. According to the present description, "lower" and "upper" may refer to a position of each of the write poles with respect to each other along a deposition direction of the write transducer 2602, which is parallel to the intended direction of tape travel 2650. As alluded to above, the deposition direction may typically be oriented such that the first write pole 2608 is a lower write pole while the second write pole 2610 is an upper write pole formed above the first write pole 2608 for each of the write transducers 2602 in the array 2604. However, in other approaches the second write pole 2610 may be a lower write pole while the first write pole 2608 is an upper write pole formed above the second write pole 2610 for each of the write transducers 2602 in the array 2604.

Similarly, the intended direction of tape travel at a given point in time and/or the relative orientation of the first and second write poles 2608, 2610 may also determine which one of the first and second write poles 2608, 2610 is the trailing pole. For instance, a drive mechanism (e.g., see FIG. 1A) may be configured to pass a magnetic recording tape over the first and second write poles 2608, 2610 in a direction such that each of the second write poles 2610 of the write transducers 2602 in the array 2604 are trailing write poles. Alternatively, a drive mechanism (e.g., see FIG. 1A) may be configured to pass a magnetic recording tape over the first and second write poles 2608, 2610 in a direction such that each of the first write poles 2608 of the write transducers 2602 in the array 2604 are trailing write poles. The write transducer 2602 may be used for unidirectional writing such that the first write pole 2608 is leading, and the second write pole 2610 is trailing. In this embodiment, a high moment layer 2622 is positioned proximate to the write gap 2620 on the second write pole 2610, thereby improving write performance for the write transducers 2602 when the second write pole 2610 is trailing, e.g., which will be described in further detail below. It should also be noted that in some embodiments, one or more write transducers of an array may include a high moment layer that is coupled only to (e.g., formed on) the pole tip 2612 of the first write pole 2608, e.g., according to any of the approaches described herein.

Looking specifically to the partial cross-sectional view in FIG. 26B of one of the write transducers 2602 taken along line 26B-26B of FIG. 26A, the first write pole 2608 includes a pole tip 2612 which extends back from a media facing side 2614 of the first write pole 2608. Moreover, the second write pole 2610 also includes a respective pole tip 2616 which extends back from a media facing side 2618 of the second write pole 2610 toward a yoke portion 2617 thereof, the yoke portion 2617 including the curved portion of the second write pole 2610, as would be appreciated by one skilled in the art after reading the present description. Cross-sections of a write coil 2624 are also shown. It should be noted that although FIG. 26B only shows a partial cross-sectional view of one of the write transducers 2602, any of the layers, portions, components, etc., shown in FIG. 26B and/or the descriptions thereof may be incorporated in any one or more of the other write transducers 2602 included along the array 2604 in apparatus 2600.

A nonmagnetic write gap 2620 is additionally included between the pole tips 2612, 2616 of the first and second write poles 2608, 2610 respectively. In some approaches the write gap 2620 may be electrically conductive, e.g., rather than an electrically insulating write gap as typically implemented in conventional structures. It follows that the write gap 2620 may include a nonmagnetic metal in some approaches. As described below, a trimming process may be implemented to shape some of the write transducers included herein. By including an electrically conductive nonmagnetic metal write gap 2620, a more uniform trimming processes may be achieved for the various layers of the write transducer 2602, as would be appreciated by one skilled in the art after reading the present description.

Moreover, implementing a nonmagnetic metal write gap 2620 may help minimize write gap erosion caused by the media being run thereover.

The high moment layer 2622 is positioned between the write gap 2620 and the pole tip 2616 of the second write pole 2610. As shown, the high moment layer 2622 has a "beaked" profile, whereby the high moment layer 2622 protrudes beyond a plane extending along the media facing side 2618 of the pole tip 2616 of the second write pole 2610. In other words, the high moment layer 2622 protrudes beyond the media facing side 2618 of the pole tip 2616 toward the expected location of the magnetic recording tape. This effect can be obtained, e.g., by recessing the adjacent pole tip 2616 via etching of the media facing surface thereof. For example, a selective etching that removes the pole tip 2616 more quickly than the high moment layer 2622 may be used. In another approach, the high moment layer 2622 may be masked prior to etching.

The height h of the high moment layer 2622 beak may vary, e.g., depending on the process used to form the high moment layer 2622, the material composition of the high moment layer 2622, etc. An illustrative range for the height h of the beak of the high moment layer 2622 may be from about 2 nm to about 150 nm, more preferably from about 4 nm to about 50 nm, but could be higher or lower depending on the desired embodiment. It should be noted that the protrusion height h of the high moment layer 2622 beyond the plane of the closest media facing side 2618 is greatly exaggerated for clarity in this and other drawings herein. It should also be noted that the high moment layer 2622 may extend about to a plane of the media facing surface of the substrate (not shown) on which the write transducer is formed, may be covered in a protective coating applied thereover, etc.

According to preferred approaches, the high moment layer 2622 may be implemented as a thin film seed layer as would be appreciated by one skilled in the art after reading the present description. Moreover, the high moment layer 2622 may be formed using any desired process, e.g., sputtering, ion-beam deposition, etc. Moreover, the beaked profile of the high moment layer 2622 may be formed by selectively etching the media facing side of the write transducer 2602, such that the high moment layer 2622 etches at a lower rate than the pole tips 2612, 2616 of the first and second write poles 2608, 2610 respectively. Thus, the pole tips 2612, 2616 of the first and second write poles 2608, 2610 will become recessed relative to the high moment layer 2622, thereby forming the beak. Any type of etching process which would become apparent to one skilled in the art after reading the present description may be implemented. Although not shown in the present embodiment, an overcoat is preferably applied to the media facing side of the write transducer 2602 after the beaked high moment layer 2622 has been formed. The overcoat may be at least as thick as the height h of the high moment layer 2622, possibly forming a uniform media facing side (e.g., tape bearing surface) of the write transducer 2602. Any known type of overcoat material may be used.

The high moment layer 2622 preferably includes a higher magnetic moment in the bulk material thereof than a magnetic moment of the pole tip 2616 of the second write pole 2610. The high moment layer 2622 may include an alloy of iron and one or more of cobalt, nickel, aluminum and platinum. Exemplary high moment materials include cobalt-iron-nickel alloys; high concentration iron-nickel alloys, e.g., such as 78% iron-22% nickel; etc. However, in some approaches the high moment layer 2622 may include other metals therein. Accordingly, the high moment layer 2622 has a higher saturation magnetization than the remainder of the pole tip 2616, thereby allowing the high moment layer 2622 to focus flux emitted from and/or absorbed by the second write pole 2610 more effectively than conventional write poles. Furthermore, the beaked profile of the high moment layer 2622 protruding beyond the media facing side 2618 of the pole tip 2616 further serves to improve focusing of the flux. As a result, the beaked high moment layer 2622 is able to produce a higher field gradient in the media than conventionally possible. The field gradient produced by the beaked high moment layer 2622 is even higher than that produced by a non-beaked high moment layer. While a non-beaked high moment portion implemented as a thin layer may help focus the flux more effectively than any conventional writer structures (e.g., a full high moment pole tip piece), the beaked high moment layer 2622 has been found to further sharpen the magnetic field gradients in the media, and thus write sharper transitions to the tape. Some of the embodiments described herein therefore desirably achieve lower pulse width at half height (PW50), smaller transition parameters, and lower readback error rates. Additionally, the beaked high moment layer 2622 is desirably able to further reduce the pole tip to media spacing.

As mentioned above, in some embodiments the write transducer 2602 is used for unidirectional writing such that the first write pole 2608 is leading, and the second write pole 2610 is trailing. As a result, flux may be delivered to the pole tip 2616 of the second write pole 2610 such that the flux is concentrated by the high moment material 2622 to emerge from the write transducer 2602 to write data to a magnetic recording tape by setting the magnetic transitions thereon. Moreover, the high moment material in the beaked high moment layer 2622 is able to focus a greater amount of flux than a conventional write pole is able to before becoming saturated, thereby allowing the write transducer 2602 to more efficiently write data to magnetic media (e.g., magnetic tape) having a high coercivity while also achieving a fine granularity. Thus, implementing the beaked high moment material 2622 as described in the present embodiment is able to improve the write performance of the write transducers 2602, as for example, when the second write pole 2610 is trailing.

The inventors were surprised to discover that the deposition thickness t of the high moment layer 2622 has an influence on the effectiveness of the second write pole 2610. More specifically, the inventors surprisingly discovered that as the deposition thickness t of the high moment layer 2622 increased beyond a certain thickness, it became less effective in focusing flux and thereby did not improve the performance of the second write pole 2610. In view of the inventors' surprising discovery, it is preferred that the deposition thickness t of the high moment layer 2622 is in a range of about 50 nm to about 400 nm, more preferably in a range of about 50 nm to about 200 nm. Again, as the deposition thickness t of the high moment layer 2622 increased above the upper bounds of these ranges, the effectiveness of the high moment layer 2622 is reduced, thereby resulting in no improvement in performance of the apparatus 2600 as a whole. It follows that the inventors also discovered that a high moment layer 2622 having a deposition thickness tin the above ranges is able to focus flux emitted from and/or absorbed by the second write pole 2610 even more effectively than a write pole having a pole tip that is fully constructed from a high moment material. Without wishing to be bound by any particular theory, the reduction in the effectiveness of the high moment layer 2622 corresponding to an increase in the deposition thickness thereof may be at least partially attributed to the lower magnetic permeability of the high moment material of the high moment layer 2622, e.g., compared to the magnetic permeability of typical write pole material such as 45/55 NiFe.

With continued reference to FIG. 26B, the placement of the high moment layer 2622 along the second write pole 2610 also influences the effectiveness of the second write pole 2610. As shown in FIG. 26B, the high moment layer 2622 does not extend along the yoke portion 2617. Attempts were made to line the yoke portion 2617 in addition to the pole tip 2616 with the high moment layer 2622, but such embodiments surprisingly did not work as well as those having a high moment layer 2622 extending solely along the pole tip 2616, e.g., as shown in FIG. 26B. While not wishing to be bound by any particular theory, it is believed that it is more difficult to preserve the magnetic properties of high moment materials when forming one or more of the high moment materials on a sloped surface, for example having a slope angle of greater than 3 degrees. Thus, the high moment layer 2622 is preferably not included along the curved yoke portion 2617. However, it should be noted that high moment material may be implemented differently than as shown in the present embodiment, as will soon become apparent.

Figure 27A:
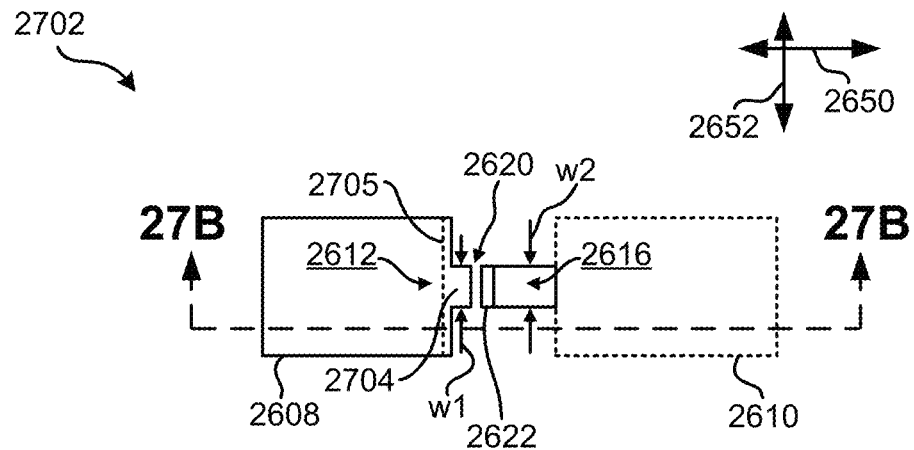
FIG. 27A is a media facing side view of a write transducer according to one embodiment.
Figure 27B:
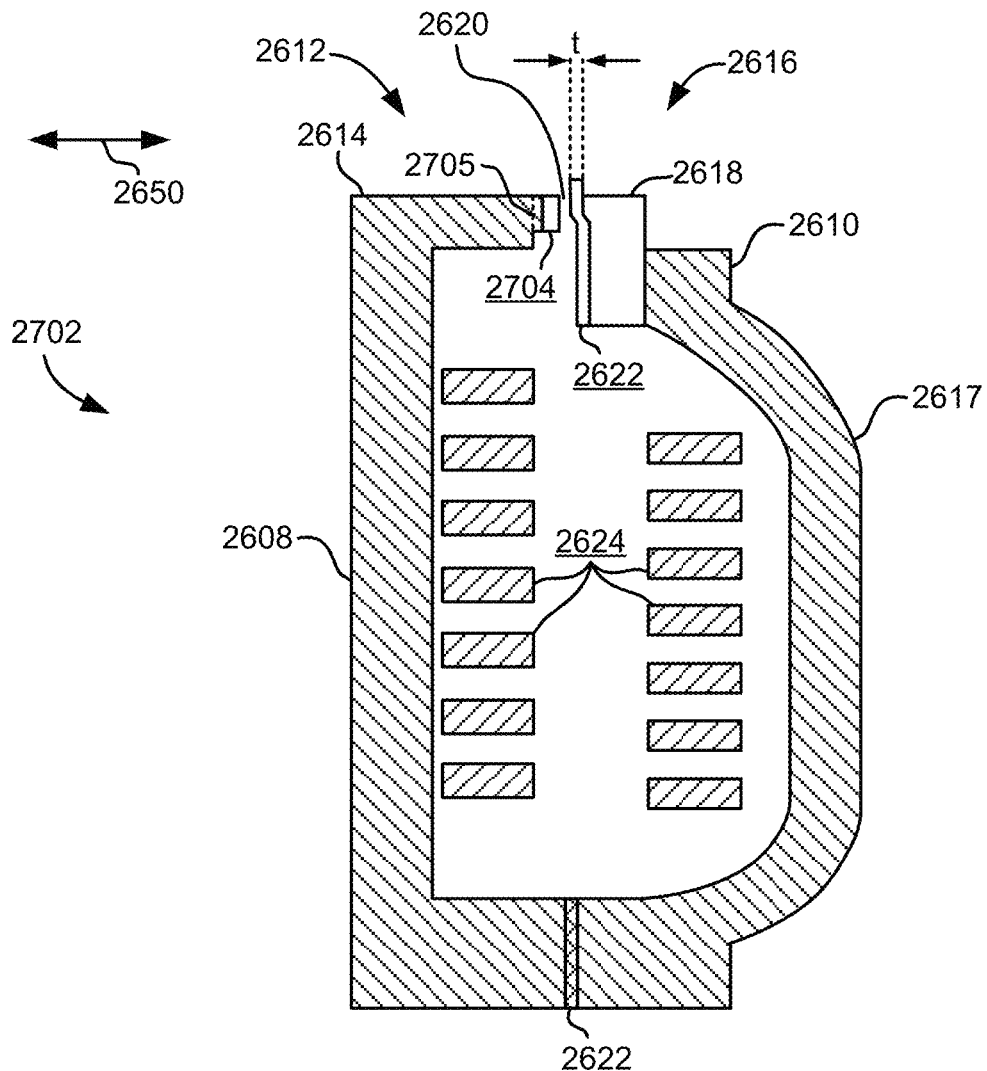
FIG. 27B is a partial cross-sectional view of the write transducer in FIG. 27A taken along line 27B-27B of FIG. 27A.

Looking to FIGS. 27A-27B, a write transducer 2702 is depicted in accordance with another embodiment. As an option, the present write transducer 2702 may be implemented in conjunction with features from any other embodiment listed herein, such as those described with reference to the other FIGS., such as FIG. 1A-26B. Specifically, FIGS. 27A-27B illustrate variations of the embodiment of FIGS. 26A-26B depicting several exemplary configurations within a write transducer 2702. Accordingly, various components of FIGS. 27A-27B have common numbering with those of FIGS. 26A-26B.

Note that such write transducer 2702 and others presented herein may be used in various applications and/or in permutations which may or may not be specifically described in the illustrative embodiments listed herein. Further, the write transducer 2702 presented herein may be used in any desired environment. Thus FIGS. 27A-27B (and the other FIGS.) may be deemed to include any possible permutation. It should also be noted that unless otherwise specified, the various layers in this and other embodiments may be formed using conventional processes and/or materials, preferably having high magnetic permeability and low corrosion susceptibility.

As shown in FIGS. 27A-27B, the pole tip 2612 of the first write pole 2608 includes a pedestal 2704 extending from line 2705 toward the write gap 2620. During fabrication of the write transducer 2702 (e.g., at the wafer level), the surface of the pedestal 2704 facing the write gap 2620 may be trimmed using any desired process, such as etching, milling (e.g., ion milling), etc. Accordingly, the trimmed portion of the pedestal 2704 may have a smaller width w1 relative to the width of the first write pole 2608 and any untrimmed portion of the pedestal 2704. By trimming the pedestal 2704 of the first write pole 2608, the fringing field created by the write transducer 2702 may be controlled (e.g., reduced), thereby desirably reducing the extent of erase bands. Moreover, the trimming of the surface of the first write pole 2608 facing the write gap 2620 may be performed without affecting the beaked profile of the high moment layer 2622, e.g., as the beaked profile of the high moment layer 2622 may be formed after the first write pole 2608 has been trimmed.

As shown in the present embodiment, a width w1 of the pedestal 2704 may extend in a cross-track direction 2652 (which is perpendicular to the intended direction of tape travel 2650) for a distance which is about equal to a width w2 of the pole tip 2616 of the second write pole 2610 measured in the cross-track direction 2652. However, the width w1 of the trimmed portion of the pedestal 2704 may vary depending on the type and/or duration of the trimming process implemented to form the trimmed portion of the pedestal 2704, e.g., depending on the desired embodiment.

As mentioned above, more than one write transducer 2702 may be implemented in an array on a module, e.g., as shown in FIGS. 2C-2D and/or FIG. 26A. The number of write transducers 2702 included in the array may vary depending on the desired approach. For instance, the array may include 16 of the write transducers 2702 in some approaches, while in other approaches, the array may include 32 or more of the write transducers 2702. Furthermore, it should be noted that other types of transducers may be included on the same module as the write transducer 2702 in other embodiments, e.g., see servo readers 212 and readers 216 of FIGS. 2C-2D.

Referring again to FIGS. 27A-27B, write transducer 2702 may be used for unidirectional writing, particularly where the high moment layer 2622 is only positioned on one side of the write gap 2620. Again, in this embodiment, the intended direction of tape travel may be directed such that the second write pole 2610 and high moment layer 2622 are trailing compared to the first write pole 2608, which is leading. However, some embodiments may include a second high moment layer on an opposite side of the write gap 2620 as high moment layer 2622 thereby enabling improved performance for bi-directional recording, as will soon become apparent.

Looking to FIGS. 28A-28H, several write transducers 2802, 2822, 2842, 2862 are depicted in accordance with several embodiments. As an option, any one of the write transducers 2802, 2822, 2842, 2862 may be implemented in conjunction with features from any other embodiment listed herein, such as those described with reference to the other FIGS., such as FIG. 1A-26B. Specifically, FIGS. 28A-28H illustrate variations of the embodiment of FIGS. 26A-26B depicting several exemplary configurations within several write transducers 2802, 2822, 2842, 2862. Accordingly, various components of FIGS. 28A-28H have common numbering with those of FIGS. 26A-26B.

However, such write transducers 2802, 2822, 2842, 2862 and others presented herein may be used in various applications and/or in permutations which may or may not be specifically described in the illustrative embodiments listed herein. Further, the write transducers 2802, 2822, 2842, 2862 presented herein may be used in any desired environment. Thus FIGS. 28A-28H (and the other FIGS.) may be deemed to include any possible permutation. It should also be noted that unless otherwise specified, the various layers in these and other embodiments may be formed using conventional processes and/or materials, preferably having high magnetic permeability and low corrosion susceptibility.

Figure 28A:
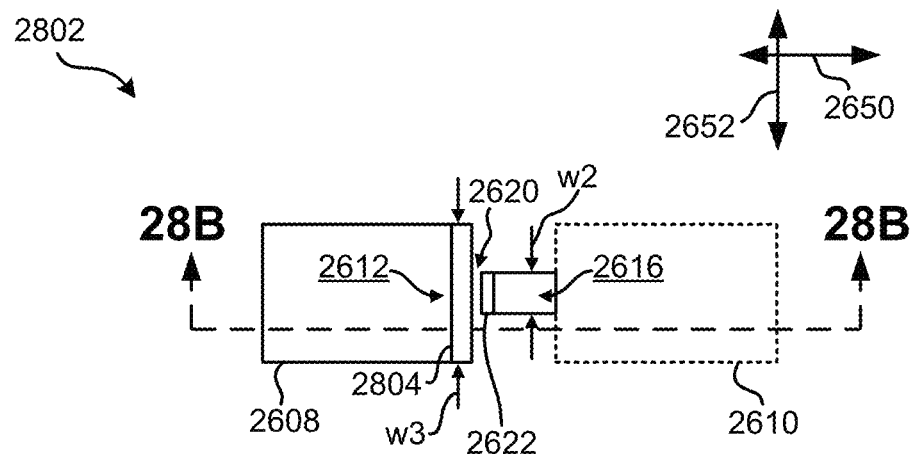
FIG. 28A is a media facing side view of a write transducer according to one embodiment.
Figure 28B:
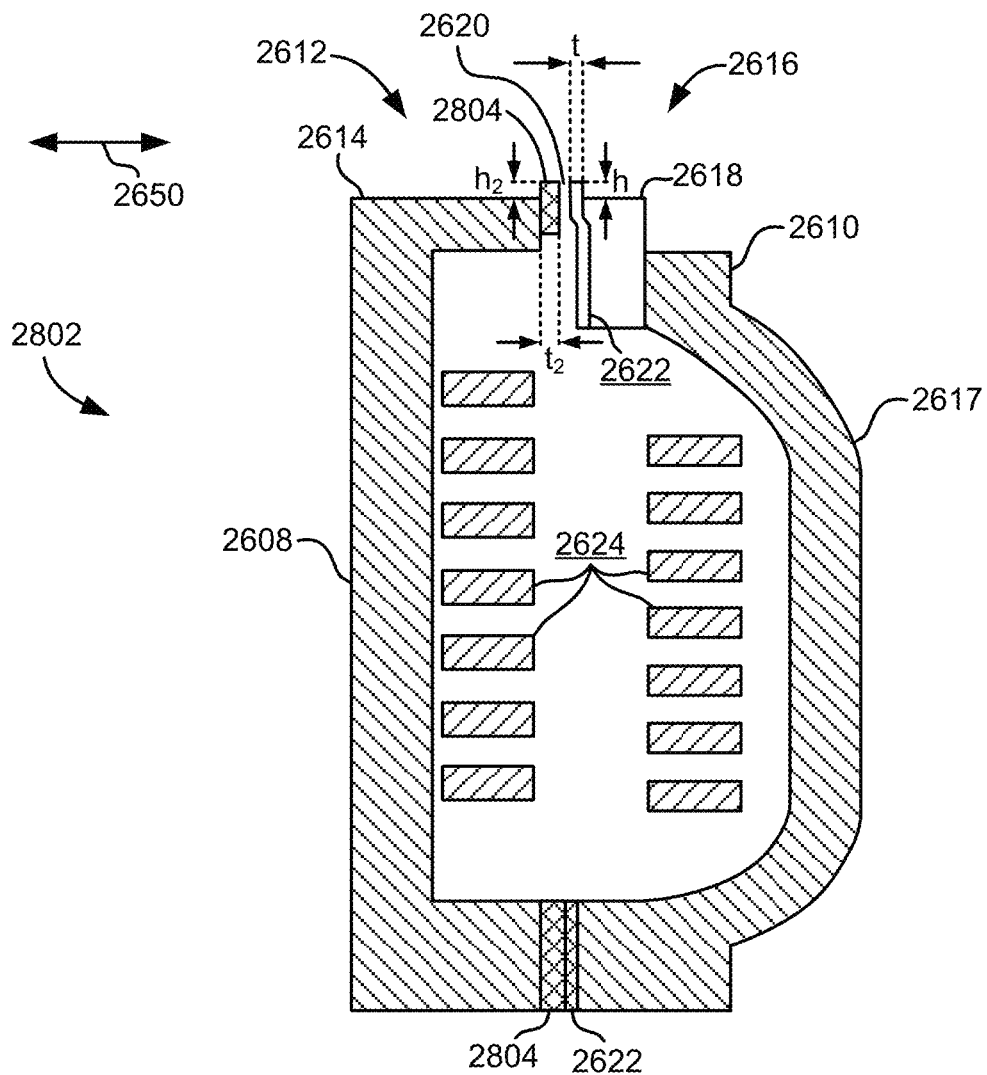
FIG. 28B is a partial cross-sectional view of the write transducer in FIG. 28A taken along line 28B-28B of FIG. 28A.

As shown in FIGS. 28A-28B, in addition to a beaked high moment layer 2622, a beaked second high moment layer 2804 is included between the write gap 2620 and the pole tip 2612 of the first write pole 2608. The second beaked high moment layer 2804 protrudes beyond a plane extending along a media facing side 2614 of the pole tip 2612 of the first write pole 2608. In other words, both of the beaked high moment layers 2622, 2804 protrude beyond the media facing side 2618, 2614 of the respective pole tip 2616, 2612 toward the expected location of the magnetic recording tape.

According to preferred approaches, the second high moment layer 2804 may be implemented as a thin film layer, and may be formed using any desired process, e.g., sputtering, plating, ion-beam deposition, etc. Moreover, the beaked profile of the second high moment layer 2804 may be formed by selectively etching the media facing side of the write transducer 2802, such that the second high moment layer 2804 etches at a lower rate than the pole tips 2612, 2616 of the first and second write poles 2608, 2610 respectively. Thus, the pole tips 2612, 2616 of the first and second write poles 2608, 2610 are recessed relative to the beak of the second high moment layer 2804. Any type of etching process which would be apparent to one skilled in the art after reading the present description may be implemented.

The height $h_2$ of the second high moment layer beak may also vary, e.g., depending on the process used to form the second high moment layer 2804, the material composition of the second high moment layer 2804, etc. In some approaches, the height $h_2$ of the second high moment layer beak may be substantially similar to the height h of the high moment layer 2622, but may vary slightly in other approaches, e.g., due to variations in the process of forming the beaked high moment layers 2622, 2804. An illustrative range for the height $h_2$ of the second high moment layer beak may be from about 2 nm to about 150 nm, more preferably from about 4 nm to about 50 nm, but could be higher or lower depending on the desired embodiment.

Although not shown in the present embodiment, an overcoat may be applied to the media facing side of the write transducer 2802 after the beaked second high moment layer 2804 has been formed. The overcoat applied is preferably at least as high as the height $h_2$ of the second high moment layer 2804, thereby forming a uniform media facing side (e.g., tape bearing surface) of the write transducer 2802. Any known type of overcoat material may be used.

According to the present embodiment, a width w3 of the second high moment layer 2804 extends along the pole tip 2612 of the first write pole 2608 in a cross-track direction 2652 for a distance greater than a width w2 of the pole tip 2616 of the second write pole 2610 measured in the same cross-track direction 2652. In some approaches, the second high moment layer 2804 may be deposited (e.g., full film) on a write gap-facing surface of the pole tip 2612 of the first write pole 2608. It follows that the width w3 of the second high moment layer 2804 may extend about as wide as the pole tip 2612 of the first write pole 2608.

Although the high moment layer 2622 and the second high moment layer 2804 may not have equal (the same) deposition thicknesses, e.g., resulting from being formed by different processes, the inventors made a surprising discovery that the deposition thickness of a high moment layer (e.g., 2622, 2804) has an influence on the effectiveness of the respective write pole. More specifically, the inventors surprisingly discovered that as the deposition thickness of a high moment layer increased beyond a certain thickness, it became less effective in focusing flux and thereby does not improve the performance of the respective write pole. Thus, a deposition thickness t of the high moment layer 2622 and/or a deposition thickness $t_2$ of the second high moment layer 2804 is preferably in a range of about 50 nm to about 400 nm, more preferably in a range of about 75 nm to about 200 nm. However, in some approaches the second high moment layer 2804 may have a thickness that is thicker than the above ranges due to limitations of the formation process (e.g., plating) of the second high moment layer 2804. Although the thickness of the second high moment layer 2804 may be greater than the preferred ranges, improvements to the one or more write transducers and the module on which they are positioned may be achieved by simply including the second high moment layer 2804 to produce a symmetrical write gap.

The second high moment layer 2804 preferably has a higher magnetic moment in the bulk material thereof than a magnetic moment of the pole tip 2612 of the first write pole 2608. The second high moment layer 2804 may include one or more of the same materials as high moment layer 2622, but may have a different composition in some approaches. It follows that the second high moment layer 2804 preferably includes an alloy of iron and one or more of cobalt, nickel, aluminum and platinum. However, in some approaches the second high moment layer 2804 may include other metals therein. Accordingly, the second high moment layer 2804 has a higher saturation magnetization than the remainder of the pole tip 2612, thereby allowing the second high moment layer 2804 to focus flux emitted from and/or absorbed by the first write pole 2608 more effectively than conventional write poles.

By implementing the second high moment layer 2804, the write transducer 2802 no longer has an asymmetrical write gap, e.g., as seen in FIGS. 26A-27B. Rather, a high moment layer is positioned on either side of the write gap 2620, thereby achieving improved write performance regardless of which one of the first or second write poles 2608, 2610 are trailing, as dependent upon the given direction of tape travel. As a result, flux may be delivered to either pole tip 2612, 2616 of the write poles 2608, 2610 where the flux is concentrated by the respective high moment material 2622, 2804 to emerge from the write transducer 2802 to write data to a magnetic recording tape. Moreover, the high moment materials in the high moment layers 2622, 2804 are each able to focus a greater amount of flux than a conventional write pole before becoming saturated, thereby allowing the write transducer 2802 to efficiently write data to magnetic media (e.g., magnetic tape) having a high coercivity while also achieving a fine granularity. Furthermore, the beaked profiles of the high moment layers 2622, 2804 protruding beyond the media facing side 2618, 2614 of the pole tips 2616, 2612 serve to improve focusing of the flux even further. As described above, the beaked high moment layers 2622, 2804 are able to produce a higher field gradient in the media than even produced by a non-beaked high moment layer. Some of the embodiments described herein therefore desirably achieve lower PW50, smaller transition parameters, and lower readback error rates. Furthermore, the beaked high moment layer 2622 is desirably able to reduce the pole tip to media spacing, which also serves to improve writing quality. The symmetrical write gap 2620 also allows for the aforementioned improvements to be achieved for either intended direction of tape travel 2650, by minimizing the asymmetry of the fringing field at the edges.

Figure 28C:
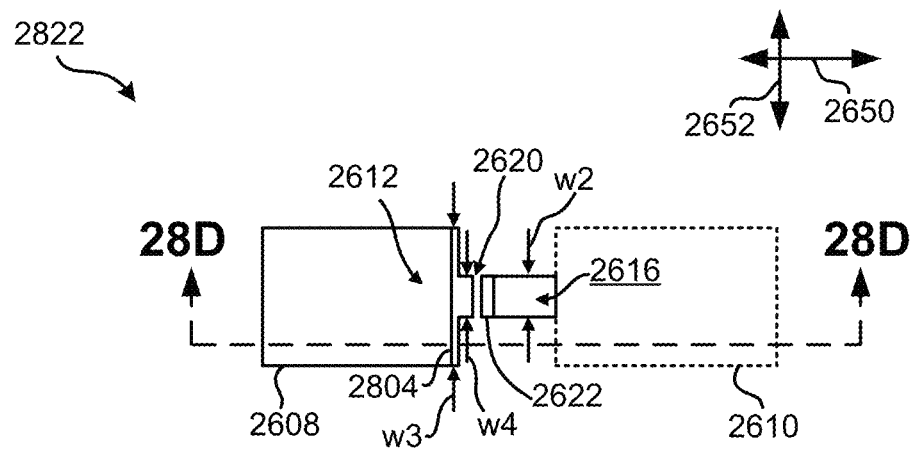
FIG. 28C is a media facing side view of a write transducer according to one embodiment.
Figure 28D:
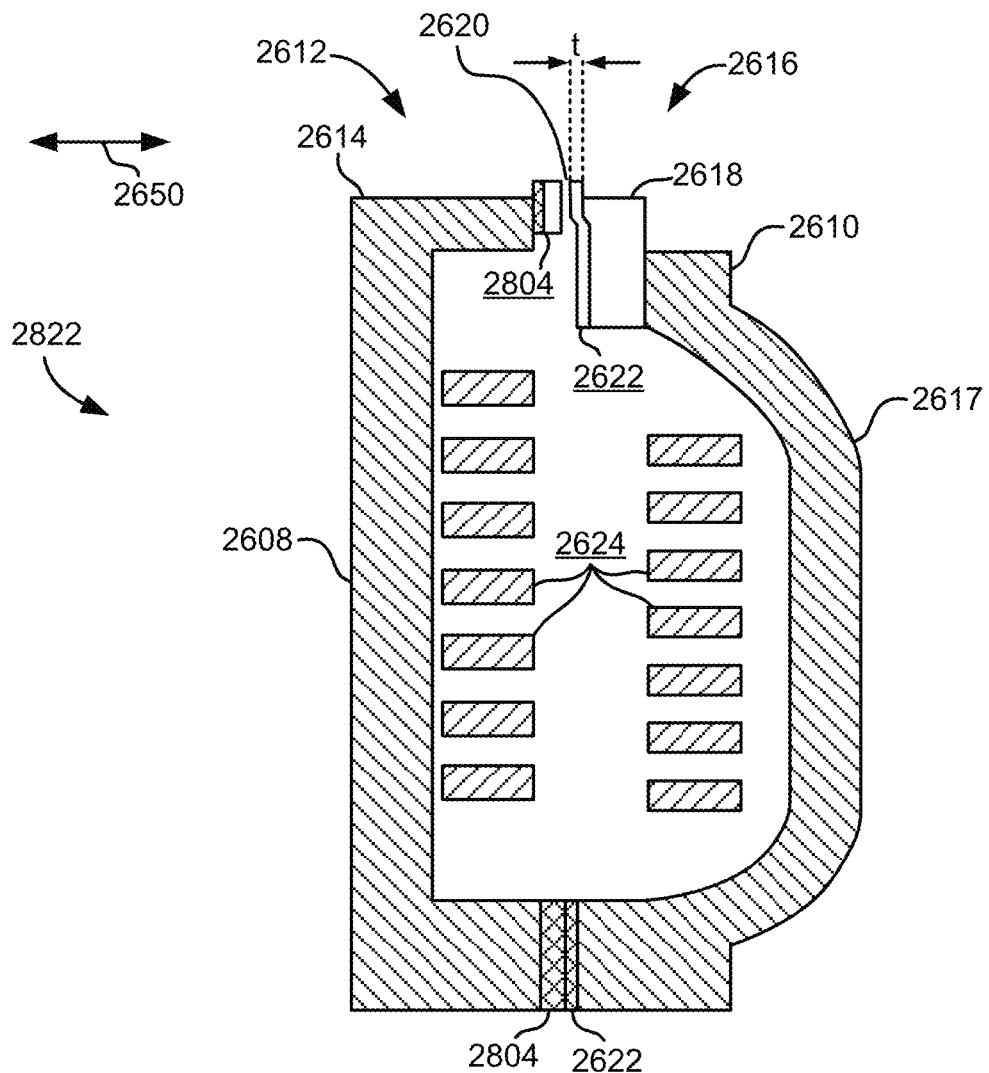
FIG. 28D is a partial cross-sectional view of the write transducer in FIG. 28C taken along line 28D-28D of FIG. 28C.

In some approaches, the write transducer configuration illustrated in FIGS. 28A-28B may be processed by trimming a write gap-facing side of the second high moment layer 2804, thereby resulting in the write transducer configuration illustrated in FIGS. 28C-28D. As shown, the second high moment layer 2804 has a trimmed portion that extends toward the write gap 2620. The trimming performed on the second high moment layer 2804 may be performed during fabrication of the write transducer 2802, by etching, milling (e.g., ion milling), etc., the surface of the first write pole 2608 facing the write gap 2620. As mentioned above, by trimming the second high moment layer 2804 to form the trimmed portion of the second high moment layer 2804, the fringing field created by the write transducer 2802 may be controlled (e.g., reduced), thereby desirably reducing the extent of erase bands. The inventors found that the fringing field is smaller and symmetrical when both pole tips contain the same material.

Again, the trimming process is preferably performed without affecting the beaked profile of either of the high moment layers 2622, 2804, e.g., as the beaked profile of the high moment layers 2622, 2804 may be formed after the trimming has been performed. Accordingly, high moment layers 2622, 2804 are still shown as protruding beyond a plane extending along a media facing side 2618, 2614 of the respective pole tip 2610, 2608, e.g., as described above.

The width w3 of the second high moment layer 2804 at the widest portion thereof may still extend along the pole tip 2612 of the first write pole 2608 in a cross-track direction 2652 for a distance greater than a width w2 of the pole tip 2616 of the second write pole 2610 measured in the same direction. However, a width w4 of the trimmed portion of the second high moment layer 2804 may extend in a cross-track direction 2652 for a distance which is about equal to a width w2 of the pole tip 2616 of the second write pole 2610. In other approaches, the width w4 and/or w3 of either portion of the second high moment layer 2804 may vary depending on the type and/or duration of the trimming process implemented to form the trimmed portion of the trimmed portion of the second high moment layer 2804, e.g., depending on the desired embodiment.

It should be noted that the configuration illustrated in FIGS. 28C-28D may be formed by implementing different processes. For example, the non-trimmed portion of the second high moment layer 2804 (having the wider width w3) may be deposited across the entire pole, while the trimmed portion of the second high moment layer 2804 (having the narrower width w4) may be formed by masking and depositing (e.g., sputtering). Moreover, the beaked profile of the high moment layers 2622, 2804 may be formed by selectively etching the media facing surface of the write transducer 2822 as described above.

Although the high moment layer 2622 and the second high moment layer 2804 may not have equal (the same) deposition thicknesses, it is preferred that the respective thicknesses thereof are in a range of about 50 nm to about 400 nm, more preferably in a range of about 75 nm to about 200 nm, e.g., in view of the surprising results discovered by the inventors as described above. Looking to the side of the write transducer 2802 opposite a media facing side 2614 thereof, a portion of the second high moment layer 2804 may be thinner than a deposition thickness of the portion of the second high moment layer 2804 adjacent the media facing side 2614 of the write transducer 2802. Accordingly, the portion of the second high moment layer 2804 adjacent the side of the write transducer 2802 opposite the media facing side 2614 may be in a range of about 50 nm to about 400 nm, more preferably in a range of about 75 nm to about 200 nm, but may be higher or lower depending on the desired embodiment.

Figure 28E:
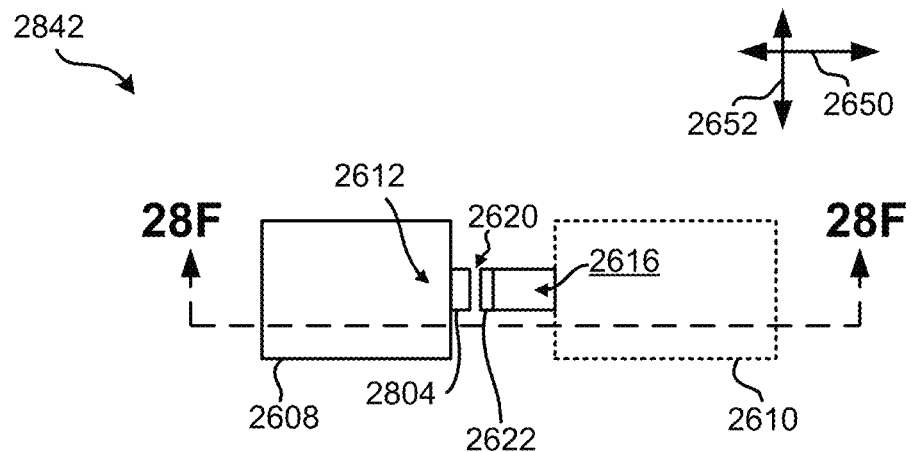
FIG. 28E is a media facing side view of a write transducer according to one embodiment.
Figure 28F:
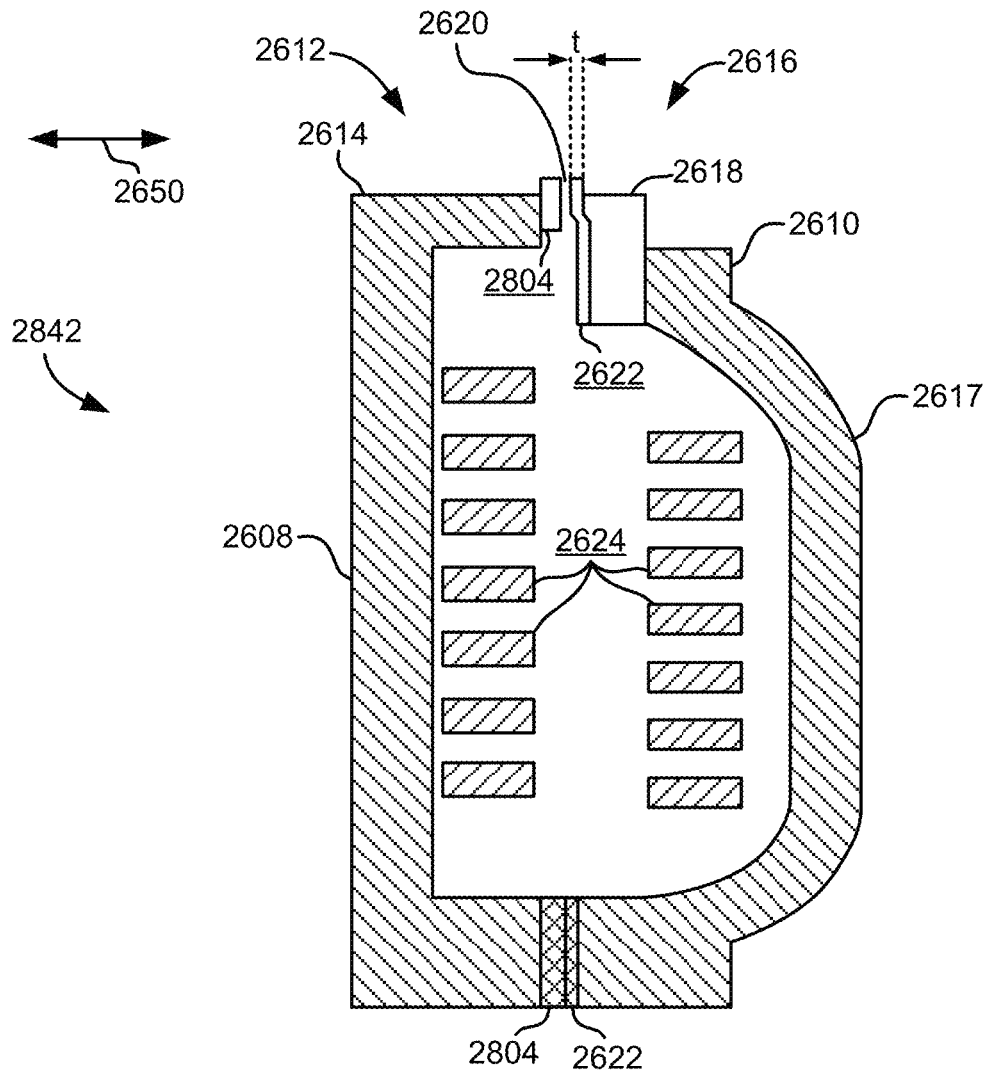
FIG. 28F is a partial cross-sectional view of the write transducer in FIG. 28E taken along line 28F-28F of FIG. 28E.

In some approaches, the write transducer configuration illustrated in FIGS. 28C-28D may be processed by etching, milling (e.g., ion milling), etc., the non-trimmed portion of the second high moment layer 2804 (having the wider width w3), thereby resulting in the write transducer configuration illustrated in the write transducer 2842 of FIGS. 28E-28F.

As shown in FIGS. 28E-28F, the second high moment layer 2804 of write transducer 2842 has been processed (e.g., etched) such that only the trimmed portion thereof remains. In other words, the second high moment layer 2804 may be processed such that portions of the second high moment layer 2804 no longer remain along the write gap-facing surface of the pole tip 2612 of the first write pole 2608. The portion of the second high moment layer 2804 that still remains may extend along the pole tip 2612 of the first write pole 2608 for a distance that is about equal to the width of the pole tip 2616 of the second write pole 2610 measured in the same direction. It follows that the second high moment layer 2804 may be processed in some approaches without affecting the width of the trimmed portion thereof. Moreover, the processing (e.g., etching) used to form write transducer 2842 is preferably performed without affecting the beaked profile of either of the high moment layers 2622, 2804, e.g., as the beaked profile of the high moment layers 2622, 2804 may be formed after the processing has been performed. Accordingly, high moment layers 2622, 2804 are still shown as protruding beyond a plane extending along a media facing side 2618, 2614 of the respective pole tip 2610, 2608, e.g., as described above.

Figure 28G:
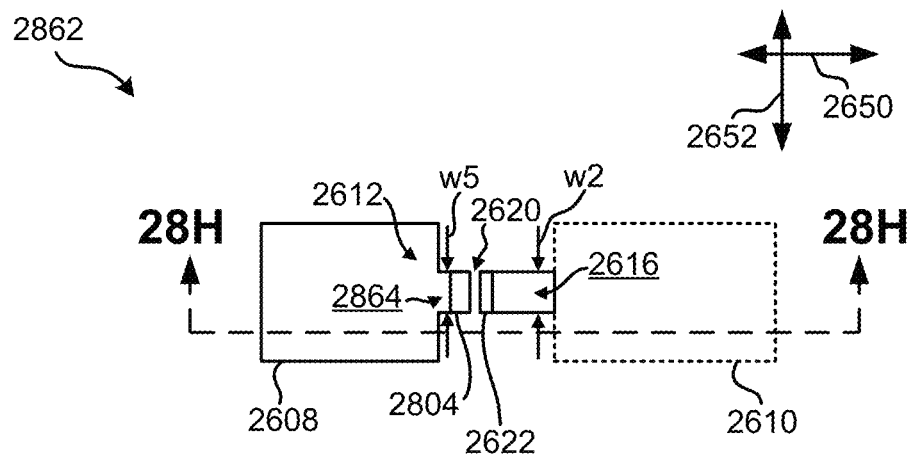
FIG. 28G is a media facing side view of a write transducer according to one embodiment.
Figure 28H:
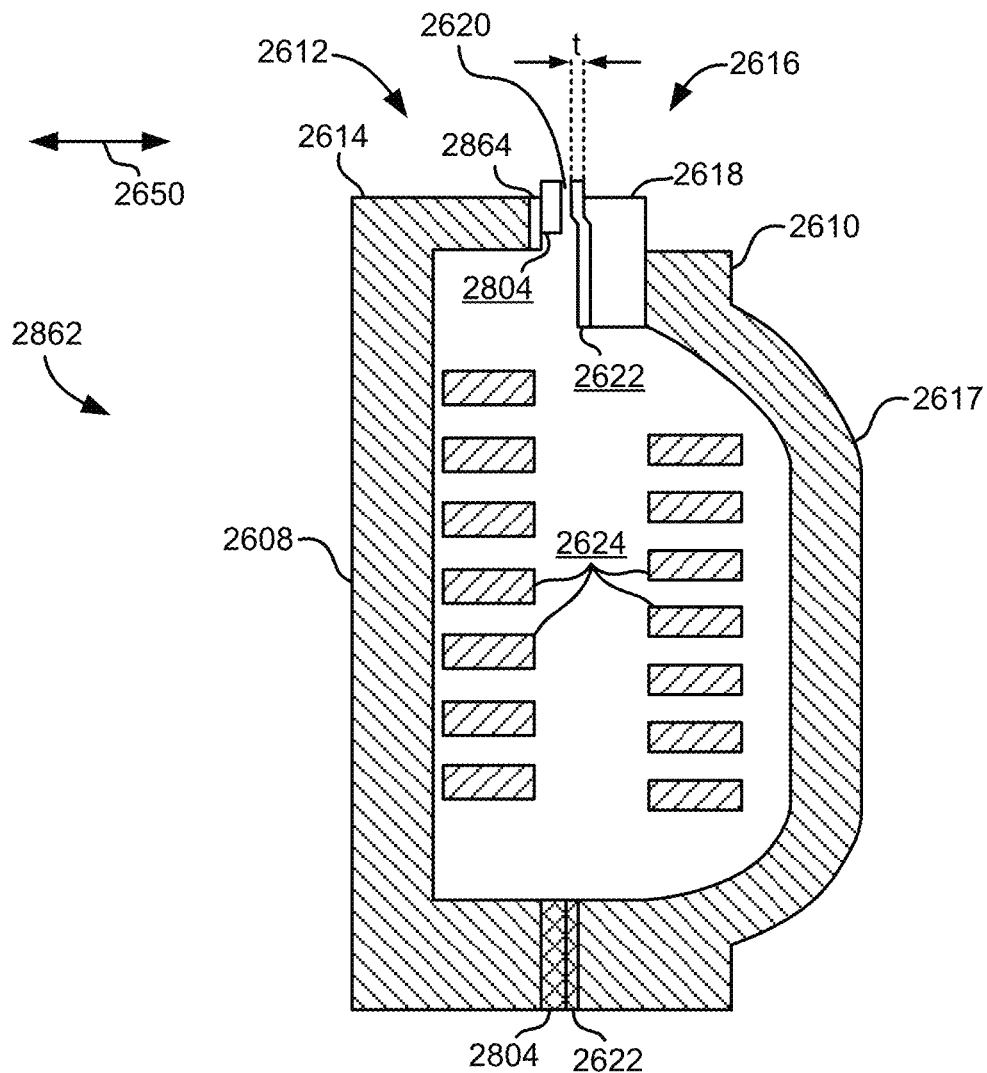
FIG. 28H is a partial cross-sectional view of the write transducer in FIG. 28G taken along line 28H-28H of FIG. 28G.

In still other approaches, the write transducer configuration illustrated in FIGS. 28E-28F may be processed by etching, milling (e.g., ion milling), etc., the non-trimmed portion of the first write pole 2608, thereby resulting in the write transducer configuration illustrated in the write transducer 2862 of FIGS. 28G-28H.

As shown in FIGS. 28G-28H, the processing (e.g., trimming) is preferably performed on the write gap-facing surface of the first write pole 2608. The trimming of the pole tip 2612 of the first pole 2608 may create a portion 2864 that extends from a trimmed portion of the first pole 2608 toward the write gap 2620. A width w5 of the portion extends in a cross-track direction 2652 for a distance about equal to a width w2 of the pole tip 2616 of the second write pole 2610 measured in the same cross-track direction 2652.

In preferred approaches, the second high moment layer 2804 may still extend along the pole tip 2612 of the first write pole 2608 for a distance that is about equal to the width w2 of the pole tip 2616 of the second write pole 2610, as well as width w5, measured in the same cross-track direction 2652. Once again, the processing (e.g., etching, milling, etc.) used to form write transducer 2862 is preferably performed without affecting the beaked profile of either of the high moment layers 2622, 2804, e.g., as the beaked profile of the high moment layers 2622, 2804 may be formed after the processing has been performed. Accordingly, high moment layers 2622, 2804 are still shown as protruding beyond a plane extending along a media facing side 2618, 2614 of the respective pole tip 2610, 2608, e.g., as described above.

Figure 29A:
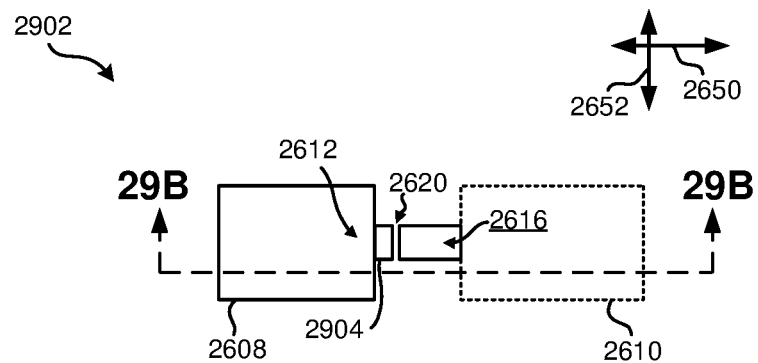
FIG. 29A is a media facing side view of a write transducer according to one embodiment.
Figure 29B:
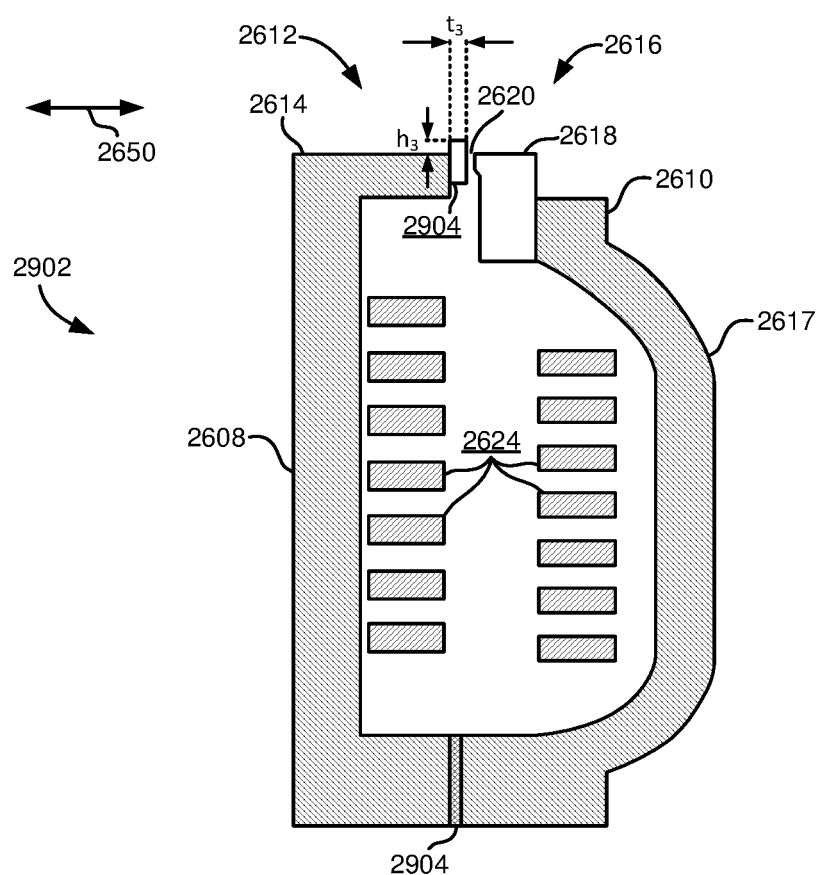
FIG. 29B is a partial cross-sectional view of the write transducer in FIG. 29A taken along line 29B-29B of FIG. 29A.

Looking to FIGS. 29A-29B, a write transducer 2902 is depicted in accordance with another embodiment. As an option, the present write transducer 2902 may be implemented in conjunction with features from any other embodiment listed herein, such as those described with reference to the other FIGS., such as FIG. 1A-26B. Specifically, FIGS. 29A-29B illustrate variations of the embodiment of FIGS. 26A-26B depicting several exemplary configurations within a write transducer 2902. Accordingly, various components of FIGS. 29A-29B have common numbering with those of FIGS. 26A-26B.

However, such write transducer 2902 and others presented herein may be used in various applications and/or in permutations which may or may not be specifically described in the illustrative embodiments listed herein. Further, the write transducer 2902 presented herein may be used in any desired environment. Thus FIGS. 29A-29B (and the other FIGS.) may be deemed to include any possible permutation. It should also be noted that unless otherwise specified, the various layers in this and other embodiments may be formed using conventional processes and/or materials, preferably having high magnetic permeability and low corrosion susceptibility.

As shown in FIGS. 29A-29B, a high moment layer 2904 is positioned on one side of the write gap 2620. Specifically, the high moment layer 2904 is positioned between the write gap 2620 and the pole tip 2612 of the first write pole 2608. As shown, the high moment layer 2904 has a "beaked" profile as described herein, whereby the high moment layer 2904 protrudes beyond a plane extending along the media facing side 2614 of the pole tip 2612 of the first write pole 2608. In other words, the high moment layer 2904 protrudes beyond the media facing side 2614 of the pole tip 2612 toward the expected location of the magnetic recording tape. The height $h_3$ of the high moment layer beak may vary, e.g., depending on the process used to form the high moment layer 2904, the material composition of the high moment layer 2904, etc. An illustrative range for the height $h_3$ of the high moment layer beak may be from about 2 nm to about 150 nm, more preferably from about 4 nm to about 50 nm, but could be higher or lower depending on the desired embodiment.

According to preferred approaches, the high moment layer 2904 may be implemented as a thin film layer, as would be appreciated by one skilled in the art after reading the present description. However, the high moment layer 2904 may be formed using any desired process, e.g., sputtering, plating, etc. Moreover, the beaked profile of the high moment layer 2904 may be formed by selectively etching the media facing side of the write transducer 2602, such that the high moment layer 2904 etches at a lower rate than the pole tips 2612, 2616 of the first and second write poles 2608, 2610 respectively. Thus, the pole tips 2612, 2616 of the first and second write poles 2608, 2610 will become recessed relative to the high moment layer beak. As previously described, any type of etching process which would be apparent to one skilled in the art after reading the present description may be implemented. Although not shown in the present embodiment, an overcoat is preferably applied to the media facing side of the write transducer 2902 after the beaked high moment layer 2904 has been formed. The overcoat applied is preferably at least as high as the height $h_3$ of the high moment layer 2904, thereby forming a uniform media facing side (e.g., tape bearing surface) of the write transducer 2902. Any known type of overcoat material may be used.

The high moment layer 2904 preferably includes a higher magnetic moment in the bulk material thereof than a magnetic moment of the pole tip 2612 of the first write pole 2608. Illustrative high magnetic moment materials for the high moment layer 2904 may include any one or more of the materials described in the various approaches herein, e.g., as described with respect to high moment layers 2622, 2804. Accordingly, the high moment layer 2904 has a higher saturation magnetization than the remainder of the pole tip 2612, thereby allowing the high moment layer 2904 to focus flux emitted from and/or absorbed by the first write pole 2608 more effectively than conventional write poles, or even write poles having non-beaked high moment layers as described above.

Furthermore, the dimensions (e.g., deposition thickness $t_3$) and/or placement of the high moment layer 2904 may also include any of the approaches described above with respect to high moment layers 2622, 2804. Accordingly, write transducer 2902 may benefit from the aforementioned surprising results related to the deposition thickness $t_3$ of the high moment layer 2904 which were discovered by the inventors.

Due to the asymmetrical nature of the present embodiment, it may be preferred that write transducer 2902 is used for unidirectional writing, for example, such that the second write pole 2610 is leading, and the first write pole 2608 is trailing, because the beaked high moment layer 2904 is only positioned on one side of the write gap 2620. As a result, flux may be delivered to the pole tip 2612 of the first write pole 2608 such that the flux is concentrated by the high moment material 2904 to emerge from the write transducer 2902 to write data to a magnetic recording tape by setting the magnetic transitions thereon. Moreover, the high moment material in the beaked high moment layer 2904 is able to focus a greater amount of flux than a conventional write pole is able to before becoming saturated, thereby allowing the write transducer 2902 to efficiently write data to magnetic media (e.g., magnetic tape) having a high coercivity while also achieving a fine granularity. Thus, implementing the beaked high moment material 2904 as described in the present embodiment is able to improve write performance for the write transducers 2902 when the first write pole 2608 is trailing.

It follows that various embodiments included herein are able to improve performance when writing to high coercivity media. The inventors were able to achieve surprising results by implementing thin film layers of high moment materials with beaked profiles as described in the different configurations above, thereby increasing the achievable areal density of magnetic tape by producing a higher field gradient in the media than has been previously possible. The field gradient produced by the beaked high moment layers described herein is even higher than that produced by a non-beaked high moment layer. While a non-beaked high moment portion implemented as a thin layer may help focus the flux more effectively than any conventional writer structures (e.g., a full high moment pole tip piece), a beaked high moment layer has been found to further sharpen the magnetic field gradients in the media, and thus write sharper transitions to the tape. Some of the embodiments described herein therefore desirably achieve lower PW50, smaller transition parameters, and lower readback error rates. Additionally, a beaked high moment layer is desirably able to further reduce the pole tip to media spacing.

These improvements are realized particularly when writing to magnetic media having high coercivity, e.g., such as BaFe media having perpendicular magnetic orientation. Thus, various embodiments included herein are able to achieve improved writing to high coercivity tape media while maintaining sharper transitions on the tape media than previously achievable.

Computer Implementations

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a ROM, an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. An apparatus, comprising:
   a module having a tape bearing surface, wherein the tape bearing surface extends between first and second edges of the module, wherein a first tape tenting region extends from the first edge along the tape bearing surface toward the second edge, the first edge being a skiving edge;
   a plurality of tunnel valve read transducers arranged in an array extending along the tape bearing surface of the module in the first tape tenting region,
   wherein each of the tunnel valve read transducers includes a sensor structure having a tunnel barrier layer,
   wherein at least some of the sensor structures are recessed from a plane extending along the tape bearing surface;
   an at least partially polycrystalline coating on a media facing side of the recessed sensor structures; and
   a first guide positioned relative to the first edge at a position that sets a wrap angle of a moving magnetic recording tape at the first edge that induces tenting of the moving magnetic recording tape traveling in a direction from the first guide toward the first edge, wherein the location of the tenting is above the first tape tenting region.

2. An apparatus as recited in claim 1, wherein a distance from the first edge to each tunnel valve read transducer is less than a distance from the second edge to the same tunnel valve read transducer.

3. An apparatus as recited in claim 1, wherein a length of the tape bearing surface of the module in a tape travel direction is in a range of about 125 to about 250 microns.

4. An apparatus as recited in claim 1, wherein the at least some of the sensor structures are recessed from the plane by a distance in a range of 5 nm to about 25 nm.

5. An apparatus as recited in claim 1, wherein the at least partially polycrystalline coating has an average thickness in a range of 5 nm to about 25 nm.

6. An apparatus as recited in claim 1, wherein the at least partially polycrystalline coating includes aluminum oxide.

7. An apparatus as recited in claim 1, wherein each of the tunnel valve read transducers includes:
   an upper magnetic shield above the associated sensor structure;
   a lower magnetic shield below the associated sensor structure;
   an upper conducting spacer layer between the sensor structure and the upper magnetic shield;
   a lower conducting spacer layer between the sensor structure and the lower magnetic shield; and
   electrically insulating layers on opposite sides of the sensor structure,
   wherein a height of a free layer of the tunnel valve read transducer, measured in a direction perpendicular to the tape bearing surface of the module, is less than a width of the free layer measured in a cross-track direction perpendicular to an intended direction of media travel.

8. An apparatus as recited in claim 7, wherein one or both of the conducting spacer layers comprises a material selected from the group consisting of iridium, ruthenium, and titanium-nitride.

9. An apparatus as recited in claim 1, wherein the module has patterning for producing at least one effect selected from the group consisting of: inducing the magnetic recording tape to fly thereover in an area away from the tunnel valve read transducers and reducing stiction of the magnetic recording tape to the tape bearing surface of the module.

10. An apparatus as recited in claim 1, comprising an array of write transducers, each write transducer having:
    a first write pole having a pole tip extending from a media facing side of the first write pole;
    a second write pole having a pole tip extending from a media facing side of the second write pole;
    a nonmagnetic write gap between the pole tips of the write poles; and
    a high moment layer between the pole tips,
    the high moment layer having a higher magnetic moment than a magnetic moment of the pole tip closest thereto.

11. An apparatus as recited in claim 10, wherein the high moment layer is positioned between the write gap and the second write pole.

12. An apparatus as recited in claim 10, wherein, for at least one of the write transducers, the pole tip of the first write pole has a pedestal extending toward the write gap, wherein a width of a trimmed portion of the pedestal extends in a cross-track direction for a distance about equal to a width of the pole tip of the second write pole measured in the same direction.

13. An apparatus as recited in claim 12, wherein the high moment layer is positioned between the write gap and the second write pole; and comprising a second high moment layer between the write gap and the pedestal of the pole tip of the first write pole, the second high moment layer having a higher magnetic moment than a magnetic moment of the pole tip of the first write pole.

14. An apparatus as recited in claim 10, wherein the high moment layer extends to a plane extending along a media facing side of the pole tip closest thereto.

15. An apparatus as recited in claim 10, wherein the write transducers are arranged in an array extending along the tape bearing surface of the module.

16. An apparatus as recited in claim 10, wherein the write transducers are arranged in an array on a second module.

17. An apparatus as recited in claim 1, further comprising:
    a drive mechanism for passing the magnetic recording tape over the module; and
    a controller electrically coupled to the module.

* * * * *